(12) United States Patent
Shibata et al.

(10) Patent No.: US 10,074,688 B2
(45) Date of Patent: Sep. 11, 2018

(54) MAGNETORESISTIVE EFFECT DEVICE WITH FIRST AND SECOND MAGNETORESISTIVE EFFECT ELEMENTS HAVING OPPOSITE CURRENT FLOWS RELATIVE TO THE ORDERING OF THE LAYERS OF THE ELEMENTS

(71) Applicant: TDK CORPORATION, Tokyo (JP)

(72) Inventors: Tetsuya Shibata, Tokyo (JP); Tsuyoshi Suzuki, Tokyo (JP); Junichiro Urabe, Tokyo (JP); Takekazu Yamane, Tokyo (JP); Atsushi Shimura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/662,697

(22) Filed: Jul. 28, 2017

(65) Prior Publication Data
US 2018/0040666 A1  Feb. 8, 2018

(30) Foreign Application Priority Data

Aug. 4, 2016 (JP) ................................ 2016-153534
Apr. 18, 2017 (JP) ................................ 2017-081702

(51) Int. Cl.
*G11B 5/39* (2006.01)
*H01L 27/22* (2006.01)
(Continued)

(52) U.S. Cl.
CPC ............ *H01L 27/22* (2013.01); *G11B 5/3903* (2013.01); *G11B 5/3945* (2013.01); *H01L 43/02* (2013.01);
(Continued)

(58) Field of Classification Search
CPC ... G11B 5/3945; G11B 5/3948; G11B 5/3951; G11B 5/3958; G11B 5/3903
(Continued)

(56) References Cited

U.S. PATENT DOCUMENTS 7,408,730 B2 * 8/2008 Yamagishi ........... G11B 5/3929
360/314
7,842,334 B2 * 11/2010 Wakui .................... B82Y 25/00
360/314
(Continued)

FOREIGN PATENT DOCUMENTS

JP        2017-063397 A   3/2017
WO    2017/056559 A1   4/2017
WO    2017/056560 A1   4/2017

OTHER PUBLICATIONS

A.A. Tulapurkar et al. "Spin-Torque Diode Effect in Magnetic Tunnel Junctions". Nature, Nov. 17, 2005, vol. 438, No. 7066, pp. 339-342.

*Primary Examiner* — Jefferson Evans
(74) *Attorney, Agent, or Firm* — Oliff PLC

(57) ABSTRACT

A magnetoresistive effect device includes a first magnetoresistive effect element, a second magnetoresistive effect element, a first port, a second port, a signal line, and a direct-current input terminal. The first port, the first magnetoresistive effect element, and the second port are connected in series to each other in this order via the signal line. The second magnetoresistive effect element is connected to the signal line in parallel with the second port. The first magnetoresistive effect element and the second magnetoresistive effect element are formed so that the relationship between the direction of direct current that is input from the direct-current input terminal and that flows through the first magnetoresistive effect element and the order of arrangement of a magnetization fixed layer, a spacer layer, and a magnetization free layer in the first magnetoresistive effect element is opposite to the above relationship in the second magnetoresistive effect element.

12 Claims, 18 Drawing Sheets

(51) Int. Cl.
*H01L 43/02* (2006.01)
*H01L 43/08* (2006.01)
*H03H 1/00* (2006.01)
*H03H 7/01* (2006.01)

(52) U.S. Cl.
CPC ............ *H01L 43/08* (2013.01); *H03H 1/0007* (2013.01); *H03H 7/0153* (2013.01)

(58) Field of Classification Search
USPC ...................................... 360/316, 322, 324.1
See application file for complete search history.

(56) References Cited

U.S. PATENT DOCUMENTS

| | | | |
|---|---|---|---|
| 8,964,458 B2 * | 2/2015 | Lin ...................... | G11C 11/1659 365/148 |
| 9,142,232 B2 * | 9/2015 | Edelman .............. | G11B 5/4886 |
| 9,425,738 B2 * | 8/2016 | Wang ................... | H03B 15/006 |
| 9,524,737 B2 * | 12/2016 | Mastain ................ | G11B 5/3958 |
| 9,618,589 B2 * | 4/2017 | Zimmer ............... | G01R 33/093 |
| 9,741,369 B2 * | 8/2017 | Batra ........................ | G11B 5/29 |
| 2002/0067581 A1 * | 6/2002 | Hiramoto ............... | B82Y 10/00 360/322 |
| 2006/0022220 A1 * | 2/2006 | Inomata ................. | B82Y 10/00 257/214 |
| 2006/0044700 A1 * | 3/2006 | Paul ....................... | B82Y 25/00 360/316 |
| 2010/0296202 A1 * | 11/2010 | Boone, Jr. ............ | G01R 33/098 360/313 |
| 2016/0277000 A1 | 9/2016 | Shibata et al. | |
| 2016/0320459 A1 * | 11/2016 | Mather ................. | G01R 33/091 |
| 2017/0211935 A1 * | 7/2017 | Deak ....................... | G01C 17/28 |
| 2017/0345449 A1 * | 11/2017 | Shibata ................ | G11B 5/3945 |

\* cited by examiner

MAGNETORESISTIVE EFFECT DEVICE WITH FIRST AND SECOND MAGNETORESISTIVE EFFECT ELEMENTS HAVING OPPOSITE CURRENT FLOWS RELATIVE TO THE ORDERING OF THE LAYERS OF THE ELEMENTS

BACKGROUND OF THE INVENTION

1. Field of the Invention

The present invention relates to a magnetoresistive effect device including a magnetoresistive effect element.

2. Description of the Related Art

The speed of wireless communication has increased in recent years with the increasing functions of mobile communication terminals, such as mobile phones. Since the communication speed is proportional to the band width of frequencies that are used, the number of frequency bands necessary for communication is increased. Accordingly, the number of high-frequency filters that are mounted in mobile communication terminals is increased. Spintronics has been studied in recent years as a field that is probably applicable to new high-frequency components. One phenomenon that has received attention is the spin torque resonance phenomenon, which is caused by a magnetoresistive effect element (refer to Nature, Vol. 438, No. 7066, pp. 339 to 342 17 Nov. 2005). Application of alternating current to a magnetoresistive effect element causes spin torque resonance in the magnetoresistive effect element, and the resistance value of the magnetoresistive effect element oscillates with a fixed cycle at a frequency corresponding to a spin torque resonance frequency. The spin torque resonance frequency of the magnetoresistive effect element varies with the strength of the magnetic field applied to the magnetoresistive effect element. The spin torque resonance frequency of the magnetoresistive effect element is generally within a high-frequency band from several gigahertz to several tens of gigahertz.

SUMMARY OF THE INVENTION

Although the magnetoresistive effect element may be applied to a high-frequency device utilizing the spin torque resonance phenomenon, specific configurations to apply the magnetoresistive effect element to a high-frequency device, such as a high-frequency filter, have not been proposed. Accordingly, the present invention aims to provide a magnetoresistive effect device capable of realizing a high-frequency device, such as a high-frequency filter, which includes a magnetoresistive effect element.

A magnetoresistive effect device according to an embodiment of the present invention includes a first magnetoresistive effect element, a second magnetoresistive effect element, a first port through which a high-frequency signal is input, a second port through which a high-frequency signal is output, a signal line, and a direct-current input terminal. The first port, the first magnetoresistive effect element, and the second port are connected in series to each other in this order via the signal line. The second magnetoresistive effect element is connected to the signal line in parallel with the second port. The first magnetoresistive effect element and the second magnetoresistive effect element each include a magnetization fixed layer, a magnetization free layer, and a spacer layer disposed between the magnetization fixed layer and the magnetization free layer. The first magnetoresistive effect element and the second magnetoresistive effect element are formed so that a relationship between a direction of direct current that is input from the direct-current input terminal and that flows through the first magnetoresistive effect element and an order of arrangement of the magnetization fixed layer, the spacer layer, and the magnetization free layer in the first magnetoresistive effect element is opposite to a relationship between a direction of direct current that is input from the direct-current input terminal and that flows through the second magnetoresistive effect element and an order of arrangement of the magnetization fixed layer, the spacer layer, and the magnetization free layer in the second magnetoresistive effect element.

With the above magnetoresistive effect element, when the direct current input from the direct-current input terminal flows through the first magnetoresistive effect element in the direction from the magnetization free layer to the magnetization fixed layer and flows through the second magnetoresistive effect element in the direction from the magnetization fixed layer to the magnetization free layer, the high-frequency signal is capable of being cut off from the second port at the non-resonant frequency and capable of being transmitted to the second port side at the resonant frequency at the spin torque resonance frequency of the first magnetoresistive effect element and the spin torque resonance frequency of the second magnetoresistive effect element. When the direct current input from the direct-current input terminal flows through the first magnetoresistive effect element in the direction from the magnetization fixed layer to the magnetization free layer and flows through the second magnetoresistive effect element in the direction from the magnetization free layer to the magnetization fixed layer, the high-frequency signal is capable of being transmitted to the second port side at the non-resonant frequency and capable of being cut off from the second port at the resonant frequency at the spin torque resonance frequency of the first magnetoresistive effect element and the spin torque resonance frequency of the second magnetoresistive effect element. Accordingly, the magnetoresistive effect device is capable of having frequency characteristics as a high-frequency filter.

In the magnetoresistive effect device, a spin torque resonance frequency of the first magnetoresistive effect element may be equal to a spin torque resonance frequency of the second magnetoresistive effect element.

With the above magnetoresistive effect element, when the direct current input from the direct-current input terminal flows through the first magnetoresistive effect element in the direction from the magnetization free layer to the magnetization fixed layer and flows through the second magnetoresistive effect element in the direction from the magnetization fixed layer to the magnetization free layer, the combined impedance of the first magnetoresistive effect element and the second magnetoresistive effect element at the frequency equal to the spin torque resonance frequency of the first magnetoresistive effect element and the second magnetoresistive effect element is decreased. Accordingly, the magnetoresistive effect device may function as a high-frequency filter having excellent bandpass characteristics and a wide range of the bandpass characteristics and the cutoff characteristics. When the direct current input from the direct-current input terminal flows through the first magnetoresistive effect element in the direction from the magnetization fixed layer to the magnetization free layer and flows through the second magnetoresistive effect element in the direction from the magnetization free layer to the magnetization fixed layer, the combined impedance of the first magnetoresistive effect element and the second magnetoresistive effect element at the frequency equal to the spin torque resonance frequency of the first magnetoresistive effect element and the second magnetoresistive effect element is increased. Accordingly, the magnetoresistive effect device may function as a high-frequency filter having excellent cutoff characteristics and a wide range of the bandpass characteristics and the cutoff characteristics.

In the magnetoresistive effect device, a spin torque resonance frequency of the first magnetoresistive effect element may be different from a spin torque resonance frequency of the second magnetoresistive effect element.

With the above magnetoresistive effect element, since the spin torque resonance frequency of the first magnetoresistive effect element is different from the spin torque resonance frequency of the second magnetoresistive effect element and the frequencies near the spin torque resonance frequency at which the high-frequency signal is transmitted to the second port side or at which the high-frequency signal is cut off from the second port are across a wide range, the magnetoresistive effect device may function as a filter having a wide pass band or a wide cutoff frequency band.

The magnetoresistive effect device may further include a third magnetoresistive effect element. The first port, the third magnetoresistive effect element, and the second port may be connected in series to each other in this order via the signal line. The first magnetoresistive effect element, the second magnetoresistive effect element, and the third magnetoresistive effect element may each include a magnetization fixed layer, a magnetization free layer, and a spacer layer disposed between the magnetization fixed layer and the magnetization free layer. The first magnetoresistive effect element and the third magnetoresistive effect element may be formed so that a relationship between a direction of direct current that is input from the direct-current input terminal and that flows through the first magnetoresistive effect element and an order of arrangement of the magnetization fixed layer, the spacer layer, and the magnetization free layer in the first magnetoresistive effect element is opposite to a relationship between a direction of direct current that is input from the direct-current input terminal and that flows through the third magnetoresistive effect element and an order of arrangement of the magnetization fixed layer, the spacer layer, and the magnetization free layer in the third magnetoresistive effect element. A spin torque resonance frequency of the third magnetoresistive effect element may be higher or lower than a spin torque resonance frequency of the first magnetoresistive effect element and a spin torque resonance frequency of the second magnetoresistive effect element.

With the above magnetoresistive effect element, when the direct current input from the direct-current input terminal flows through the third magnetoresistive effect element in the direction from the magnetization fixed layer to the magnetization free layer, the attenuation of the high-frequency signal is sharply changed with respect to the frequency near the spin torque resonance frequency of the third magnetoresistive effect element at which the high-frequency signal is cut off from the second port. Accordingly, the shoulder characteristics are made sharp at the high frequency side or the low frequency side of the pass band formed near the spin torque resonance frequency of the first magnetoresistive effect element and near the spin torque resonance frequency of the second magnetoresistive effect element. When the direct current input from the direct-current input terminal flows through the third magnetoresistive effect element in the direction from the magnetization free layer to the magnetization fixed layer, the attenuation of the high-frequency signal is sharply changed with respect to the frequency near the spin torque resonance frequency of the third magnetoresistive effect element at which the high-frequency signal is transmitted to the second port side. Accordingly, the shoulder characteristics are made sharp at the high frequency side or the low frequency side of the cutoff frequency band formed near the spin torque resonance frequency of the first magnetoresistive effect element and near the spin torque resonance frequency of the second magnetoresistive effect element.

The magnetoresistive effect device may further include a fourth magnetoresistive effect element. The fourth magnetoresistive effect element may be connected to the signal line in parallel with the second port. The first magnetoresistive effect element, the second magnetoresistive effect element, and the fourth magnetoresistive effect element may each include a magnetization fixed layer, a magnetization free layer, and a spacer layer disposed between the magnetization fixed layer and the magnetization free layer. The second magnetoresistive effect element and the fourth magnetoresistive effect element may be formed so that a relationship between a direction of direct current that is input from the direct-current input terminal and that flows through the second magnetoresistive effect element and an order of arrangement of the magnetization fixed layer, the spacer layer, and the magnetization free layer in the second magnetoresistive effect element is opposite to a relationship between a direction of direct current that is input from the direct-current input terminal and that flows through the fourth magnetoresistive effect element and an order of arrangement of the magnetization fixed layer, the spacer layer, and the magnetization free layer in the fourth magnetoresistive effect element. A spin torque resonance frequency of the fourth magnetoresistive effect element may be higher or lower than a spin torque resonance frequency of the first magnetoresistive effect element and a spin torque resonance frequency of the second magnetoresistive effect element.

With the above magnetoresistive effect element, when the direct current input from the direct-current input terminal flows through the fourth magnetoresistive effect element in the direction from the magnetization free layer to the magnetization fixed layer, the attenuation of the high-frequency signal is sharply changed with respect to the frequency near the spin torque resonance frequency of the fourth magnetoresistive effect element at which the high-frequency signal is cut off from the second port. Accordingly, the shoulder characteristics are made sharp at the high frequency side or the low frequency side of the pass band formed near the spin torque resonance frequency of the first magnetoresistive effect element and near the spin torque resonance frequency of the second magnetoresistive effect element. When the direct current input from the direct-current input terminal flows through the fourth magnetoresistive effect element in the direction from the magnetization fixed layer to the magnetization free layer, the attenuation of the high-frequency signal is sharply changed with respect to the frequency near the spin torque resonance frequency of the fourth magnetoresistive effect element at which the high-frequency signal is transmitted to the second port side. Accordingly, the shoulder characteristics are made sharp at the high frequency side or the low frequency side of the cutoff frequency band formed near the spin torque resonance frequency of the first magnetoresistive effect element and near the spin torque resonance frequency of the second magnetoresistive effect element.

The magnetoresistive effect device may further include a third magnetoresistive effect element and a fourth magnetoresistive effect element. The first port, the third magnetoresistive effect element, and the second port may be connected in series to each other in this order via the signal line. The fourth magnetoresistive effect element may be connected to the signal line in parallel with the second port. The first magnetoresistive effect element, the second magnetoresistive effect element, the third magnetoresistive effect element, and the fourth magnetoresistive effect element may each include a magnetization fixed layer, a magnetization free layer, and a spacer layer disposed between the magnetization fixed layer and the magnetization free layer. The first magnetoresistive effect element and the third magnetoresistive effect element may be formed so that a relationship between a direction of direct current that is input from the direct-current input terminal and that flows through the first magnetoresistive effect element and an order of arrangement of the magnetization fixed layer, the spacer layer, and the magnetization free layer in the first magnetoresistive effect element is opposite to a relationship between a direction of direct current that is input from the direct-current input terminal and that flows through the third magnetoresistive effect element and an order of arrangement of the magnetization fixed layer, the spacer layer, and the magnetization free layer in the third magnetoresistive effect element. The second magnetoresistive effect element and the fourth magnetoresistive effect element may be formed so that a relationship between a direction of direct current that is input from the direct-current input terminal and that flows through the second magnetoresistive effect element and an order of arrangement of the magnetization fixed layer, the spacer layer, and the magnetization free layer in the second magnetoresistive effect element is opposite to a relationship between a direction of direct current that is input from the direct-current input terminal and that flows through the fourth magnetoresistive effect element and an order of arrangement of the magnetization fixed layer, the spacer layer, and the magnetization free layer in the fourth magnetoresistive effect element. A spin torque resonance frequency of the third magnetoresistive effect element may be higher than a spin torque resonance frequency of the first magnetoresistive effect element and a spin torque resonance frequency of the second magnetoresistive effect element and a spin torque resonance frequency of the fourth magnetoresistive effect element may be lower than the spin torque resonance frequency of the first magnetoresistive effect element and the spin torque resonance frequency of the second magnetoresistive effect element. Alternatively, the spin torque resonance frequency of the third magnetoresistive effect element may be lower than the spin torque resonance frequency of the first magnetoresistive effect element and the spin torque resonance frequency of the second magnetoresistive effect element and the spin torque resonance frequency of the fourth magnetoresistive effect element may be higher than the spin torque resonance frequency of the first magnetoresistive effect element and the spin torque resonance frequency of the second magnetoresistive effect element.

With the above magnetoresistive effect element, when the direct current input from the direct-current input terminal flows through the third magnetoresistive effect element in the direction from the magnetization fixed layer to the magnetization free layer and flows through the fourth magnetoresistive effect element in the direction from the magnetization free layer to the magnetization fixed layer, the attenuation of the high-frequency signal is sharply changed with respect to the frequency near the spin torque resonance frequency of the third magnetoresistive effect element or near the spin torque resonance frequency of the fourth magnetoresistive effect element at which the high-frequency signal is cut off from the second port. Accordingly, the shoulder characteristics are made sharp at the high frequency side and the low frequency side of the pass band formed near the spin torque resonance frequency of the first magnetoresistive effect element and near the spin torque resonance frequency of the second magnetoresistive effect element. When the direct current input from the direct-current input terminal flows through the third magnetoresistive effect element in the direction from the magnetization free layer to the magnetization fixed layer and flows through the fourth magnetoresistive effect element in the direction from the magnetization fixed layer to the magnetization free layer, the attenuation of the high-frequency signal is sharply changed with respect to the frequency near the spin torque resonance frequency of the third magnetoresistive effect element or near the spin torque resonance frequency of the fourth magnetoresistive effect element at which the high-frequency signal is transmitted to the second port side. Accordingly, the shoulder characteristics are made sharp at the high frequency side and the low frequency side of the cutoff frequency band formed near the spin torque resonance frequency of the first magnetoresistive effect element and near the spin torque resonance frequency of the second magnetoresistive effect element.

A magnetoresistive effect device according to another embodiment of the present invention includes a first magnetoresistive effect element, a second magnetoresistive effect element, a first port through which a high-frequency signal is input, a second port through which a high-frequency signal is output, a signal line, a direct-current input terminal, and a reference voltage terminal. The first port, the first magnetoresistive effect element, and the second port are connected in series to each other in this order via the signal line. The second magnetoresistive effect element is connected to the signal line in parallel with the second port. The first magnetoresistive effect element and the second magnetoresistive effect element each include a magnetization fixed layer, a magnetization free layer, and a spacer layer disposed between the magnetization fixed layer and the magnetization free layer. The first magnetoresistive effect element and the second magnetoresistive effect element are connected to the direct-current input terminal and the reference voltage terminal so that a first end side of each of the first magnetoresistive effect element and the second magnetoresistive effect element is at the direct-current input terminal side and a second end side of each of the first magnetoresistive effect element and the second magnetoresistive effect element is at the reference voltage terminal side. The first magnetoresistive effect element and the second magnetoresistive effect element are formed so that a relationship between a direction from the first end side to the second end side and a direction from the magnetization free layer to the magnetization fixed layer in the first magnetoresistive effect element is opposite to that in the second magnetoresistive effect element.

With the above magnetoresistive effect element, the magnetoresistive effect device is capable of having frequency characteristics as a high-frequency filter, like the magnetoresistive effect device described in the above embodiment.

In the magnetoresistive effect device, a spin torque resonance frequency of the first magnetoresistive effect element may be equal to a spin torque resonance frequency of the second magnetoresistive effect element.

With the above magnetoresistive effect element, the magnetoresistive effect device may function as a high-frequency filter having excellent bandpass characteristics and cutoff characteristics and a wide range of the bandpass characteristics and the cutoff characteristics, like the magnetoresistive effect device described in the above embodiment.

In the magnetoresistive effect device, a spin torque resonance frequency of the first magnetoresistive effect element may be different from a spin torque resonance frequency of the second magnetoresistive effect element.

With the above magnetoresistive effect element, the magnetoresistive effect device may function as a filter having a wide pass band or a wide cutoff frequency band, like the magnetoresistive effect device described in the above embodiment.

The magnetoresistive effect device may further include a third magnetoresistive effect element. The first port, the third magnetoresistive effect element, and the second port may be connected in series to each other in this order via the signal line. The first magnetoresistive effect element, the second magnetoresistive effect element, and the third magnetoresistive effect element may each include a magnetization fixed layer, a magnetization free layer, and a spacer layer disposed between the magnetization fixed layer and the magnetization free layer. The third magnetoresistive effect element may be connected to the direct-current input terminal and the reference voltage terminal so that a first end side of the third magnetoresistive effect element is at the direct-current input terminal side and a second end side thereof is at the reference voltage terminal side. The first magnetoresistive effect element and the third magnetoresistive effect element may be formed so that a relationship between a direction from the first end side to the second end side and a direction from the magnetization free layer to the magnetization fixed layer in the first magnetoresistive effect element is opposite to that in the third magnetoresistive effect element. A spin torque resonance frequency of the third magnetoresistive effect element may be higher or lower than a spin torque resonance frequency of the first magnetoresistive effect element and a spin torque resonance frequency of the second magnetoresistive effect element.

With the above magnetoresistive effect element, the shoulder characteristics are made sharp at the high frequency side or the low frequency side of the pass band or the cutoff frequency band formed near the spin torque resonance frequency of the first magnetoresistive effect element and near the spin torque resonance frequency of the second magnetoresistive effect element, like the magnetoresistive effect device described in the above embodiment.

The magnetoresistive effect device may further include a fourth magnetoresistive effect element. The fourth magnetoresistive effect element may be connected to the signal line in parallel with the second port. The first magnetoresistive effect element, the second magnetoresistive effect element, and the fourth magnetoresistive effect element may each include a magnetization fixed layer, a magnetization free layer, and a spacer layer disposed between the magnetization fixed layer and the magnetization free layer. The fourth magnetoresistive effect element may be connected to the direct-current input terminal and the reference voltage terminal so that a first end side of the fourth magnetoresistive effect element is at the direct-current input terminal side and a second end side thereof is at the reference voltage terminal side. The second magnetoresistive effect element and the fourth magnetoresistive effect element may be formed so that a relationship between a direction from the first end side to the second end side and a direction from the magnetization free layer to the magnetization fixed layer in the second magnetoresistive effect element is opposite to that in the fourth magnetoresistive effect element. A spin torque resonance frequency of the fourth magnetoresistive effect element may be higher or lower than a spin torque resonance frequency of the first magnetoresistive effect element and a spin torque resonance frequency of the second magnetoresistive effect element.

With the above magnetoresistive effect element, the shoulder characteristics are made sharp at the high frequency side or the low frequency side of the pass band or the cutoff frequency band formed near the spin torque resonance frequency of the first magnetoresistive effect element and near the spin torque resonance frequency of the second magnetoresistive effect element, like the magnetoresistive effect device described in the above embodiment.

The magnetoresistive effect device may further include a third magnetoresistive effect element and a fourth magnetoresistive effect element. The first port, the third magnetoresistive effect element, and the second port may be connected in series to each other in this order via the signal line. The fourth magnetoresistive effect element may be connected to the signal line in parallel with the second port. The first magnetoresistive effect element, the second magnetoresistive effect element, the third magnetoresistive effect element, and the fourth magnetoresistive effect element may each include a magnetization fixed layer, a magnetization free layer, and a spacer layer disposed between the magnetization fixed layer and the magnetization free layer. The third magnetoresistive effect element and the fourth magnetoresistive effect element may be connected to the direct-current input terminal and the reference voltage terminal so that a first end side of each of the third magnetoresistive effect element and the fourth magnetoresistive effect element is at the direct-current input terminal side and a second end side thereof is at the reference voltage terminal side. The first magnetoresistive effect element and the third magnetoresistive effect element may be formed so that a relationship between a direction from the first end side to the second end side and a direction from the magnetization free layer to the magnetization fixed layer in the first magnetoresistive effect element is opposite to that in the third magnetoresistive effect element. The second magnetoresistive effect element and the fourth magnetoresistive effect element may be formed so that a relationship between a direction from the first end side to the second end side and a direction from the magnetization free layer to the magnetization fixed layer in the second magnetoresistive effect element is opposite to that in the fourth magnetoresistive effect element. A spin torque resonance frequency of the third magnetoresistive effect element may be higher than a spin torque resonance frequency of the first magnetoresistive effect element and a spin torque resonance frequency of the second magnetoresistive effect element and a spin torque resonance frequency of the fourth magnetoresistive effect element may be lower than the spin torque resonance frequency of the first magnetoresistive effect element and the spin torque resonance frequency of the second magnetoresistive effect element. Alternatively, the spin torque resonance frequency of the third magnetoresistive effect element may be lower than the spin torque resonance frequency of the first magnetoresistive effect element and the spin torque resonance frequency of the second magnetoresistive effect element and the spin torque resonance frequency of the fourth magnetoresistive effect element may be higher than the spin torque resonance frequency of the first magnetoresistive effect element and the spin torque resonance frequency of the second magnetoresistive effect element.

With the above magnetoresistive effect element, the shoulder characteristics are made sharp at the high frequency side and the low frequency side of the pass band or the cutoff frequency band formed near the spin torque resonance frequency of the first magnetoresistive effect element and near the spin torque resonance frequency of the second magnetoresistive effect element, like the magnetoresistive effect device described in the above embodiment.

According to the present invention, it is possible to provide a magnetoresistive effect device capable of realizing a high-frequency device, such as a high-frequency filter, which includes a magnetoresistive effect element.

DESCRIPTION OF THE PREFERRED EMBODIMENTS

Embodiments of the present invention will herein be described in detail with reference to the attached drawings. The present invention is not limited by the content described in the following embodiments. Components described below include components easily supposed by persons skilled in the art, components substantially equivalent to each other, and components within an equivalent range. In addition, the components described below may be appropriately combined with each other. Furthermore, the components may be omitted, replaced, or modified without departing from the true spirit and scope of the invention.

First Embodiment

Figure 1:
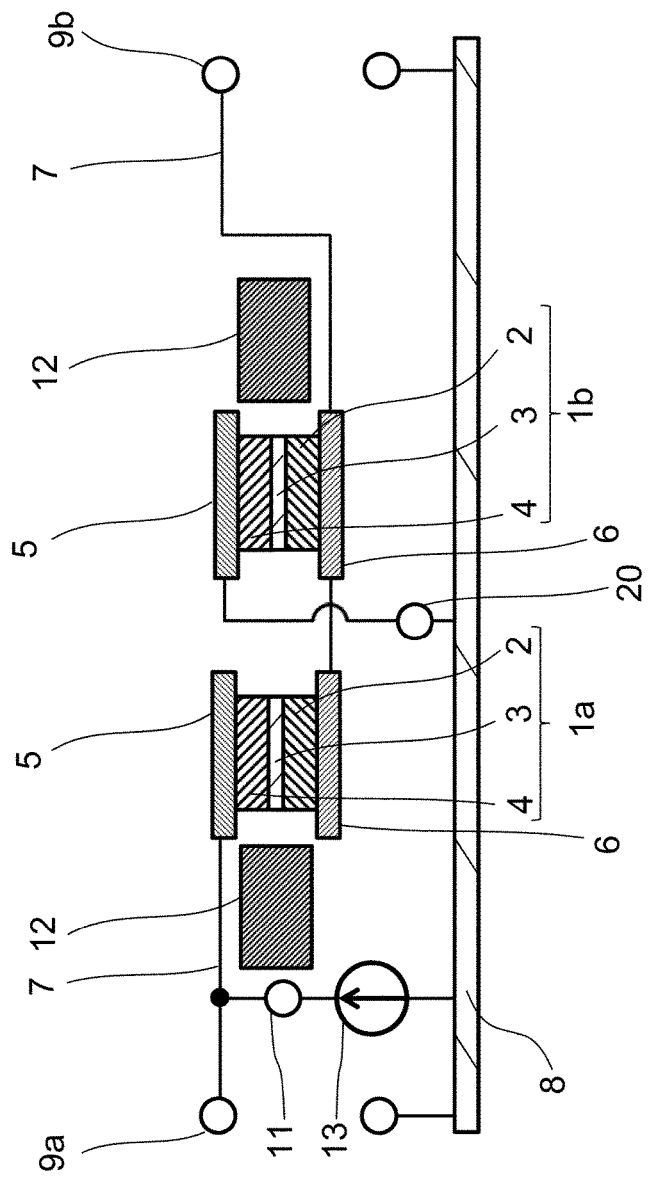
FIG. 1 is a schematic cross-sectional view of a magnetoresistive effect device according to a first embodiment.

FIG. 1 is a schematic cross-sectional view of a magnetoresistive effect device 101 according to a first embodiment of the present invention. The magnetoresistive effect device 101 includes a first magnetoresistive effect element 1a, a second magnetoresistive effect element 1b, a first port 9a, a second port 9b, a signal line 7, and a direct-current input terminal 11. The first magnetoresistive effect element 1a includes a magnetization fixed layer 2 (a first magnetization fixed layer), a magnetization free layer 4 (a first magnetization free layer), and a spacer layer 3 (a first spacer layer) disposed between the magnetization fixed layer 2 and the magnetization free layer 4. The second magnetoresistive effect element 1b includes the magnetization fixed layer 2 (a second magnetization fixed layer), the magnetization free layer 4 (a second magnetization free layer), and the spacer layer 3 (a second spacer layer) disposed between the magnetization fixed layer 2 and the magnetization free layer 4. A high-frequency signal is input into the first port 9a. A high-frequency signal is output from the second port 9b. The first port 9a, the first magnetoresistive effect element 1a, and the second port 9b are connected in series to each other in this order via the signal line 7. The second magnetoresistive effect element 1b is connected to the signal line 7 between the first magnetoresistive effect element 1a and the second port 9b (one of the signal line 7 between the first magnetoresistive effect element 1a and the first port 9a and the signal line 7 between the first magnetoresistive effect element 1a and the second port 9b) in parallel with the second port 9b. More specifically, the magnetoresistive effect device 101 includes a reference voltage terminal 20. One end (at the magnetization fixed layer 2 side) of the second magnetoresistive effect element 1b is connected to the signal line 7 between the first magnetoresistive effect element 1a and the second port 9b and the other end (at the magnetization free layer 4 side) of the second magnetoresistive effect element 1b may be connected to ground 8 via the reference voltage terminal 20. The direct-current input terminal 11 is connected to the signal line 7 between the first magnetoresistive effect element 1a and the first port 9a (the other of the signal line 7 between the first magnetoresistive effect element 1a and the first port 9a and the signal line 7 between the first magnetoresistive effect element 1a and the second port 9b).

The first magnetoresistive effect element 1a is connected to the direct-current input terminal 11 and the reference voltage terminal 20 so that one end side (at the magnetization free layer 4 side in this example) is at the direct-current input terminal 11 side and the other end side (at the magnetization fixed layer 2 side in this example) is at the reference voltage terminal 20 side. The second magnetoresistive effect element 1b is connected to the direct-current input terminal 11 and the reference voltage terminal 20 so that one end side (at the magnetization fixed layer 2 side in this example) is at the direct-current input terminal 11 side and the other end side (at the magnetization free layer 4 side in this example) is at the reference voltage terminal 20 side. In other words, in the magnetoresistive effect device 101, the first magnetoresistive effect element 1a and the second magnetoresistive effect element 1b are formed (arranged) so that the relationship between the direction from one end side to the other end side and the direction from the magnetization free layer 4 to the magnetization fixed layer 2 in the first magnetoresistive effect element 1a is opposite to that in the second magnetoresistive effect element 1b. In the example in FIG. 1, the direction from one end side to the other end side is the same as the direction from the magnetization free layer 4 to the magnetization fixed layer 2 in the first magnetoresistive effect element 1a while the direction from one end side to the other end side is opposite to the direction from the magnetization free layer 4 to the magnetization fixed layer 2 in the second magnetoresistive effect element 1b.

The first magnetoresistive effect element 1a is formed (arranged) so that direct current input from the direct-current input terminal 11 flows through the first magnetoresistive effect element 1a in the direction from the magnetization free layer 4 to the magnetization fixed layer 2. The second magnetoresistive effect element 1b is formed (arranged) so that the direct current input from the direct-current input terminal 11 flows through the second magnetoresistive effect element 1b in the direction from the magnetization fixed layer 2 to the magnetization free layer 4. In other words, in the magnetoresistive effect device 101, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b. In addition, the spin torque resonance frequency of the first magnetoresistive effect element 1a is equal to that of the second magnetoresistive effect element 1b.

The first port 9a is an input port through which a high-frequency signal, which is an alternating current signal, is input and the second port 9b is an output port through which a high-frequency signal is output. The high-frequency signal input through the first port 9a and the high-frequency signal output through the second port 9b are, for example, signals having frequencies of 100 MHz or more. The first magnetoresistive effect element 1a is electrically connected to the signal line 7 via an upper electrode 5 and a lower electrode 6. The second magnetoresistive effect element 1b is electrically connected to the signal line 7 via the lower electrode 6 and is electrically connected to the ground 8 via the upper electrode 5 and the reference voltage terminal 20. After the high-frequency signal input through the first port 9a passes through the first magnetoresistive effect element 1a, part of the high-frequency signal is supplied to the second magnetoresistive effect element 1b and the remaining high-frequency signal is supplied to the second port 9b. Attenuation (S21), which is a dB value of a power ratio (output power/input power) when the high-frequency signal is supplied from the first port 9a to the second port 9b, is capable of being measured with a high-frequency measuring device, such as a network analyzer.

The upper electrode 5 and the lower electrode 6 serve as a pair of electrodes and are disposed in the stacking direction of the respective layers composing each magnetoresistive effect element with the respective magnetoresistive effect elements in between the upper electrode 5 and the lower electrode 6. Specifically, the upper electrode 5 and the lower electrode 6 function as a pair of electrodes to cause a signal (current) to flow through each magnetoresistive effect element in a direction intersecting with the face of each layer composing each magnetoresistive effect element, for example, in a direction (stacking direction) perpendicular to the face of each layer composing each magnetoresistive effect element. Each of the upper electrode 5 and the lower electrode 6 is preferably composed of a film made of Ta, Cu, Au, AuCu, or Ru or a film made of two or more of the above materials. One end (at the magnetization free layer 4 side) of the first magnetoresistive effect element 1a is electrically connected to the signal line 7 via the upper electrode 5 and the other end (at the magnetization fixed layer 2 side) of the first magnetoresistive effect element 1a is electrically connected to the signal line 7 via the lower electrode 6. One end (at the magnetization fixed layer 2 side) of the second magnetoresistive effect element 1b is electrically connected to the signal line 7 via the lower electrode 6 and the other end (at the magnetization free layer 4 side) of the second magnetoresistive effect element 1b is electrically connected to the ground 8 via the upper electrode 5 and the reference voltage terminal 20.

The ground 8 functions as reference voltage. The shape of the signal line 7 with the ground 8 is preferably of a micro strip line (MSL) type or a coplanar waveguide (CPW) type. In design of the micro strip line shape or the coplanar waveguide shape, designing the width of the signal line 7 and the distance to the ground so that the characteristic impedance of the signal line 7 is equal to the impedance of a circuit system enables the transmission loss through the signal line 7 to be reduced.

The direct-current input terminal 11 is connected to the signal line 7 between the first magnetoresistive effect element 1a and the first port 9a (the other of the signal line 7 between the first magnetoresistive effect element 1a and the first port 9a and the signal line 7 between the first magnetoresistive effect element 1a and the second port 9b). In other words, the direct-current input terminal 11 is connected to the signal line 7 at the opposite side to the second magnetoresistive effect element 1b with the first magnetoresistive effect element 1a in between the direct-current input terminal 11 and the second magnetoresistive effect element 1b. Connection of a direct-current source 13 to the direct-current input terminal 11 enables the direct current to be applied to the first magnetoresistive effect element 1a and the second magnetoresistive effect element 1b. An inductor or a resistance element for cutting off the high-frequency signal may be connected in series between the direct-current input terminal 11 and the direct-current source 13.

The direct-current source 13 is connected to the ground 8 and the direct-current input terminal 11. When the magnetoresistive effect device 101 is connected to the ground 8, a closed circuit including the first magnetoresistive effect element 1a, the signal line 7, the second magnetoresistive effect element 1b, the ground 8, and the direct-current input terminal 11 is capable of being formed. The direct-current source 13 applies the direct current from the direct-current input terminal 11 to the above closed circuit. The direct-current source 13 is composed of, for example, a circuit in which a variable resistor is combined with a direct-current voltage source and is capable of varying the current value of the direct current. The direct-current source 13 may be composed of a circuit which is capable of generating constant direct current and in which a fixed resistor is combined with a direct-current voltage source.

A magnetic-field applying mechanism 12 is disposed near the first magnetoresistive effect element 1a and the second magnetoresistive effect element 1b. The magnetic-field applying mechanism 12 applies a magnetic field to the first magnetoresistive effect element 1a and the second magnetoresistive effect element 1b to enable setting of the spin torque resonance frequency of the first magnetoresistive effect element 1a and the second magnetoresistive effect element 1b. For example, the magnetic-field applying mechanism 12 is of an electromagnetic type or a strip line type capable of variably controlling the strength of the applied magnetic field using voltage or current. Alternatively, the magnetic-field applying mechanism 12 may be a combination of the electromagnetic type or the strip line type with a permanent magnet that supplies only a constant magnetic field. Magnetic-field applying mechanisms 12 may be individually arranged for the first magnetoresistive effect element 1a and the second magnetoresistive effect element 1b and may have a structure in which the spin torque resonance frequency of the first magnetoresistive effect element 1a and the spin torque resonance frequency of the second magnetoresistive effect element 1b are capable of being independently set. The magnetic-field applying mechanism 12 varies an effective magnetic field in the magnetization free layer 4 in each of the first magnetoresistive effect element 1a and the second magnetoresistive effect element 1b by varying the magnetic fields to be applied to the first magnetoresistive effect element 1a and the second magnetoresistive effect element 1b to enable the spin torque resonance frequency of the first magnetoresistive effect element 1a and the second magnetoresistive effect element 1b to be varied.

The magnetization fixed layer 2 is made of a ferromagnetic material and the magnetization direction of the magnetization fixed layer 2 is substantially fixed to one direction. The magnetization fixed layer 2 is preferably made of a material having high spin polarizability, such as Fe, Co, Ni, an alloy of Ni and Fe, an alloy of Fe and Co, or an ally of Fe, Co, and B. This achieves a high magnetoresistive change rate. The magnetization fixed layer 2 may be made of a Heusler alloy. The magnetization fixed layer 2 preferably has a film thickness of 1 nm to 10 nm. An antiferromagnetic layer may be added so as to be in contact with the magnetization fixed layer 2 in order to fix the magnetization of the magnetization fixed layer 2. Alternatively, the magnetization of the magnetization fixed layer 2 may be fixed using magnetic anisotropy caused by the crystal structure of the magnetization fixed layer 2 or the shape thereof. The antiferromagnetic layer may be made of FeO, CoO, NiO, $CuFeS_2$, IrMn, FeMn, PtMn, Cr, or Mn.

The spacer layer 3 is arranged between the magnetization fixed layer 2 and the magnetization free layer 4. The magnetization of the magnetization fixed layer 2 and the magnetization of the magnetization free layer 4 interact with each other to achieve the magnetoresistive effect. The spacer layer 3 may be formed of a layer made of a conductive material, an insulating material, or a semiconductor material. Alternatively, the spacer layer 3 may be formed of a layer in which a current flow point composed of a conductor is included in an insulator.

When a non-magnetic conductive material is used for the spacer layer 3, the non-magnetic conductive material may be Cu, Ag, Au, or Ru. In this case, a giant magnetoresistive (GMR) effect is produced in the magnetoresistive effect element. When the GMR effect is used, the spacer layer 3 preferably has a film thickness of about 0.5 nm to 3.0 nm.

When a non-magnetic insulating material is used for the spacer layer 3, the non-magnetic insulating material may be $Al_2O_3$ or MgO. In this case, a tunnel magnetoresistive (TMR) effect is produced in the magnetoresistive effect element. Adjusting the film thickness of the spacer layer 3 so that a coherent tunnel effect is produced between the magnetization fixed layer 2 and the magnetization free layer 4 achieves a high magnetoresistive change rate. When the TMR effect is used, the spacer layer 3 preferably has a film thickness of about 0.5 nm to 3.0 nm.

When a non-magnetic semiconductor material is used for the spacer layer 3, the non-magnetic semiconductor material may be ZnO, $In_2O_3$, $SnO_2$, ITO, $GaO_x$, or $Ga_2O_x$. The spacer layer 3 preferably has a film thickness of about 1.0 nm to 4.0 nm.

When a layer in which the current flow point composed of a conductor is included in a non-magnetic insulator is used as the spacer layer 3, the spacer layer 3 preferably has a structure in which the current flow point composed of a conductor made of, for example, CoFe, CoFeB, CoFeSi, CoMnGe, CoMnSi, CoMnAl, Fe, Co, Au, Cu, Al, or Mg is included in the non-magnetic insulator made of $Al_2O_3$ or MgO. In this case, the spacer layer 3 preferably has a film thickness of about 0.5 nm to 2.0 nm.

The direction of the magnetization of the magnetization free layer 4 is capable of being varied. The magnetization free layer 4 is made of a ferromagnetic material. The direction of the magnetization of the magnetization free layer 4 is capable of being varied with, for example, an externally applied magnetic field or spin polarized electrons. When the magnetization free layer 4 is made of a material having a magnetic easy axis in an in-plane direction, the material may be, for example, CoFe, CoFeB, CoFeSi, CoMnGe, CoMnSi, or CoMnAl. The magnetization free layer 4 preferably has a film thickness of about 1 nm to 30 nm. When the magnetization free layer 4 is made of a material having the magnetic easy axis in a plane normal direction, the material may be, for example, Co, a CoCr-based alloy, a Co multilayer film, a CoCrPt-based alloy, an FePt-based alloy, an SmCo-based alloy including rare earth, or a TbFeCo alloy. The magnetization free layer 4 may be made of a Heusler alloy. A material having high spin polarizability may be disposed between the magnetization free layer 4 and the spacer layer 3. This achieves a high magnetoresistive change rate. The material having high spin polarizability may be, for example, a CoFe alloy or a CoFeB alloy. Each of the CoFe alloy and the CoFeB alloy preferably has a film thickness of about 0.2 nm to 1.0 nm.

A cap layer, a seed layer, or a buffer layer may be disposed between the upper electrode 5 and each magnetoresistive effect element and between the lower electrode 6 and each magnetoresistive effect element. Each of the cap layer, the seed layer, and the buffer layer may be made of Ru, Ta, Cu, or Cr or may be formed of a stacked film including a Ru layer, a Ta layer, a Cu layer, and a Cr layer. Each of the cap layer, the seed layer, and the buffer layer preferably has a film thickness of about 2 nm to 10 nm.

When each magnetoresistive effect element has a rectangular shape (including a square shape) in plan view, the magnetoresistive effect element desirably has long sides of about 100 nm or 100 nm or less. When each magnetoresistive effect element does not have a rectangular shape in plan view, the long sides of a rectangle circumscribed around the plan view shape of the magnetoresistive effect element with a minimum area are defined as the long sides of the magnetoresistive effect element. When the long sides of the magnetoresistive effect element are short, for example, about 100 nm, the magnetization of the magnetization free layer 4 is capable of having a single magnetic domain to realize the spin torque resonance phenomenon with high efficiency. The "plan view shape" means the shape of each magnetoresistive effect element when the magnetoresistive effect element is viewed from above a plane perpendicular to the stacking direction of the respective layers composing the magnetoresistive effect element.

The spin torque resonance phenomenon will now be described.

Upon input of the high-frequency signal having a frequency equal to the spin torque resonance frequency specific to the magnetoresistive effect element into the magnetoresistive effect element, the magnetization of the magnetization free layer oscillates at the spin torque resonance frequency. This phenomenon is called the spin torque resonance phenomenon. The element resistance value of the magnetoresistive effect element is determined by the relative angle between the magnetization of the magnetization fixed layer and the magnetization of the magnetization free layer. Accordingly, the resistance value of the magnetoresistive effect element in the spin torque resonance varies with a fixed cycle with the oscillation of the magnetization of the magnetization free layer. In other words, the magnetoresistive effect element is capable of being considered as a resistor oscillation element the resistance value of which varies with a fixed cycle at the spin torque resonance frequency.

Upon input of the high-frequency signal having a frequency equal to the spin torque resonance frequency into each magnetoresistive effect element while applying the direct current flowing through the magnetoresistive effect element in the direction from the magnetization free layer 4 to the magnetization fixed layer 2 to the magnetoresistive effect element, the resistance value of each magnetoresistive effect element varies with a fixed cycle at the spin torque resonance frequency in phase with the input high-frequency signal and the impedance for the high-frequency signal is decreased. In other words, in the magnetoresistive effect device 101, the first magnetoresistive effect element 1a is capable of being considered as a resistance element in which the impedance of the high-frequency signal is decreased at the spin torque resonance frequency due to the spin torque resonance phenomenon.

Upon input of the high-frequency signal having a frequency equal to the spin torque resonance frequency into each magnetoresistive effect element while applying the direct current flowing through the magnetoresistive effect element in the direction from the magnetization fixed layer 2 to the magnetization free layer 4 to the magnetoresistive effect element, the resistance value of each magnetoresistive effect element varies with a fixed cycle at the spin torque resonance frequency out of phase with the input high-frequency signal by 180 degrees and the impedance for the high-frequency signal is increased. In other words, in the magnetoresistive effect device 101, the second magnetoresistive effect element 1b is capable of being considered as a resistance element in which the impedance of the high-frequency signal is increased at the spin torque resonance frequency due to the spin torque resonance phenomenon.

The spin torque resonance frequency varies with the effective magnetic field in the magnetization free layer 4. An effective magnetic field $H_{eff}$ in the magnetization free layer 4 is represented by the following equation:

$$H_{eff} = H_E + H_k + H_D + H_{EX}$$

where $H_E$ denotes an external magnetic field to be applied to the magnetization free layer 4, $H_k$ denotes an anisotropy magnetic field in the magnetization free layer 4, $H_D$ denotes a demagnetizing field in the magnetization free layer 4, and $H_{EX}$ denotes an exchange coupling magnetic field in the magnetization free layer 4. The magnetic-field applying mechanism 12 is an effective magnetic field setting mechanism that is capable of setting the effective magnetic field $H_{eff}$ in the magnetization free layer 4 in each magnetoresistive effect element by applying the magnetic field to the first magnetoresistive effect element 1a and the second magnetoresistive effect element 1b and applying the external magnetic field $H_E$ to the magnetization free layer 4 in each magnetoresistive effect element. The magnetic-field applying mechanism 12, which is the effective magnetic field setting mechanism, varies the effective magnetic field in the magnetization free layer 4 in each magnetoresistive effect element by varying the magnetic fields to be applied to the first magnetoresistive effect element 1a and the second magnetoresistive effect element 1b to enable the spin torque resonance frequency of the first magnetoresistive effect element 1a and the second magnetoresistive effect element 1b to be varied. As described above, varying the magnetic fields to be applied to the first magnetoresistive effect element 1a and the second magnetoresistive effect element 1b varies the spin torque resonance frequency of each of the first magnetoresistive effect element 1a and the second magnetoresistive effect element 1b.

The application of the direct current to the first magnetoresistive effect element 1a and the second magnetoresistive effect element 1b in the spin torque resonance increases the spin torque to increase the amplitude of the oscillating resistance value. The increase in the amplitude of the oscillating resistance value increases the amount of change in element impedance of each of the first magnetoresistive effect element 1a and the second magnetoresistive effect element 1b. Varying the current density of the direct current to be applied varies the spin torque resonance frequency. Accordingly, the spin torque resonance frequency of each of the first magnetoresistive effect element 1a and the second magnetoresistive effect element 1b is capable of being varied by varying the magnetic field from the magnetic-field applying mechanism 12 or by varying the direct current applied from the direct-current input terminal 11. The current density of the direct current to be applied to each of the first magnetoresistive effect element 1a and the second magnetoresistive effect element 1b is preferably smaller than an oscillation threshold current density of each of the first magnetoresistive effect element 1a and the second magnetoresistive effect element 1b. The oscillation threshold current density of the magnetoresistive effect element means the current density at a threshold value at which the magnetoresistive effect element oscillates at start of precession of the magnetization of the magnetization free layer in the magnetoresistive effect element at a constant frequency and at a constant amplitude (the output (the resistance value) of the magnetoresistive effect element is varied at a constant frequency and at a constant amplitude) in response to application of the direct current having a current density higher than or equal to the oscillation threshold current density.

In a state in which the direct current having the same magnetic field and the same current density is applied to the magnetoresistive effect elements, the spin torque resonance frequency of each of the magnetoresistive effect elements is increased as the aspect ratio of the plan view shape of the magnetoresistive effect element is increased. "The aspect ratio" means the ratio of the length of the long sides to the length of the short sides of a rectangle circumscribed around the plan view shape of the magnetoresistive effect element with a minimum area.

Due to the spin torque resonance phenomenon, the frequency components that coincide with the spin torque resonance frequency of the first magnetoresistive effect element 1a or that are near the spin torque resonance frequency of the first magnetoresistive effect element 1a, among the high-frequency components of the high-frequency signal input through the first port 9a, pass through the first magnetoresistive effect element 1a in a low impedance state and it is easy to supply the frequency components to the second port 9b. In contrast, it is difficult to supply the frequency components that are not near the spin torque resonance frequency of the first magnetoresistive effect element 1a, among the high-frequency components of the high-frequency signal input through the first port 9a, to the second port 9b due to the first magnetoresistive effect element 1a in a high impedance state.

In addition, due to the spin torque resonance phenomenon, the frequency components that coincide with the spin torque resonance frequency of the second magnetoresistive effect element 1b or that are near the spin torque resonance frequency of the second magnetoresistive effect element 1b, among the high-frequency components of the high-frequency signal that has passed through the first magnetoresistive effect element 1a, are cut off from the ground 8 by the second magnetoresistive effect element 1b which is connected in parallel to the second port 9b and which is in the high impedance state, and it is easy to supply the frequency components to the second port 9b. In contrast, the frequency components that are not near the spin torque resonance frequency of the second magnetoresistive effect element 1b, among the high-frequency components of the high-frequency signal that has passed through the first magnetoresistive effect element 1a, pass through the second magnetoresistive effect element 1b in the low impedance state and flows into the ground 8, and it is difficult to supply the frequency components to the second port 9b.

As described above, in the magnetoresistive effect device 101, the frequency components of the high-frequency signal, which are not near the spin torque resonance frequency of the first magnetoresistive effect element 1a and the spin torque resonance frequency of the second magnetoresistive effect element 1b, are cut off from the second port 9b doubly. Accordingly, the magnetoresistive effect device 101 has a function of a high-frequency filter having the frequencies near the spin torque resonance frequency of the first magnetoresistive effect element 1a and the frequencies near the spin torque resonance frequency of the second magnetoresistive effect element 1b as a pass band. In other words, the magnetoresistive effect device 101 functions as a bandpass filter having excellent cutoff characteristics.

In the magnetoresistive effect device 101, the impedance of the high-frequency signal having a non-resonant frequency of the first magnetoresistive effect element 1a (that is, the resistance value of the first magnetoresistive effect element 1a) is preferably high while the impedance of the high-frequency signal having a non-resonant frequency of the second magnetoresistive effect element 1b (that is, the resistance value of the second magnetoresistive effect element 1b) is preferably low. In other words, the impedance of the high-frequency signal having the non-resonant frequency of the first magnetoresistive effect element 1a (that is, the resistance value of the first magnetoresistive effect element 1a) is preferably higher than the impedance of the high-frequency signal having the non-resonant frequency of the second magnetoresistive effect element 1b (that is, the resistance value of the second magnetoresistive effect element 1b). For example, such relationship of the impedance (or the resistance value) is realized by making the cross-sectional area of a cross section perpendicular to the path of the high-frequency signal in the first magnetoresistive effect element 1a smaller than the cross-sectional area of a cross section perpendicular to the path of the high-frequency signal in the second magnetoresistive effect element 1b. In this case, the current density of the direct current to be applied to the first magnetoresistive effect element 1a is higher than the current density of the direct current to be applied to the second magnetoresistive effect element 1b. However, for example, adjusting the aspect ratio of the plan view shape of each of the first magnetoresistive effect element 1a and the second magnetoresistive effect element 1b in a state in which the same magnetic field is applied to the first magnetoresistive effect element 1a and the second magnetoresistive effect element 1b, the film structure of the first magnetoresistive effect element 1a is made equal to that of the second magnetoresistive effect element 1b, and the first magnetoresistive effect element 1a and the second magnetoresistive effect element 1b have rectangular plan view shapes makes the spin torque resonance frequency of the first magnetoresistive effect element 1a equal to the spin torque resonance frequency of the second magnetoresistive effect element 1b. "The same film structure" means that the first magnetoresistive effect element 1a and the second magnetoresistive effect element 1b have the same material and the same film thickness of each layer composing the magnetoresistive effect elements and have the same stacking order of the layers.

In addition, when the direct current input from the direct-current input terminal 11 has at least a certain strength, the magnetoresistive effect device 101 is capable of making the output power output through the second port 9b greater than the input power of the high-frequency signal input through the first port 9a (the attenuation is 0 dB or more) at the spin torque resonance frequency of the first magnetoresistive effect element 1a and the second magnetoresistive effect element 1b. In other words, the magnetoresistive effect device 101 may also function as an amplifier.

Furthermore, in the magnetoresistive effect device 101, the spin torque resonance frequency of the first magnetoresistive effect element 1a is equal to the spin torque resonance frequency of the second magnetoresistive effect element 1b. In this case, since the combined impedance of the first magnetoresistive effect element 1a and the second magnetoresistive effect element 1b at the frequency equal to the spin torque resonance frequency of the first magnetoresistive effect element 1a and the second magnetoresistive effect element 1b is decreased, the magnetoresistive effect device 101 may function as a high-frequency filter having excellent bandpass characteristics and a wide range of the bandpass characteristics and the cutoff characteristics.

Figure 2:
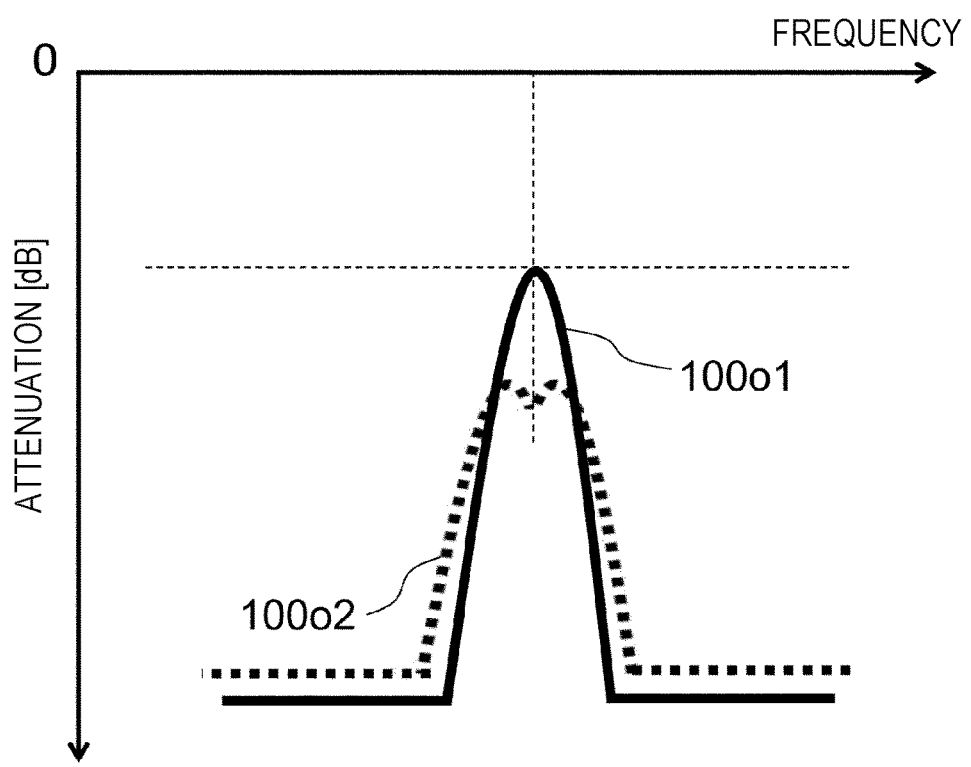
FIG. 2 is a graph illustrating the relationship between frequency and attenuation in the magnetoresistive effect device according to the first embodiment.

FIG. 2 is a graph illustrating the relationship between the frequency of the high-frequency signal input into the magnetoresistive effect device 101 and the attenuation. Referring to FIG. 2, the vertical axis represents attenuation and the horizontal axis represents frequency. FIG. 2 is a graph when a constant magnetic field is applied to the first magnetoresistive effect element 1a and the second magnetoresistive effect element 1b and constant direct current is applied to the first magnetoresistive effect element 1a and the second magnetoresistive effect element 1b. Referring to FIG. 2, a plot line 100o1 represents the relationship between the frequency of the high-frequency signal and the attenuation when the spin torque resonance frequency of the first magnetoresistive effect element 1a is equal to the spin torque resonance frequency of the second magnetoresistive effect element 1b. A plot line 100o2 represents the relationship between the frequency of the high-frequency signal and the attenuation when the spin torque resonance frequency of the first magnetoresistive effect element 1a is different from the spin torque resonance frequency of the second magnetoresistive effect element 1b.

For example, when the spin torque resonance frequency of the first magnetoresistive effect element 1a is equal to the spin torque resonance frequency of the second magnetoresistive effect element 1b, the combined impedance of the first magnetoresistive effect element 1a and the second magnetoresistive effect element 1b at the frequency equal to the spin torque resonance frequency of the first magnetoresistive effect element 1a and the second magnetoresistive effect element 1b is decreased, compared with the case in which the spin torque resonance frequency of the first magnetoresistive effect element 1a is different from the spin torque resonance frequency of the second magnetoresistive effect element 1b, as illustrated in FIG. 2. Accordingly, the bandpass characteristics of the magnetoresistive effect device 101 for the high-frequency signal having the frequency equal to the spin torque resonance frequency are improved (the absolute value of the attenuation is decreased).

Figure 3:
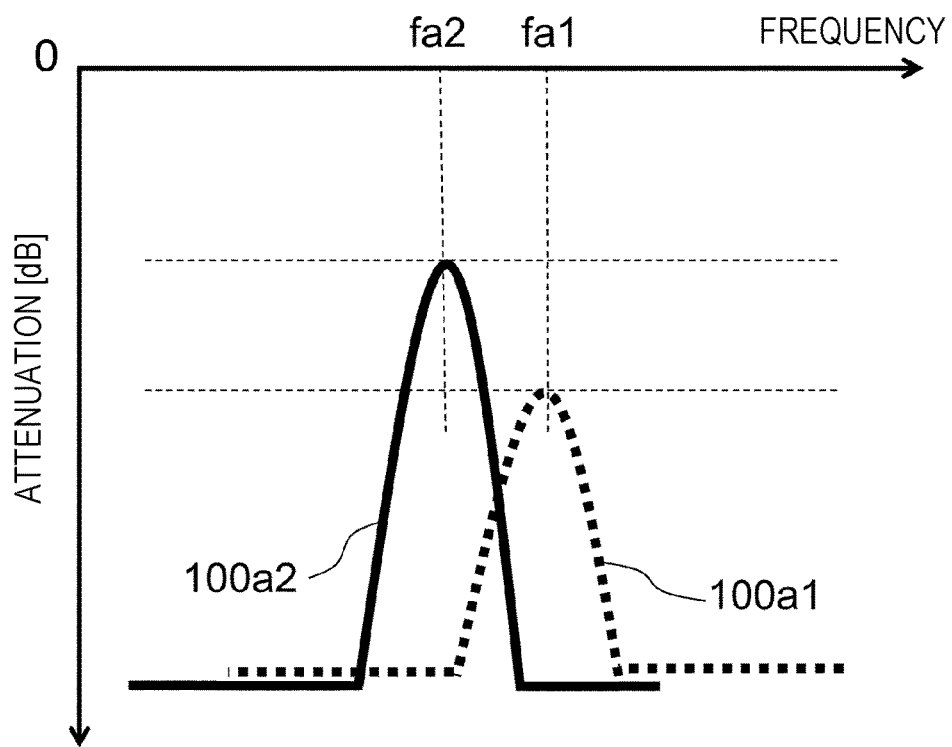
FIG. 3 is a graph illustrating the relationship between frequency and attenuation for direct current in the magnetoresistive effect device according to the first embodiment.
Figure 4:
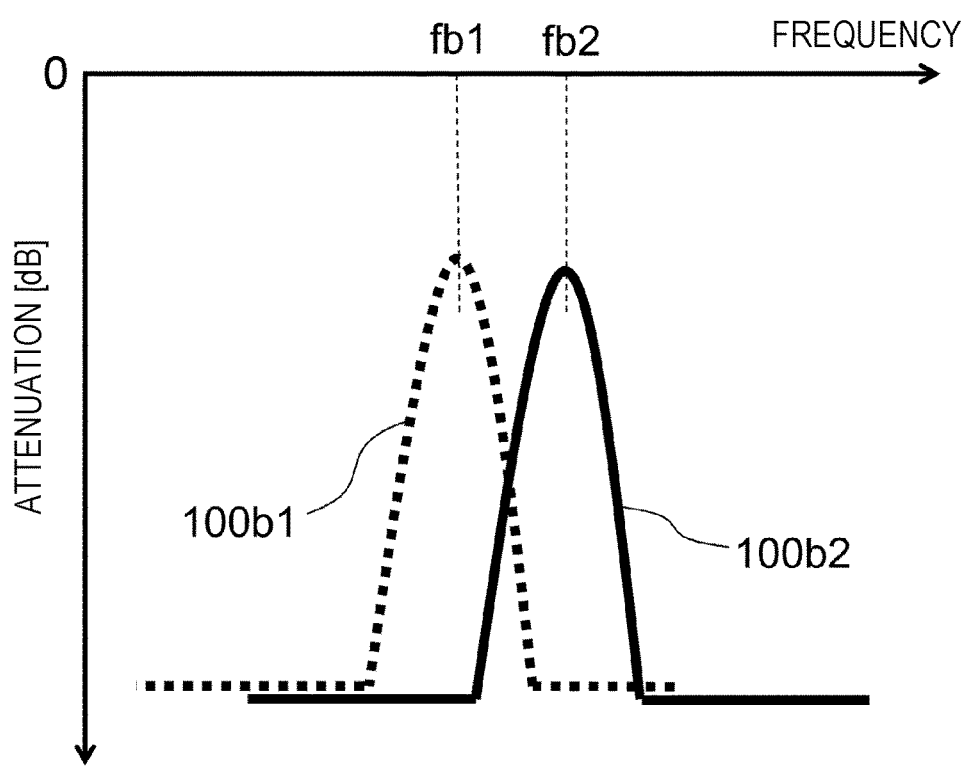
FIG. 4 is a graph illustrating the relationship between frequency and attenuation for the strength of a magnetic field in the magnetoresistive effect device according to the first embodiment.

FIG. 3 and FIG. 4 are graphs each illustrating the relationship between the frequency of the high-frequency signal input into the magnetoresistive effect device 101 and the attenuation. Referring to FIG. 3 and FIG. 4, the vertical axis represents attenuation and the horizontal axis represents frequency. FIG. 3 is a graph when a constant magnetic field is applied to the first magnetoresistive effect element 1a and the second magnetoresistive effect element 1b. Referring to FIG. 3, a plot line 100a1 represents the relationship between the frequency of the high-frequency signal and the attenuation when the direct current applied from the direct-current input terminal 11 to the first magnetoresistive effect element 1a and the second magnetoresistive effect element 1b has a value of Ia1 and a plot line 100a2 represents the relationship between the frequency of the high-frequency signal and the attenuation when the direct current applied from the direct-current input terminal 11 to the first magnetoresistive effect element 1a and the second magnetoresistive effect element 1b has a value of Ia2. The relationship between the applied direct current values is Ia1<Ia2. FIG. 4 is a graph when constant direct current is applied to the first magnetoresistive effect element 1a and the second magnetoresistive effect element 1b. Referring to FIG. 4, a plot line 100b1 represents the relationship between the frequency of the high-frequency signal and the attenuation when the magnetic field applied from the magnetic-field applying mechanism 12 to the first magnetoresistive effect element 1a and the second magnetoresistive effect element 1b has a strength of Hb1 and a plot line 100b2 represents the relationship between the frequency of the high-frequency signal and the attenuation when the magnetic field applied from the magnetic-field applying mechanism 12 to the first magnetoresistive effect element 1a and the second magnetoresistive effect element 1b has a strength of Hb2. The relationship between the strengths of the magnetic fields is Hb1<Hb2.

For example, when the value of the direct current applied from the direct-current input terminal 11 to the first magnetoresistive effect element 1a and the second magnetoresistive effect element 1b is increased from Ia1 to Ia2 in the case in which the spin torque resonance frequency of the first magnetoresistive effect element 1a is equal to the spin torque resonance frequency of the second magnetoresistive effect element 1b, as illustrated in FIG. 3, the amount of change in element impedance in each of the first magnetoresistive effect element 1a and the second magnetoresistive effect element 1b at the frequencies near the spin torque resonance frequency of the first magnetoresistive effect element 1a and the second magnetoresistive effect element 1b (the frequencies in the passband) is increased with the variation in the current value. As a result, the high-frequency signal output from the second port 9b is further increased in strength to decrease the passband loss. Accordingly, the magnetoresistive effect device 101 is capable of realizing a high-frequency filter having a wide range of the cut-off characteristics and the bandpass characteristics. In response to the increase of the direct current value from Ia1 to Ia2, the spin torque resonance frequency of the first magnetoresistive effect element 1a and the second magnetoresistive effect element 1b is shifted from fa1 to fa2. Specifically, the pass band is shifted toward low frequencies. Thus, the magnetoresistive effect device 101 may function as a high-frequency filter capable of varying the frequencies of the pass band.

In addition, for example, when the strength of the magnetic field applied from the magnetic-field applying mechanism 12 is increased from Hb1 to Hb2 in the case in which the spin torque resonance frequency of the first magnetoresistive effect element 1a is equal to the spin torque resonance frequency of the second magnetoresistive effect element 1b, as illustrated in FIG. 4, the spin torque resonance frequency of the first magnetoresistive effect element 1a and the second magnetoresistive effect element 1b is shifted from fb1 to fb2. Specifically, the pass band is shifted toward high frequencies. The pass band is capable of being greatly shifted when the strength of the magnetic field (the effective magnetic field $H_{eff}$ in the magnetization free layer 4) is varied, compared with the case in which the direct current value is varied. In other words, the magnetoresistive effect device 101 may function as a high-frequency filter capable of varying the frequencies of the pass band.

The amplitude of the oscillating resistance value of each magnetoresistive effect element is reduced with an increase in the external magnetic field $H_E$ to be applied to the magnetoresistive effect element (the effective magnetic field $H_{eff}$ in the magnetization free layer 4). Accordingly, the current density of the direct current to be applied to each magnetoresistive effect element is preferably increased with an increase in the external magnetic field $H_E$ to be applied to the magnetoresistive effect element (the effective magnetic field $H_{eff}$ in the magnetization free layer 4).

As described above, the magnetoresistive effect device 101 includes the first magnetoresistive effect element 1a, the second magnetoresistive effect element 1b, the first port 9a through which a high-frequency signal is input, the second port 9b through which a high-frequency signal is output, the signal line 7, and the direct-current input terminal 11. The first port 9a, the first magnetoresistive effect element 1a, and the second port 9b are connected in series to each other in this order via the signal line 7. The second magnetoresistive effect element 1b is connected to the signal line 7 in parallel with the second port 9b. Each of the first magnetoresistive effect element 1a and the second magnetoresistive effect element 1b includes the magnetization fixed layer 2, the magnetization free layer 4, and the spacer layer 3 disposed between the magnetization fixed layer 2 and the magnetization free layer 4. The first magnetoresistive effect element 1a and the second magnetoresistive effect element 1b are connected to the direct-current input terminal 11 and the reference voltage terminal 20 so that one end side of each of the first magnetoresistive effect element 1a and the second magnetoresistive effect element 1b is at the direct-current input terminal 11 side and the other end side thereof is at the reference voltage terminal 20 side. The first magnetoresistive effect element 1a and the second magnetoresistive effect element 1b are formed so that the relationship between the direction from one end side to the other end side and the direction from the magnetization free layer 4 to the magnetization fixed layer 2 in the first magnetoresistive effect element 1a is opposite to that in the second magnetoresistive effect element 1b. The first magnetoresistive effect element 1a is formed so that the direct current input from the direct-current input terminal 11 flows through the first magnetoresistive effect element 1a in the direction from the magnetization free layer 4 to the magnetization fixed layer 2 and the second magnetoresistive effect element 1b is formed so that the direct current input from the direct-current input terminal 11 flows through the second magnetoresistive effect element 1b in the direction from the magnetization fixed layer 2 to the magnetization free layer 4.

Accordingly, the input of the high-frequency signal from the first port 9a into the first magnetoresistive effect element 1a and the second magnetoresistive effect element 1b via the signal line 7 enables the spin torque resonance to be induced in the first magnetoresistive effect element 1a and the second magnetoresistive effect element 1b. Due to the direct current flowing through the first magnetoresistive effect element 1a in the direction from the magnetization free layer 4 to the magnetization fixed layer 2 simultaneously with the spin torque resonance, the first magnetoresistive effect element 1a is capable of being considered as an element the resistance value of which oscillates with a fixed cycle at a frequency corresponding to the spin torque resonance frequency in phase with the high-frequency signal input through the first port 9a. With this effect, the element impedance of the first magnetoresistive effect element 1a at a frequency equal to the spin torque resonance frequency of the first magnetoresistive effect element 1a is decreased. Due to the direct current flowing through the second magnetoresistive effect element 1b in the direction from the magnetization fixed layer 2 to the magnetization free layer 4 simultaneously with the spin torque resonance, the second magnetoresistive effect element 1b is capable of being considered as an element the resistance value of which oscillates with a fixed cycle at a frequency corresponding to the spin torque resonance frequency out of phase with the high-frequency signal input through the first port 9a by 180 degrees. With this effect, the element impedance of the second magnetoresistive effect element 1b at a frequency equal to the spin torque resonance frequency of the second magnetoresistive effect element 1b is increased. The series connection of the first port 9a, the first magnetoresistive effect element 1a, and the second port 9b in this order enables the high-frequency signal to be cut off from the second port 9b at the non-resonant frequency at which the first magnetoresistive effect element 1a is in the high impedance state and to be transmitted to the second port 9b side at the resonant frequency at which the first magnetoresistive effect element 1a is in the low impedance state. The connection of the second magnetoresistive effect element 1b to the signal line 7 in parallel with the second port 9b enables the high-frequency signal to be cut off from the second port 9b at the non-resonant frequency at which the second magnetoresistive effect element 1b is in the low impedance state and to be transmitted to the second port 9b side at the resonant frequency at which the second magnetoresistive effect element 1b is in the high impedance state. In other words, the magnetoresistive effect device 101 is capable of having frequency characteristics as a high-frequency filter.

In addition, since the spin torque resonance frequency of the first magnetoresistive effect element 1a is equal to the spin torque resonance frequency of the second magnetoresistive effect element 1b in the magnetoresistive effect device 101, the combined impedance of the first magnetoresistive effect element 1a and the second magnetoresistive effect element 1b at the frequency equal to the spin torque resonance frequency of the first magnetoresistive effect element 1a and the second magnetoresistive effect element 1b is decreased. Accordingly, the magnetoresistive effect device 101 may function as a high-frequency filter having excellent bandpass characteristics and a wide range of the bandpass characteristics and the cutoff characteristics.

Furthermore, in order to broaden the range of the bandpass characteristics and the cutoff characteristics, the magnetization free layer 4 preferably has the magnetic easy axis in the plane normal direction and the magnetization fixed layer 2 preferably has the magnetic easy axis in the in-plane direction.

Furthermore, since varying the direct current applied from the direct-current input terminal 11 enables the spin torque resonance frequency of the first magnetoresistive effect element 1a and the spin torque resonance frequency of the second magnetoresistive effect element 1b to be variably controlled, the magnetoresistive effect device 101 may also function as a variable frequency filter.

Furthermore, since the magnetoresistive effect device 101 includes the magnetic-field applying mechanism 12, which serves as a frequency setting mechanism capable of setting the spin torque resonance frequency of the first magnetoresistive effect element 1a and the spin torque resonance frequency of the second magnetoresistive effect element 1b, the spin torque resonance frequency of the first magnetoresistive effect element 1a and the spin torque resonance frequency of the second magnetoresistive effect element 1b may be set to arbitrary values. Accordingly, the magnetoresistive effect device 101 may function as a filter having an arbitrary frequency band.

Furthermore, since the magnetic-field applying mechanism 12 is the effective magnetic field setting mechanism capable of setting the effective magnetic field in the magnetization free layer 4 and is capable of varying the spin torque resonance frequency of the first magnetoresistive effect element 1a and the spin torque resonance frequency of the second magnetoresistive effect element 1b by varying the effective magnetic field in the magnetization free layer 4, the magnetoresistive effect device 101 may function as a variable frequency filter.

Although the example is described above in which the second magnetoresistive effect element 1b is connected to the signal line 7 between the first magnetoresistive effect element 1a and the second port 9b in parallel with the second port 9b and the direct-current input terminal 11 is connected to the signal line 7 between the first magnetoresistive effect element 1a and the first port 9a, the second magnetoresistive effect element 1b may be connected to the signal line 7 between the first magnetoresistive effect element 1a and the first port 9a in parallel with the second port 9b and the direct-current input terminal 11 may be connected to the signal line 7 between the first magnetoresistive effect element 1a and the second port 9b. More specifically, one end of the second magnetoresistive effect element 1b may be connected to the signal line 7 between the first magnetoresistive effect element 1a and the first port 9a and the other end of the second magnetoresistive effect element 1b may be connected to the ground 8 via the reference voltage terminal 20.

Although the example is described above in which the spin torque resonance frequency of the first magnetoresistive effect element 1a is equal to the spin torque resonance frequency of the second magnetoresistive effect element 1b in the magnetoresistive effect device 101, the spin torque resonance frequency of the first magnetoresistive effect element 1a may be different from the spin torque resonance frequency of the second magnetoresistive effect element 1b in the magnetoresistive effect device 101. As described above, the spin torque resonance frequency of each magnetoresistive effect element is capable of being adjusted by adjusting at least one of "the magnetic field to be applied to each magnetoresistive effect element", "the current density of the direct current to be applied to each magnetoresistive effect element, and "the aspect ratio of the plan view shape of each magnetoresistive effect element".

When the spin torque resonance frequency of the first magnetoresistive effect element 1a is different from the spin torque resonance frequency of the second magnetoresistive effect element 1b, the frequencies near the spin torque resonance frequency of the first magnetoresistive effect element 1a and the frequencies near the spin torque resonance frequency of the second magnetoresistive effect element 1b are across a wide range, as illustrated by the plot line 100o2 in FIG. 2. As a result, the pass band in which the high-frequency signal is transmitted to the second port side is across a wide range. In other words, the magnetoresistive effect device 101 may function as a high-frequency filter having a wide pass band in this case.

Second Embodiment

Figure 5:
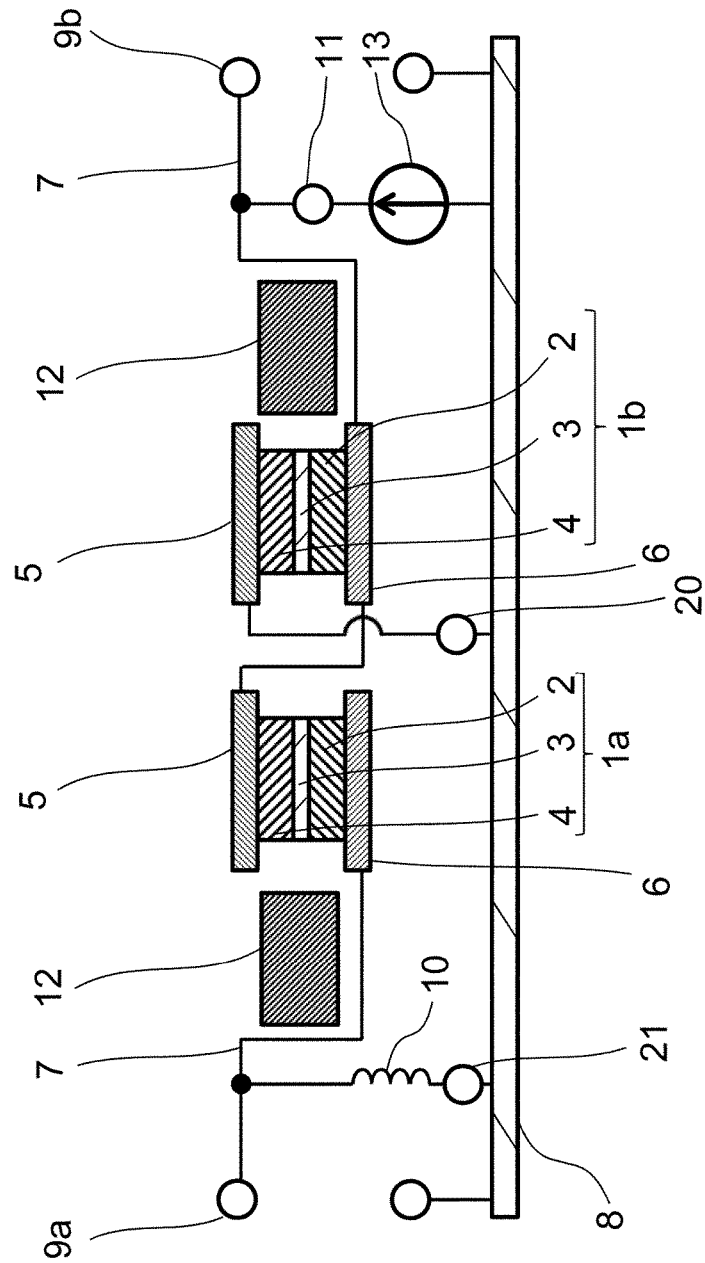
FIG. 5 is a schematic cross-sectional view of a magnetoresistive effect device according to a second embodiment.

FIG. 5 is a schematic cross-sectional view of a magnetoresistive effect device 102 according to a second embodiment of the present invention. Points different from the magnetoresistive effect device 101 of the first embodiment in the magnetoresistive effect device 102 will be mainly described and a description of common points will be appropriately omitted herein. The same reference numerals are used in the second embodiment to identify the same components in the magnetoresistive effect device 101 of the first embodiment and a description of the common components will be omitted herein. The magnetoresistive effect device 102 further includes an inductor 10 and a reference voltage terminal 21, in addition to the components in the magnetoresistive effect device 101 of the first embodiment. The inductor 10 is connected to the signal line 7 between the first magnetoresistive effect element 1a and the first port 9a (one of the signal line 7 between the first magnetoresistive effect element 1a and the first port 9a and the signal line 7 between the first magnetoresistive effect element 1a and the second port 9b) in parallel with the second port 9b. The second magnetoresistive effect element 1b is connected to the signal line 7 between the first magnetoresistive effect element 1a and the second port 9b (the other of the signal line 7 between the first magnetoresistive effect element 1a and the first port 9a and the signal line 7 between the first magnetoresistive effect element 1a and the second port 9b) in parallel with the second port 9b. In other words, the second magnetoresistive effect element 1b is connected to the signal line 7 at the opposite side to the inductor 10 with the first magnetoresistive effect element 1a in between the second magnetoresistive effect element 1b and the inductor 10. The direct-current input terminal 11 is connected to the signal line 7 between the first magnetoresistive effect element 1a and the second port 9b (the other of the signal line 7 between the first magnetoresistive effect element 1a and the first port 9a and the signal line 7 between the first magnetoresistive effect element 1a and the second port 9b). In other words, the direct-current input terminal 11 is connected to the signal line 7 at the opposite side to the inductor 10 with the first magnetoresistive effect element 1a in between the direct-current input terminal 11 and the inductor 10. More specifically, the inductor 10 is connected to the signal line 7 between the first magnetoresistive effect element 1a and the first port 9a and may be connected to the ground 8 via the reference voltage terminal 21. One end (at the magnetization fixed layer 2 side) of the second magnetoresistive effect element 1b is connected to the signal line 7 between the first magnetoresistive effect element 1a and the second port 9b, the other end (at the magnetization free layer 4 side) of the second magnetoresistive effect element 1b may be connected to the ground 8 via the reference voltage terminal 20, and the direct-current input terminal 11 is connected to the signal line 7 between the first magnetoresistive effect element 1a and the second port 9b. The first magnetoresistive effect element 1a is connected to the signal line 7 so that the magnetization fixed layer 2 side is at the first port 9a side. The first magnetoresistive effect element 1a is formed (arranged) so that the direct current input from the direct-current input terminal 11 flows through the first magnetoresistive effect element 1a in the direction from the magnetization free layer 4 to the magnetization fixed layer 2. The remaining configuration of the magnetoresistive effect device 102 is the same as that of the magnetoresistive effect device 101 of the first embodiment.

The first magnetoresistive effect element 1a is connected to the direct-current input terminal 11 and the reference voltage terminal 21 so that one end side (at the magnetization free layer 4 side in this example) is at the direct-current input terminal 11 side and the other end side (at the magnetization fixed layer 2 side in this example) is at the reference voltage terminal 21 side. The second magnetoresistive effect element 1b is connected to the direct-current input terminal 11 and the reference voltage terminal 20 so that one end side (at the magnetization fixed layer 2 side in this example) is at the direct-current input terminal 11 side and the other end side (at the magnetization free layer 4 side in this example) is at the reference voltage terminal 20 side. In other words, in the magnetoresistive effect device 102, the first magnetoresistive effect element 1a and the second magnetoresistive effect element 1b are formed (arranged) so that the relationship between the direction from one end side to the other end side and the direction from the magnetization free layer 4 to the magnetization fixed layer 2 in the first magnetoresistive effect element 1a is opposite to that in the second magnetoresistive effect element 1b, as in the magnetoresistive effect device 101.

The first magnetoresistive effect element 1a is formed (arranged) so that direct current input from the direct-current input terminal 11 flows through the first magnetoresistive effect element 1a in the direction from the magnetization free layer 4 to the magnetization fixed layer 2. The second magnetoresistive effect element 1b is formed (arranged) so that the direct current input from the direct-current input terminal 11 flows through the second magnetoresistive effect element 1b in the direction from the magnetization fixed layer 2 to the magnetization free layer 4. In other words, in the magnetoresistive effect device 102, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b, as in the magnetoresistive effect device 101.

The direct-current source 13 is connected to the ground 8 and the direct-current input terminal 11. When the magnetoresistive effect device 102 is connected to the ground 8, a closed circuit including the first magnetoresistive effect element 1a, the signal line 7, the inductor 10, the ground 8, and the direct-current input terminal 11 is capable of being formed. In addition, when the magnetoresistive effect device 102 is connected to the ground 8, a closed circuit including the second magnetoresistive effect element 1b, the signal line 7, the ground 8, and the direct-current input terminal 11 is capable of being formed.

The inductor 10 is connected between the signal line 7 and the ground 8 and has a function to cut off high-frequency components of the current and pass direct-current components of the current with its inductance component. The inductor 10 may be a chip inductor or an inductor composed of a pattern line. Alternatively, the inductor 10 may be a resistance element having an inductance component. The inductor 10 preferably has an inductance value of 10 nH or more. The use of the inductor 10 enables the direct current applied from the direct-current input terminal 11 to flow through the closed circuit including the first magnetoresistive effect element 1a, the signal line 7, the inductor 10, the ground 8, and the direct-current input terminal 11 without degrading the characteristics of the high-frequency signal passing through the first magnetoresistive effect element 1a.

The magnetoresistive effect device 102 is capable of having the frequency characteristics as a high-frequency filter, like the magnetoresistive effect device 101 of the first embodiment.

Third Embodiment

Figure 6:
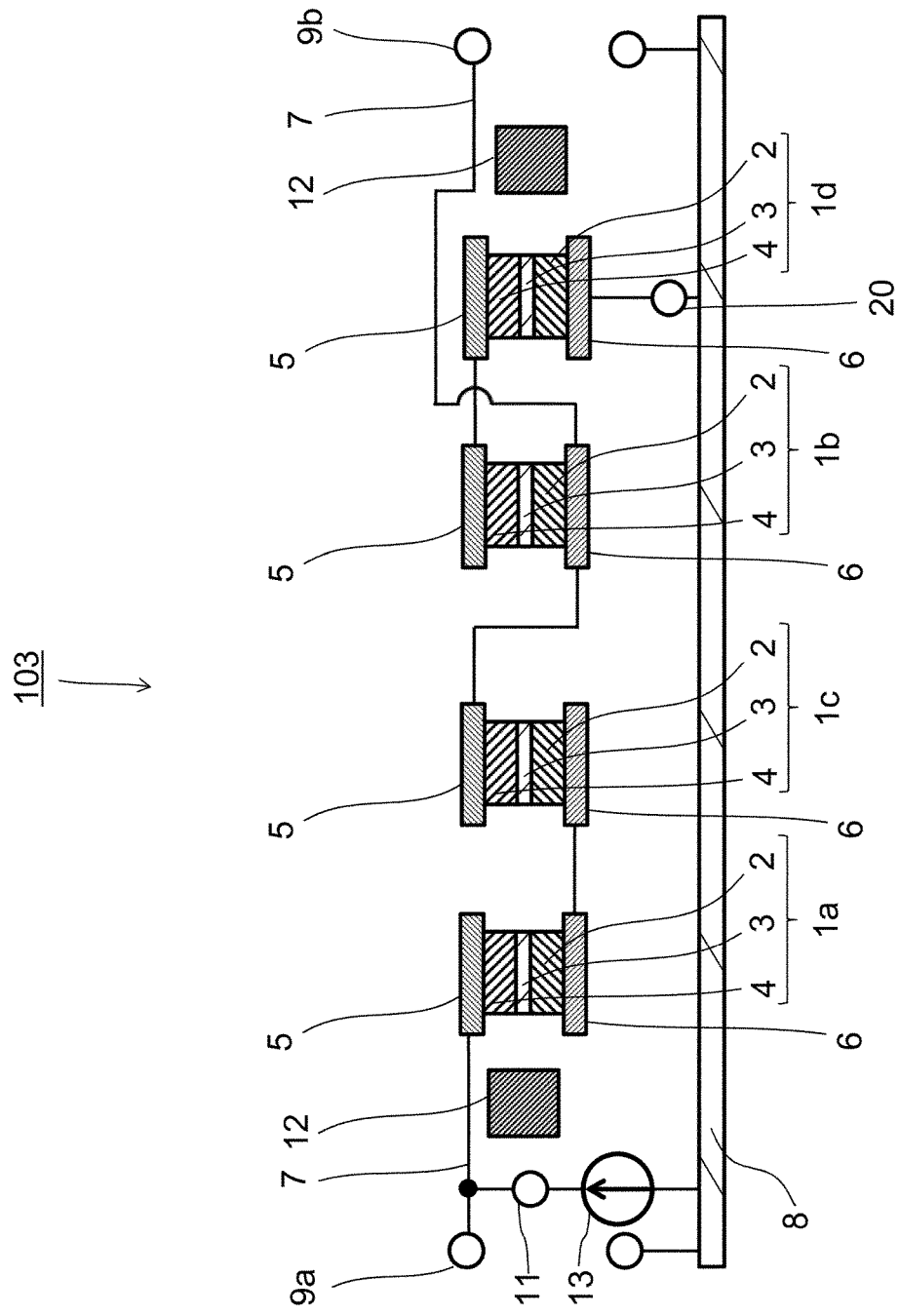
FIG. 6 is a schematic cross-sectional view of a magnetoresistive effect device according to a third embodiment.

FIG. 6 is a schematic cross-sectional view of a magnetoresistive effect device 103 according to a third embodiment of the present invention. Points different from the magnetoresistive effect device 101 of the first embodiment in the magnetoresistive effect device 103 will be mainly described and a description of common points will be appropriately omitted herein. The same reference numerals are used in the third embodiment to identify the same components in the magnetoresistive effect device 101 of the first embodiment and a description of the common components will be omitted herein. The magnetoresistive effect device 103 further includes a third magnetoresistive effect element 1c and a fourth magnetoresistive effect element 1d, in addition to the components in the magnetoresistive effect device 101 of the first embodiment. The third magnetoresistive effect element 1c includes the magnetization fixed layer 2 (a third magnetization fixed layer), the magnetization free layer 4 (a third magnetization free layer), and the spacer layer 3 (a third spacer layer) disposed between the magnetization fixed layer 2 and the magnetization free layer 4. The fourth magnetoresistive effect element 1d includes the magnetization fixed layer 2 (a fourth magnetization fixed layer), the magnetization free layer 4 (a fourth magnetization free layer), and the spacer layer 3 (a fourth spacer layer) disposed between the magnetization fixed layer 2 and the magnetization free layer 4.

The first port 9a, the third magnetoresistive effect element 1c, and the second port 9b are connected in series to each other in this order via the signal line 7. The fourth magnetoresistive effect element 1d is connected to the signal line 7 between the first magnetoresistive effect element 1a and the second port 9b (one of the signal line 7 between the first magnetoresistive effect element 1a and the first port 9a and the signal line 7 between the first magnetoresistive effect element 1a and the second port 9b) in parallel with the second port 9b. In the magnetoresistive effect device 103 illustrated in FIG. 6, the first magnetoresistive effect element 1a is connected in series to the third magnetoresistive effect element 1c and the second magnetoresistive effect element 1b is connected in series to the fourth magnetoresistive effect element 1d. More specifically, one end (at the magnetization fixed layer 2 side) of the third magnetoresistive effect element 1c is connected to the magnetization fixed layer 2 side of the first magnetoresistive effect element 1a and the other end (at the magnetization free layer 4 side) of the third magnetoresistive effect element 1c is connected to the second port 9b side. One end (at the magnetization free layer 4 side) of the fourth magnetoresistive effect element 1d is connected to the signal line 7 between the first magnetoresistive effect element 1a and the second port 9b (at the magnetization free layer 4 side of the second magnetoresistive effect element 1b) and the other end (at the magnetization fixed layer 2 side) of the fourth magnetoresistive effect element 1d may be connected to the ground 8 via the reference voltage terminal 20. When the magnetoresistive effect device 103 is connected to the ground 8, a closed circuit including the first magnetoresistive effect element 1a, the third magnetoresistive effect element 1c, the signal line 7, the second magnetoresistive effect element 1b, the fourth magnetoresistive effect element 1d, the ground 8, and the direct-current input terminal 11 is capable of being formed.

The third magnetoresistive effect element 1c is connected to the direct-current input terminal 11 and the reference voltage terminal 20 so that one end side (at the magnetization fixed layer 2 side in this example) is at the direct-current input terminal 11 side and the other end side (at the magnetization free layer 4 side in this example) is at the reference voltage terminal 20 side. In other words, in the magnetoresistive effect device 103, the first magnetoresistive effect element 1a and the third magnetoresistive effect element 1c are formed (arranged) so that the relationship between the direction from one end side to the other end side and the direction from the magnetization free layer 4 to the magnetization fixed layer 2 in the first magnetoresistive effect element 1a is opposite to that in the third magnetoresistive effect element 1c. In the example in FIG. 6, the direction from one end side to the other end side is the same as the direction from the magnetization free layer 4 to the magnetization fixed layer 2 in the first magnetoresistive effect element 1a while the direction from one end side to the other end side is opposite to the direction from the magnetization free layer 4 to the magnetization fixed layer 2 in the third magnetoresistive effect element 1c.

The fourth magnetoresistive effect element 1d is connected to the direct-current input terminal 11 and the reference voltage terminal 20 so that one end side (at the magnetization free layer 4 side in this example) is at the direct-current input terminal 11 side and the other end side (at the magnetization fixed layer 2 side in this example) is at the reference voltage terminal 20 side. In other words, in the magnetoresistive effect device 103, the second magnetoresistive effect element 1b and the fourth magnetoresistive effect element 1d are formed (arranged) so that the relationship between the direction from one end side to the other end side and the direction from the magnetization free layer 4 to the magnetization fixed layer 2 in the second magnetoresistive effect element 1b is opposite to that in the fourth magnetoresistive effect element 1d. In the example in FIG. 6, the direction from one end side to the other end side is opposite to the direction from the magnetization free layer 4 to the magnetization fixed layer 2 in the second magnetoresistive effect element 1b while the direction from one end side to the other end side is the same as the direction from the magnetization free layer 4 to the magnetization fixed layer 2 in the fourth magnetoresistive effect element 1d.

The third magnetoresistive effect element 1c is formed (arranged) so that the direct current input from the direct-current input terminal 11 flows through the third magnetoresistive effect element 1c in the direction from the magnetization fixed layer 2 to the magnetization free layer 4. In other words, in the magnetoresistive effect device 103, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the third magnetoresistive effect element 1c and the order of arrangement of the magnetization fixed layer 2, the spacer layer 3, and the magnetization free layer 4 in the third magnetoresistive effect element 1c. The fourth magnetoresistive effect element 1d is formed (arranged) so that the direct current input from the direct-current input terminal 11 flows through the fourth magnetoresistive effect element 1d in the direction from the magnetization free layer 4 to the magnetization fixed layer 2. In other words, in the magnetoresistive effect device 103, the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b is opposite to the relationship between the direction of the direct current flowing through the fourth magnetoresistive effect element 1d and the order of arrangement of the magnetization fixed layer 2, the spacer layer 3, and the magnetization free layer 4 in the fourth magnetoresistive effect element 1d.

In addition, the spin torque resonance frequency of the third magnetoresistive effect element 1c is higher than the spin torque resonance frequency of the first magnetoresistive effect element 1a and the spin torque resonance frequency of the second magnetoresistive effect element 1b. The spin torque resonance frequency of the fourth magnetoresistive effect element 1d is lower than the spin torque resonance frequency of the first magnetoresistive effect element 1a and the spin torque resonance frequency of the second magnetoresistive effect element 1b.

The magnetic-field applying mechanism 12 is disposed near the first magnetoresistive effect element 1a, the second magnetoresistive effect element 1b, the third magnetoresistive effect element 1c, and the fourth magnetoresistive effect element 1d. The magnetic-field applying mechanism 12 applies the magnetic field to the first magnetoresistive effect element 1a, the second magnetoresistive effect element 1b, the third magnetoresistive effect element 1c, and the fourth magnetoresistive effect element 1d to enable setting of the spin torque resonance frequencies of the first magnetoresistive effect element 1a, the second magnetoresistive effect element 1b, the third magnetoresistive effect element 1c, and the fourth magnetoresistive effect element 1d. The magnetic-field applying mechanism 12 is the effective magnetic field setting mechanism capable of setting the effective magnetic field $H_{eff}$ in the magnetization free layer 4 in each of the first magnetoresistive effect element 1a, the second magnetoresistive effect element 1b, the third magnetoresistive effect element 1c, and the fourth magnetoresistive effect element 1d. The remaining configuration of the magnetoresistive effect device 103 is the same as that of the magnetoresistive effect device 101 of the first embodiment.

Since the third magnetoresistive effect element 1c is formed (arranged) so that the direct current input from the direct-current input terminal 11 flows through the third magnetoresistive effect element 1c in the direction from the magnetization fixed layer 2 to the magnetization free layer 4, the third magnetoresistive effect element 1c is capable of being considered as a resistance element in which the impedance of the high-frequency signal is increased at the spin torque resonance frequency due to the spin torque resonance phenomenon, like the second magnetoresistive effect element 1b.

Since the fourth magnetoresistive effect element 1d is formed (arranged) so that the direct current input from the direct-current input terminal 11 flows through the fourth magnetoresistive effect element 1d in the direction from the magnetization free layer 4 to the magnetization fixed layer 2, the fourth magnetoresistive effect element 1d is capable of being considered as a resistance element in which the impedance of the high-frequency signal is decreased at the spin torque resonance frequency due to the spin torque resonance phenomenon, like the first magnetoresistive effect element 1a.

Due to the spin torque resonance phenomenon, the frequency components that coincide with the spin torque resonance frequency of the third magnetoresistive effect element 1c or that are near the spin torque resonance frequency of the third magnetoresistive effect element 1c, among the high-frequency components of the high-frequency signal input through the first port 9a, are cut off by the third magnetoresistive effect element 1c in the high impedance state and it is difficult to supply the frequency components to the second port 9b.

In addition, due to the spin torque resonance phenomenon, the frequency components that coincide with the spin torque resonance frequency of the fourth magnetoresistive effect element 1d or that are near the spin torque resonance frequency of the fourth magnetoresistive effect element 1d, among the high-frequency components of the high-frequency signal input through the first port 9a, easily flow into the ground 8 due to the fourth magnetoresistive effect element 1d, which is connected in parallel to the second port 9b and which is in the low impedance state, and it is difficult to supply the frequency components to the second port 9b.

Figure 7:
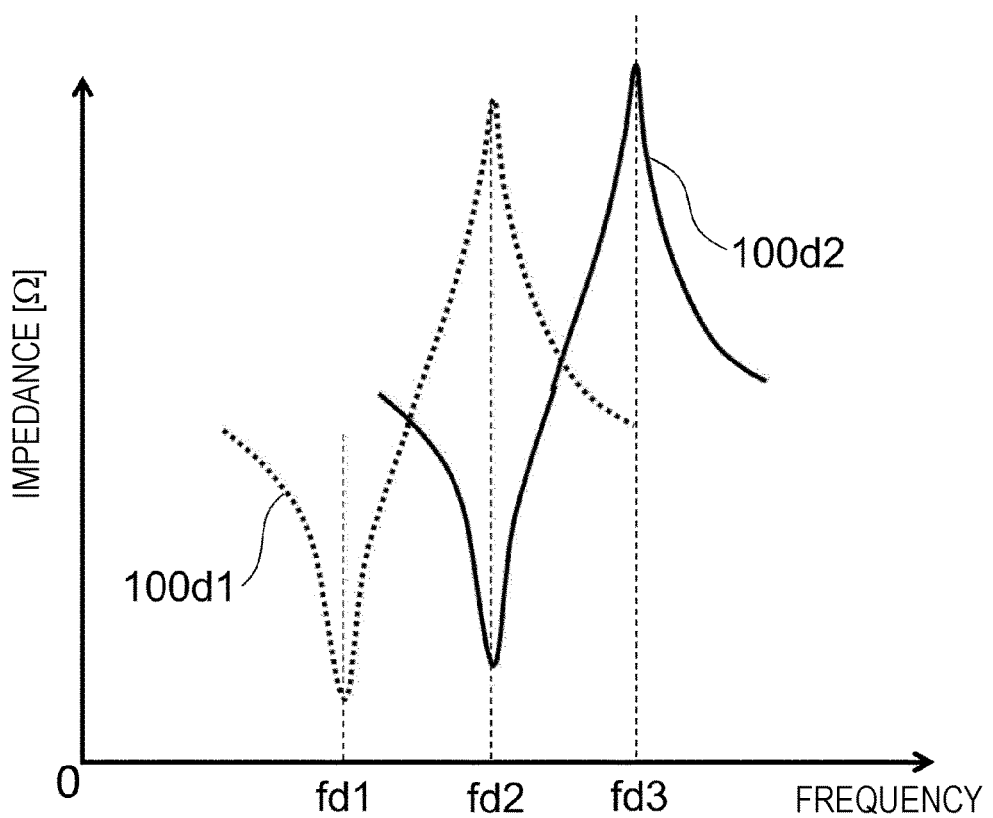
FIG. 7 is a graph illustrating the relationship between the combined impedance of magnetoresistive effect elements and frequency in the magnetoresistive effect device according to the third embodiment.

FIG. 7 is a graph illustrating the relationship between the frequency of the high-frequency signal input into the magnetoresistive effect device 103 and the combined impedance of the magnetoresistive effect elements in the magnetoresistive effect device 103. Referring to FIG. 7, the vertical axis represents impedance and the horizontal axis represents frequency. A plot line 100d1 represents combined impedance characteristics of the second magnetoresistive effect element 1b and the fourth magnetoresistive effect element 1d, which are connected in parallel to the second port 9b.

The low frequency side (near a frequency fd1) mainly represents the impedance characteristics of the fourth magnetoresistive effect element 1d in the spin torque resonance and the high frequency side (near a frequency fd2) mainly represents the impedance characteristics of the second magnetoresistive effect element 1b in the spin torque resonance. A plot line 100d2 represents combined impedance characteristics of the first magnetoresistive effect element 1a and the third magnetoresistive effect element 1c, which are connected in series to the first port 9a and the second port 9b. The low frequency side (near the frequency fd2) mainly represents the impedance characteristics of the first magnetoresistive effect element 1a in the spin torque resonance and the high frequency side (near a frequency fd3) mainly represents the impedance characteristics of the third magnetoresistive effect element 1c in the spin torque resonance. The frequency fd1 is the spin torque resonance frequency of the fourth magnetoresistive effect element 1d, the frequency fd3 is the spin torque resonance frequency of the third magnetoresistive effect element 1c, and the frequency fd2 is the spin torque resonance frequency of the first magnetoresistive effect element 1a and the second magnetoresistive effect element 1b. The example is illustrated in FIG. 7 in which the spin torque resonance frequency of the first magnetoresistive effect element 1a is equal to the spin torque resonance frequency of the second magnetoresistive effect element 1b.

Figure 8:
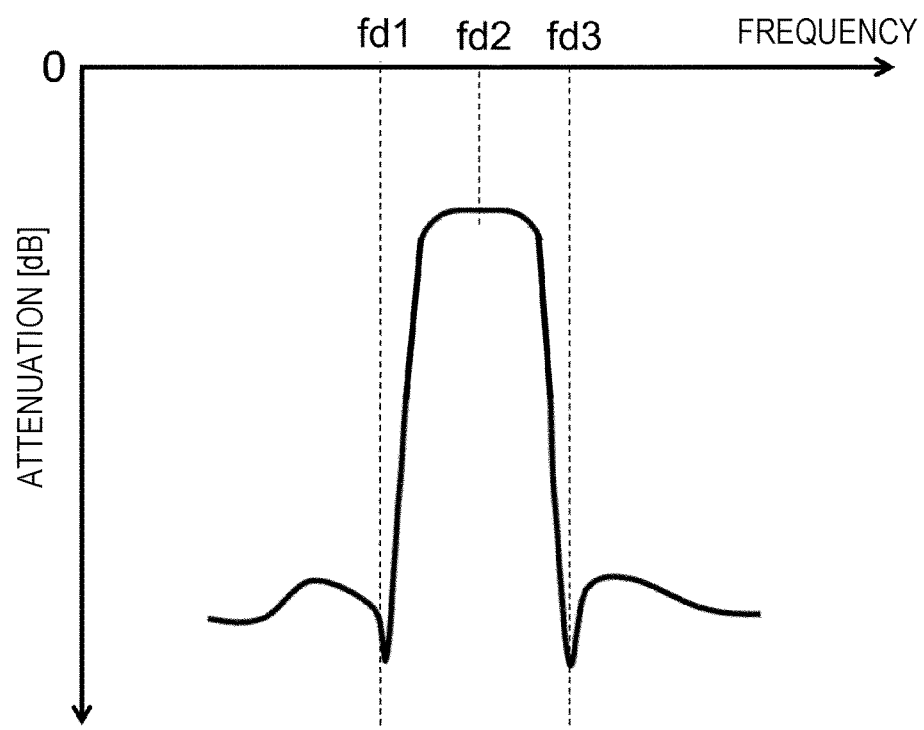
FIG. 8 is a graph illustrating the relationship between frequency and attenuation in the magnetoresistive effect device according to the third embodiment.

FIG. 8 is a graph illustrating the relationship between the frequency of the high-frequency signal input into the magnetoresistive effect device 103 and the attenuation. Referring to FIG. 8, the vertical axis represents attenuation and the horizontal axis represents frequency.

As illustrated in FIG. 8, in the magnetoresistive effect device 103, the high-frequency signal output from the second port 9b is increased in strength at frequencies near the spin torque resonance frequency of the first magnetoresistive effect element 1a and frequencies near the spin torque resonance frequency of the second magnetoresistive effect element 1b to decrease the passband loss, as in the magnetoresistive effect device 101 of the first embodiment. Accordingly, the magnetoresistive effect device 103 functions as a bandpass filter having a pass band of the frequencies near the spin torque resonance frequency of the first magnetoresistive effect element 1a and the frequencies near the spin torque resonance frequency of the second magnetoresistive effect element 1b. The magnetoresistive effect device 103 is capable of cutting off the high-frequency signal from the second port 9b at the high frequency side and the low frequency side of the spin torque resonance frequency of the first magnetoresistive effect element 1a and the spin torque resonance frequency of the second magnetoresistive effect element 1b (at the high frequency side and the low frequency side of the above pass band) because the magnetoresistive effect device 103 includes the third magnetoresistive effect element 1c and the fourth magnetoresistive effect element 1d. As illustrated in FIG. 7, the impedance of the third magnetoresistive effect element 1c or the fourth magnetoresistive effect element 1d is sharply changed with respect to the frequency of the high-frequency signal near the spin torque resonance frequency of the third magnetoresistive effect element 1c or near the spin torque resonance frequency of the fourth magnetoresistive effect element 1d and the attenuation of the high-frequency signal is sharply changed with respect to the frequency. Accordingly, the shoulder characteristics of the pass band is made sharp. In particular, the spin torque resonance frequency (fd3) of the third magnetoresistive effect element 1c is preferably equal to an upper limit frequency of the pass band that is used and the spin torque resonance frequency (fd1) of the fourth magnetoresistive effect element 1d is preferably equal to a lower limit frequency of the pass band that is used.

As described above, the magnetoresistive effect device 103 further includes the third magnetoresistive effect element 1c including the magnetization fixed layer 2, the magnetization free layer 4, and the spacer layer 3 disposed between the magnetization fixed layer 2 and the magnetization free layer 4, in addition to the components in the magnetoresistive effect device 101. The first port 9a, the third magnetoresistive effect element 1c, and the second port 9b are connected in series to each other in this order via the signal line 7. The third magnetoresistive effect element 1c is connected to the direct-current input terminal 11 and the reference voltage terminal 20 so that one end side is at the direct-current input terminal 11 side and the other end side is at the reference voltage terminal 20 side. The first magnetoresistive effect element 1a and the third magnetoresistive effect element 1c are formed so that the relationship between the direction from one end side to the other end side and the direction from the magnetization free layer 4 to the magnetization fixed layer 2 in the first magnetoresistive effect element 1a is opposite to that in the third magnetoresistive effect element 1c. The spin torque resonance frequency of the third magnetoresistive effect element 1c is higher than the spin torque resonance frequency of the first magnetoresistive effect element 1a and the spin torque resonance frequency of the second magnetoresistive effect element 1b. The third magnetoresistive effect element 1c is formed so that the direct current input from the direct-current input terminal 11 flows through the third magnetoresistive effect element 1c in the direction from the magnetization fixed layer 2 to the magnetization free layer 4. In addition, the magnetoresistive effect device 103 further includes the fourth magnetoresistive effect element 1d including the magnetization fixed layer 2, the magnetization free layer 4, and the spacer layer 3 disposed between the magnetization fixed layer 2 and the magnetization free layer 4, in addition to the components in the magnetoresistive effect device 101. The fourth magnetoresistive effect element 1d is connected to the signal line 7 in parallel with the second port 9b. The fourth magnetoresistive effect element 1d is connected to the direct-current input terminal 11 and the reference voltage terminal 20 so that one end side is at the direct-current input terminal 11 side and the other end side is at the reference voltage terminal 20 side. The second magnetoresistive effect element 1b and the fourth magnetoresistive effect element 1d are formed so that the relationship between the direction from one end side to the other end side and the direction from the magnetization free layer 4 to the magnetization fixed layer 2 in the second magnetoresistive effect element 1b is opposite to that in the fourth magnetoresistive effect element 1d. The spin torque resonance frequency of the fourth magnetoresistive effect element 1d is lower than the spin torque resonance frequency of the first magnetoresistive effect element 1a and the spin torque resonance frequency of the second magnetoresistive effect element 1b. The fourth magnetoresistive effect element 1d is formed so that the direct current input from the direct-current input terminal 11 flows through the fourth magnetoresistive effect element 1d in the direction from the magnetization free layer 4 to the magnetization fixed layer 2.

The input of the high-frequency signal from the first port 9a into the third magnetoresistive effect element 1c and the fourth magnetoresistive effect element 1d via the signal line 7 enables the spin torque resonance to be induced in the third magnetoresistive effect element 1c and the fourth magnetoresistive effect element 1d. Due to the direct current flowing through the third magnetoresistive effect element 1c in the direction from the magnetization fixed layer 2 to the magnetization free layer 4 simultaneously with the spin torque resonance, the element impedance of the third magnetoresistive effect element 1c at a frequency that is equal to the spin torque resonance frequency of the third magnetoresistive effect element 1c or at frequencies near the spin torque resonance frequency of the third magnetoresistive effect element 1c is increased. Due to the direct current flowing through the fourth magnetoresistive effect element 1d in the direction from the magnetization free layer 4 to the magnetization fixed layer 2 simultaneously with the spin torque resonance, the element impedance of the fourth magnetoresistive effect element 1d at a frequency that is equal to the spin torque resonance frequency of the fourth magnetoresistive effect element 1d or at frequencies near the spin torque resonance frequency of the fourth magnetoresistive effect element 1d is decreased.

The series connection of the first port 9a, the third magnetoresistive effect element 1c, and the second port 9b in this order in the third magnetoresistive effect element 1c enables the high-frequency signal to be transmitted to the second port 9b side at the non-resonant frequency at which the third magnetoresistive effect element 1c is in the low impedance state and to be cut off from the second port 9b at the resonant frequency at which the third magnetoresistive effect element 1c is in the high impedance state.

The connection of the fourth magnetoresistive effect element 1d to the signal line 7 in parallel with the second port 9b enables the high-frequency signal to be transmitted to the second port 9b side at the non-resonant frequency at which the fourth magnetoresistive effect element 1d is in the high impedance state and to be cut off from the second port 9b at the resonant frequency at which the fourth magnetoresistive effect element 1d is in the low impedance state.

Since the spin torque resonance frequency of the third magnetoresistive effect element 1c is higher than the spin torque resonance frequency of the first magnetoresistive effect element 1a and the spin torque resonance frequency of the second magnetoresistive effect element 1b, the high-frequency signal is cut off from the second port 9b at the high frequency side of the spin torque resonance frequency of the first magnetoresistive effect element 1a and the spin torque resonance frequency of the second magnetoresistive effect element 1b, at which the high-frequency signal is transmitted to the second port 9b side. Since the attenuation of the high-frequency signal is sharply changed with respect to the frequency near the spin torque resonance frequency of the third magnetoresistive effect element 1c at which the high-frequency signal is cut off, the shoulder characteristics are made sharp at the high frequency side of the pass band formed near the spin torque resonance frequency of the first magnetoresistive effect element 1a and near the spin torque resonance frequency of the second magnetoresistive effect element 1b. In addition, since the spin torque resonance frequency of the fourth magnetoresistive effect element 1d is lower than the spin torque resonance frequency of the first magnetoresistive effect element 1a and the spin torque resonance frequency of the second magnetoresistive effect element 1b, the high-frequency signal is cut off from the second port 9b at the low frequency side of the spin torque resonance frequency of the first magnetoresistive effect element 1a and the spin torque resonance frequency of the second magnetoresistive effect element 1b, at which the high-frequency signal is transmitted to the second port 9b side. Since the attenuation of the high-frequency signal is sharply changed with respect to the frequency near the spin torque resonance frequency of the fourth magnetoresistive effect element 1d at which the high-frequency signal is cut off, the shoulder characteristics are made sharp at the low frequency side of the pass band formed near the spin torque resonance frequency of the first magnetoresistive effect element 1a and near the spin torque resonance frequency of the second magnetoresistive effect element 1b. In other words, the magnetoresistive effect device 103 may function as a filter having sharp shoulder characteristics of the pass band.

Although the example is described above in which the second magnetoresistive effect element 1b and the fourth magnetoresistive effect element 1d are connected to the signal line 7 between the first magnetoresistive effect element 1a and the second port 9b in parallel with the second port 9b, one of the second magnetoresistive effect element 1b and the fourth magnetoresistive effect element 1d may be connected to the signal line 7 between the first magnetoresistive effect element 1a and the first port 9a in parallel with the second port 9b. Alternatively, both the second magnetoresistive effect element 1b and the fourth magnetoresistive effect element 1d may be connected to the signal line 7 between the first magnetoresistive effect element 1a and the first port 9a in parallel with the second port 9b and the direct-current input terminal 11 may be connected to the signal line 7 between the first magnetoresistive effect element 1a and the second port 9b.

Although the example is described in the third embodiment in which the third magnetoresistive effect element 1c and the fourth magnetoresistive effect element 1d are added to the magnetoresistive effect device 101 of the first embodiment, a mode may be adopted in which the third magnetoresistive effect element 1c and the fourth magnetoresistive effect element 1d are added to the magnetoresistive effect device 102 of the second embodiment.

Fourth Embodiment

Figure 9:
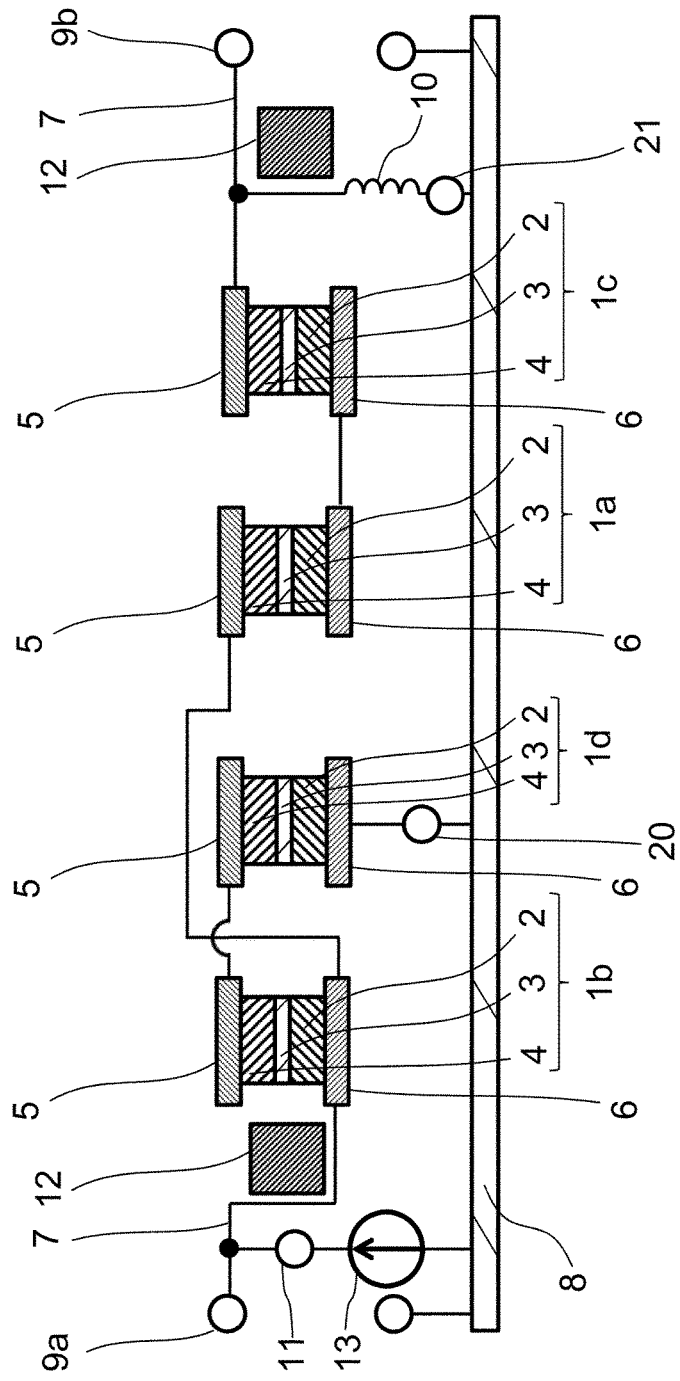
FIG. 9 is a schematic cross-sectional view of a magnetoresistive effect device according to a fourth embodiment.

FIG. 9 is a schematic cross-sectional view of a magnetoresistive effect device 104 according to a fourth embodiment of the present invention. Points different from the magnetoresistive effect device 103 of the third embodiment in the magnetoresistive effect device 104 will be mainly described and a description of common points will be appropriately omitted herein. The same reference numerals are used in the fourth embodiment to identify the same components in the third magnetoresistive effect element 1c of the third embodiment and a description of the common components will be omitted herein. The magnetoresistive effect device 104 further includes the inductor 10 and the reference voltage terminal 21, in addition to the components in the magnetoresistive effect device 103 of the third embodiment. The inductor 10 is connected to the signal line 7 between the third magnetoresistive effect element 1c and the second port 9b (one of the signal line 7 between the first magnetoresistive effect element 1a and the third magnetoresistive effect element 1c and the first port 9a and the signal line 7 between the first magnetoresistive effect element 1a and the third magnetoresistive effect element 1c and the second port 9b) in parallel with the second port 9b. The second magnetoresistive effect element 1b and the fourth magnetoresistive effect element 1d are connected to the signal line 7 between the first magnetoresistive effect element 1a and the first port 9a (the other of the signal line 7 between the first magnetoresistive effect element 1a and the third magnetoresistive effect element 1c and the first port 9a and the signal line 7 between the first magnetoresistive effect element 1a and the third magnetoresistive effect element 1c and the second port 9b) in parallel with the second port 9b (the first 9a). In other words, the second magnetoresistive effect element 1b and the fourth magnetoresistive effect element 1d are connected to the signal line 7 at the opposite side to the inductor 10 with the first magnetoresistive effect element 1a and the third magnetoresistive effect element 1c in between the second magnetoresistive effect element 1b and the fourth magnetoresistive effect element 1d and the inductor 10. The direct-current input terminal 11 is connected to the signal line 7 between the first magnetoresistive effect element 1a and the first port 9a (the other of the signal line 7 between the first magnetoresistive effect element 1a and the third magnetoresistive effect element 1c and the first port 9a and the signal line 7 between the first magnetoresistive effect element 1a and the third magnetoresistive effect element 1c and the second port 9b). In other words, the direct-current input terminal 11 is connected to the signal line 7 at the opposite side to the inductor 10 with the first magnetoresistive effect element 1a and the third magnetoresistive effect element 1c in between the direct-current input terminal 11 and the inductor 10. More specifically, the inductor 10 is connected to the signal line 7 between the third magnetoresistive effect element 1c and the second port 9b and may be connected to the ground 8 via the reference voltage terminal 21. One end (at the magnetization fixed layer 2 side) of the second magnetoresistive effect element 1b is connected to the signal line 7 between the first magnetoresistive effect element 1a and the first port 9a. The remaining configuration of the magnetoresistive effect device 104 is the same as that of the magnetoresistive effect device 103 of the third embodiment.

The first magnetoresistive effect element 1a is connected to the direct-current input terminal 11 and the reference voltage terminal 21 so that one end side (at the magnetization free layer 4 side in this example) is at the direct-current input terminal 11 side and the other end side (at the magnetization fixed layer 2 side in this example) is at the reference voltage terminal 21 side. The second magnetoresistive effect element 1b is connected to the direct-current input terminal 11 and the reference voltage terminal 20 so that one end side (at the magnetization fixed layer 2 side in this example) is at the direct-current input terminal 11 side and the other end side (at the magnetization free layer 4 side in this example) is at the reference voltage terminal 20 side. In other words, in the magnetoresistive effect device 104, the first magnetoresistive effect element 1a and the second magnetoresistive effect element 1b are formed (arranged) so that the relationship between the direction from one end side to the other end side and the direction from the magnetization free layer 4 to the magnetization fixed layer 2 in the first magnetoresistive effect element 1a is opposite to that in the second magnetoresistive effect element 1b, as in the magnetoresistive effect device 103. The third magnetoresistive effect element 1c is connected to the direct-current input terminal 11 and the reference voltage terminal 21 so that one end side (at the magnetization fixed layer 2 side in this example) is at the direct-current input terminal 11 side and the other end side (at the magnetization free layer 4 side in this example) is at the reference voltage terminal 21 side. The fourth magnetoresistive effect element 1d is connected to the direct-current input terminal 11 and the reference voltage terminal 20 so that one end side (at the magnetization free layer 4 side in this example) is at the direct-current input terminal 11 side and the other end side (at the magnetization fixed layer 2 side in this example) is at the reference voltage terminal 20 side. In other words, in the magnetoresistive effect device 104, the first magnetoresistive effect element 1a and the third magnetoresistive effect element 1c are formed (arranged) so that the relationship between the direction from one end side to the other end side and the direction from the magnetization free layer 4 to the magnetization fixed layer 2 in the first magnetoresistive effect element 1a is opposite to that in the third magnetoresistive effect element 1c, and the second magnetoresistive effect element 1b and the fourth magnetoresistive effect element 1d are formed (arranged) so that the relationship between the direction from one end side to the other end side and the direction from the magnetization free layer 4 to the magnetization fixed layer 2 in the second magnetoresistive effect element 1b is opposite to that in the fourth magnetoresistive effect element 1d, as in the magnetoresistive effect device 103.

The first magnetoresistive effect element 1a is formed (arranged) so that direct current input from the direct-current input terminal 11 flows through the first magnetoresistive effect element 1a in the direction from the magnetization free layer 4 to the magnetization fixed layer 2. The second magnetoresistive effect element 1b is formed (arranged) so that the direct current input from the direct-current input terminal 11 flows through the second magnetoresistive effect element 1b in the direction from the magnetization fixed layer 2 to the magnetization free layer 4. In other words, in the magnetoresistive effect device 104, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b, as in the magnetoresistive effect device 103. The third magnetoresistive effect element 1c is formed (arranged) so that direct current input from the direct-current input terminal 11 flows through the third magnetoresistive effect element 1c in the direction from the magnetization fixed layer 2 to the magnetization free layer 4. The fourth magnetoresistive effect element 1d is formed (arranged) so that the direct current input from the direct-current input terminal 11 flows through the fourth magnetoresistive effect element 1d in the direction from the magnetization free layer 4 to the magnetization fixed layer 2. In other words, in the magnetoresistive effect device 104, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the third magnetoresistive effect element 1c and the order of arrangement of the magnetization fixed layer 2, the spacer layer 3, and the magnetization free layer 4 in the third magnetoresistive effect element 1c, and the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b is opposite to the relationship between the direction of the direct current flowing through the fourth magnetoresistive effect element 1d and the order of arrangement of the magnetization fixed layer 2, the spacer layer 3, and the magnetization free layer 4 in the fourth magnetoresistive effect element 1*d*, as in the magnetoresistive effect device 103.

The direct-current source 13 is connected to the ground 8 and the direct-current input terminal 11. When the magnetoresistive effect device 104 is connected to the ground 8, a closed circuit including the first magnetoresistive effect element 1*a*, the third magnetoresistive effect element 1*c*, the signal line 7, the inductor 10, the ground 8, and the direct-current input terminal 11 is capable of being formed. In addition, when the magnetoresistive effect device 104 is connected to the ground 8, a closed circuit including the second magnetoresistive effect element 1*b*, the fourth magnetoresistive effect element 1*d*, the signal line 7, the ground 8, and the direct-current input terminal 11 is capable of being formed.

The inductor 10 is connected between the signal line 7 and the ground 8 and has a function to cut off high-frequency components of the current and pass direct-current components of the current with its inductance component, as described above in the second embodiment. The use of the inductor 10 enables the direct current applied from the direct-current input terminal 11 to flow through the closed circuit including the first magnetoresistive effect element 1*a*, the third magnetoresistive effect element 1*c*, the signal line 7, the inductor 10, the ground 8, and the direct-current input terminal 11 without degrading the characteristics of the high-frequency signal passing through the first magnetoresistive effect element 1*a* and the third magnetoresistive effect element 1*c*.

The magnetoresistive effect device 104 is capable of having the frequency characteristics as a high-frequency filter, like the magnetoresistive effect device 103 of the third embodiment.

The example is described in the third embodiment and the fourth embodiment in which the spin torque resonance frequency of the third magnetoresistive effect element 1*c* is higher than the spin torque resonance frequency of the first magnetoresistive effect element 1*a* and the spin torque resonance frequency of the second magnetoresistive effect element 1*b* and the spin torque resonance frequency of the fourth magnetoresistive effect element 1*d* is lower than the spin torque resonance frequency of the first magnetoresistive effect element 1*a* and the spin torque resonance frequency of the second magnetoresistive effect element 1*b*. However, the spin torque resonance frequency of the third magnetoresistive effect element 1*c* may be lower than the spin torque resonance frequency of the first magnetoresistive effect element 1*a* and the spin torque resonance frequency of the second magnetoresistive effect element 1*b* and the spin torque resonance frequency of the fourth magnetoresistive effect element 1*d* may be higher than the spin torque resonance frequency of the first magnetoresistive effect element 1*a* and the spin torque resonance frequency of the second magnetoresistive effect element 1*b*. In this case, since the attenuation of the high-frequency signal is sharply changed with respect to the frequency near the spin torque resonance frequency of the third magnetoresistive effect element 1*c* at which the high-frequency signal is cut off, the shoulder characteristics are made sharp at the low frequency side of the pass band formed near the spin torque resonance frequency of the first magnetoresistive effect element 1*a* and near the spin torque resonance frequency of the second magnetoresistive effect element 1*b*. In addition, since the attenuation of the high-frequency signal is sharply changed with respect to the frequency near the spin torque resonance frequency of the fourth magnetoresistive effect element 1*d* at which the high-frequency signal is cut off, the shoulder characteristics are made sharp at the high frequency side of the pass band formed near the spin torque resonance frequency of the first magnetoresistive effect element 1*a* and near the spin torque resonance frequency of the second magnetoresistive effect element 1*b*. In this case, the spin torque resonance frequency (fd3) of the third magnetoresistive effect element 1*c* is preferably equal to the lower limit frequency of the pass band that is used and the spin torque resonance frequency (fd1) of the fourth magnetoresistive effect element 1*d* is preferably equal to the upper limit frequency of the pass band that is used.

Although the example is described in the third embodiment and the fourth embodiment in which the first magnetoresistive effect element 1*a* is connected in series to the third magnetoresistive effect element 1*c*, the first magnetoresistive effect element 1*a* may be connected in parallel to the third magnetoresistive effect element 1*c*. The magnetoresistive effect device in this case is also capable of having the frequency characteristics as a high-frequency filter, like the magnetoresistive effect device 103 of the third embodiment, because of the series connection of the first port 9*a*, the first magnetoresistive effect element 1*a*, and the second port 9*b* in this order and the series connection of the first port 9*a*, the third magnetoresistive effect element 1*c*, and the second port 9*b* in this order.

Similarly, although the example is described in the third embodiment and the fourth embodiment in which the second magnetoresistive effect element 1*b* is connected in series to the fourth magnetoresistive effect element 1*d*, the second magnetoresistive effect element 1*b* may be connected in parallel to the fourth magnetoresistive effect element 1*d*. The magnetoresistive effect device in this case is also capable of having the frequency characteristics as a high-frequency filter, like the magnetoresistive effect device 103 of the third embodiment, because of the connection of the second magnetoresistive effect element 1*b* to the signal line 7 in parallel with the second port 9*b* and the connection of the fourth magnetoresistive effect element 1*d* to the signal line 7 in parallel with the second port 9*b*.

Fifth Embodiment

Figure 10:
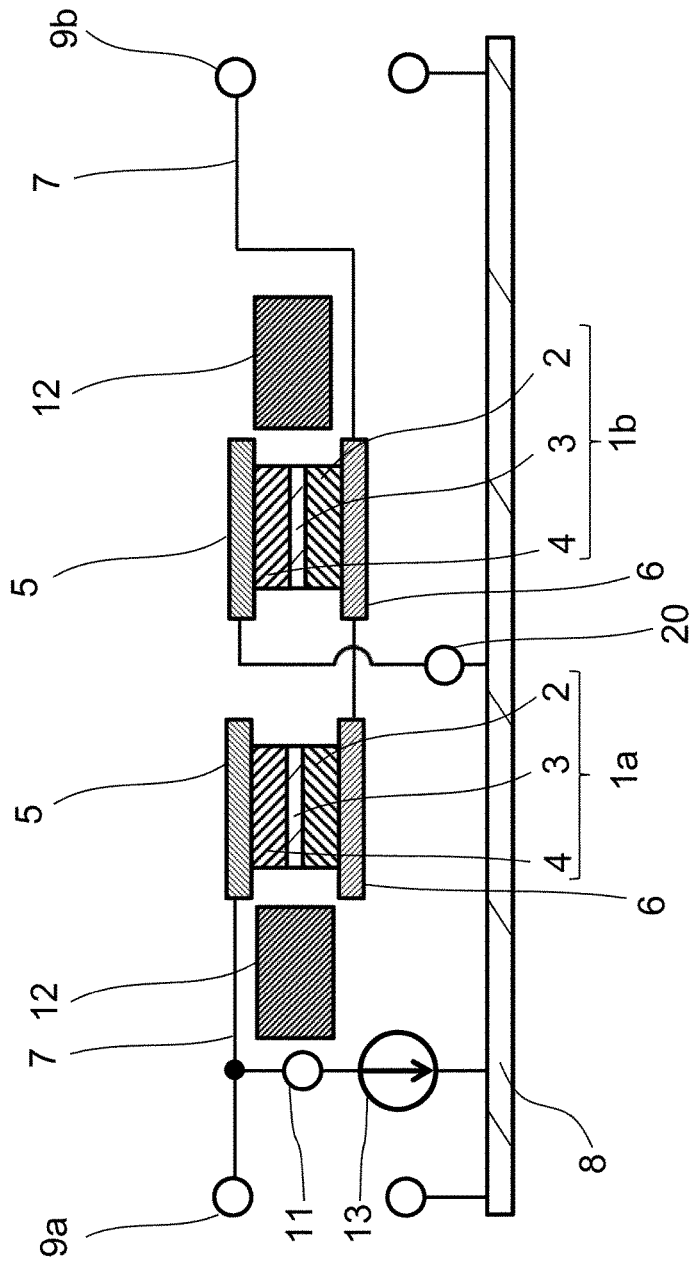
FIG. 10 is a schematic cross-sectional view of a magnetoresistive effect device according to a fifth embodiment.

FIG. 10 is a schematic cross-sectional view of a magnetoresistive effect device 105 according to a fifth embodiment of the present invention. Points different from the magnetoresistive effect device 101 of the first embodiment in the magnetoresistive effect device 105 will be mainly described and a description of common points will be appropriately omitted herein. The same reference numerals are used in the fifth embodiment to identify the same components in the magnetoresistive effect device 101 of the first embodiment and a description of the common components will be omitted herein. The magnetoresistive effect device 105 differs from the magnetoresistive effect device 101 of the first embodiment in the direction of the direct current flowing through the first magnetoresistive effect element 1*a* and the direction of the direct current flowing through the second magnetoresistive effect element 1*b*. In the magnetoresistive effect device 105, the first magnetoresistive effect element 1*a* is formed (arranged) so that the direct current input from the direct-current input terminal 11 flows through the first magnetoresistive effect element 1*a* in the direction from the magnetization fixed layer 2 to the magnetization free layer 4 and the second magnetoresistive effect element 1*b* is formed (arranged) so that the direct current input from the direct-current input terminal 11 flows through the second magnetoresistive effect element 1*b* in the direction from the magnetization free layer 4 to the magnetization fixed layer 2. The remaining configuration of the magnetoresistive effect device 105 is the same as that of the magnetoresistive effect device 101 of the first embodiment.

Upon input of the high-frequency signal having a frequency equal to the spin torque resonance frequency into first magnetoresistive effect element 1a while applying the direct current flowing through the first magnetoresistive effect element 1a in the direction from the magnetization fixed layer 2 to the magnetization free layer 4 to the first magnetoresistive effect element 1a, the resistance value of first magnetoresistive effect element 1a varies with a fixed cycle at the spin torque resonance frequency out of phase with the input high-frequency signal by 180 degrees and the impedance for the high-frequency signal is increased. In other words, in the magnetoresistive effect device 105, the first magnetoresistive effect element 1a is capable of being considered as a resistance element in which the impedance of the high-frequency signal is increased at the spin torque resonance frequency due to the spin torque resonance phenomenon.

Upon input of the high-frequency signal having a frequency equal to the spin torque resonance frequency into second magnetoresistive effect element 1b while applying the direct current flowing through the second magnetoresistive effect element 1b in the direction from the magnetization free layer 4 to the magnetization fixed layer 2 to the second magnetoresistive effect element 1b, the resistance value of second magnetoresistive effect element 1b varies with a fixed cycle at the spin torque resonance frequency in phase with the input high-frequency signal and the impedance for the high-frequency signal is decreased. In other words, in the magnetoresistive effect device 105, the second magnetoresistive effect element 1b is capable of being considered as a resistance element in which the impedance of the high-frequency signal is decreased at the spin torque resonance frequency due to the spin torque resonance phenomenon.

Due to the spin torque resonance phenomenon, it is difficult to supply the frequency components that coincide with the spin torque resonance frequency of the first magnetoresistive effect element 1a or that are near the spin torque resonance frequency of the first magnetoresistive effect element 1a, among the high-frequency components of the high-frequency signal input through the first port 9a, to the second port 9b due to the first magnetoresistive effect element 1a in the high impedance state. In contrast, the frequency components that are not near the spin torque resonance frequency of the first magnetoresistive effect element 1a, among the high-frequency components of the high-frequency signal input through the first port 9a, pass through the first magnetoresistive effect element 1a in the low impedance state and it is easy to supply the frequency components to the second port 9b.

In addition, due to the spin torque resonance phenomenon, the frequency components that coincide with the spin torque resonance frequency of the second magnetoresistive effect element 1b or that are near the spin torque resonance frequency of the second magnetoresistive effect element 1b, among the high-frequency components of the high-frequency signal that has passed through the first magnetoresistive effect element 1a, pass through the second magnetoresistive effect element 1b, which is connected in parallel to the second port 9b and which is in the low impedance state, and flows into the ground 8, and it is difficult to supply the frequency components to the second port 9b. In contrast, the frequency components that are not near the spin torque resonance frequency of the second magnetoresistive effect element 1b, among the high-frequency components of the high-frequency signal that has passed through the first magnetoresistive effect element 1a, are cut off from the ground 8 by the second magnetoresistive effect element 1b which is connected in parallel to the second port 9b and which is in the high impedance state, and it is easy to supply the frequency components to the second port 9b.

As described above, the magnetoresistive effect device 105 is capable of having the function of a high-frequency filter having a cutoff frequency band of frequencies near the spin torque resonance frequency of the first magnetoresistive effect element 1a and frequencies near the spin torque resonance frequency of the second magnetoresistive effect element 1b. In other words, the magnetoresistive effect device 105 functions as a band elimination filter.

In the magnetoresistive effect device 105, the impedance of the high-frequency signal having the non-resonant frequency of the first magnetoresistive effect element 1a (that is, the resistance value of the first magnetoresistive effect element 1a) is preferably low while the impedance of the high-frequency signal having the non-resonant frequency of the second magnetoresistive effect element 1b (that is, the resistance value of the second magnetoresistive effect element 1b) is preferably high. In other words, the impedance of the high-frequency signal having the non-resonant frequency of the first magnetoresistive effect element 1a (that is, the resistance value of the first magnetoresistive effect element 1a) is preferably lower than the impedance of the high-frequency signal having the non-resonant frequency of the second magnetoresistive effect element 1b (that is, the resistance value of the second magnetoresistive effect element 1b). For example, such relationship of the impedance (or the resistance value) is realized by making the cross-sectional area of a cross section perpendicular to the path of the high-frequency signal in the first magnetoresistive effect element 1a greater than the cross-sectional area of a cross section perpendicular to the path of the high-frequency signal in the second magnetoresistive effect element 1b.

Furthermore, in the magnetoresistive effect device 105, the spin torque resonance frequency of the first magnetoresistive effect element 1a is equal to the spin torque resonance frequency of the second magnetoresistive effect element 1b. In this case, since the combined impedance of the first magnetoresistive effect element 1a and the second magnetoresistive effect element 1b at the frequency equal to the spin torque resonance frequency of the first magnetoresistive effect element 1a and the second magnetoresistive effect element 1b is increased (the high-frequency signal input through the first port 9a is capable of being doubly cut off at the spin torque resonance frequency of the first magnetoresistive effect element 1a and the second magnetoresistive effect element 1b), the magnetoresistive effect device 105 may function as a high-frequency filter having excellent cutoff characteristics and a wide range of the bandpass characteristics and the cutoff characteristics.

Figure 11:
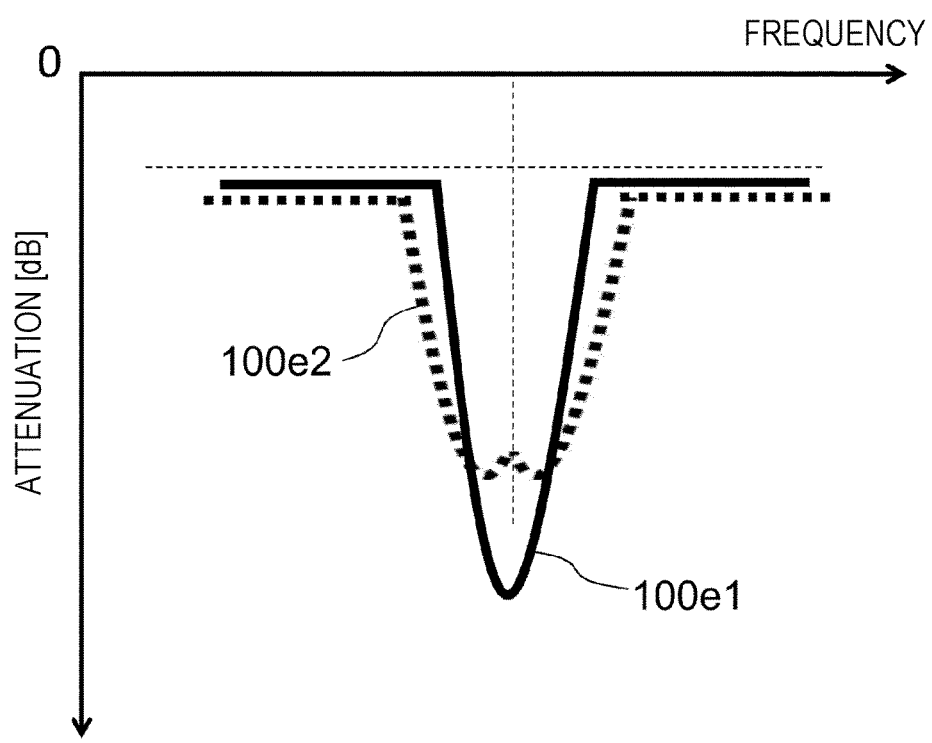
FIG. 11 is a graph illustrating the relationship between frequency and attenuation in the magnetoresistive effect device according to the fifth embodiment.

FIG. 11 is a graph illustrating the relationship between the frequency of the high-frequency signal input into the magnetoresistive effect device 105 and the attenuation. Referring to FIG. 11, the vertical axis represents attenuation and the horizontal axis represents frequency. FIG. 11 is a graph when a constant magnetic field is applied to the first magnetoresistive effect element 1a and the second magnetoresistive effect element 1b and constant direct current is applied to the first magnetoresistive effect element 1a and the second magnetoresistive effect element 1b. Referring to FIG. 11, a plot line 100e1 represents the relationship between the frequency of the high-frequency signal and the attenuation when the spin torque resonance frequency of the first magnetoresistive effect element 1a is equal to the spin torque resonance frequency of the second magnetoresistive effect element 1b. A plot line 100e2 represents the relationship between the frequency of the high-frequency signal and the attenuation when the spin torque resonance frequency of the first magnetoresistive effect element 1a is different from the spin torque resonance frequency of the second magnetoresistive effect element 1b.

For example, when the spin torque resonance frequency of the first magnetoresistive effect element 1a is equal to the spin torque resonance frequency of the second magnetoresistive effect element 1b, the combined impedance of the first magnetoresistive effect element 1a and the second magnetoresistive effect element 1b at the frequency equal to the spin torque resonance frequency of the first magnetoresistive effect element 1a and the second magnetoresistive effect element 1b is increased, compared with the case in which the spin torque resonance frequency of the first magnetoresistive effect element 1a is different from the spin torque resonance frequency of the second magnetoresistive effect element 1b, as illustrated in FIG. 11. Accordingly, the cutoff characteristics of the magnetoresistive effect device 105 for the high-frequency signal having the frequency equal to the spin torque resonance frequency are improved (the absolute value of the attenuation is increased).

Figure 12:
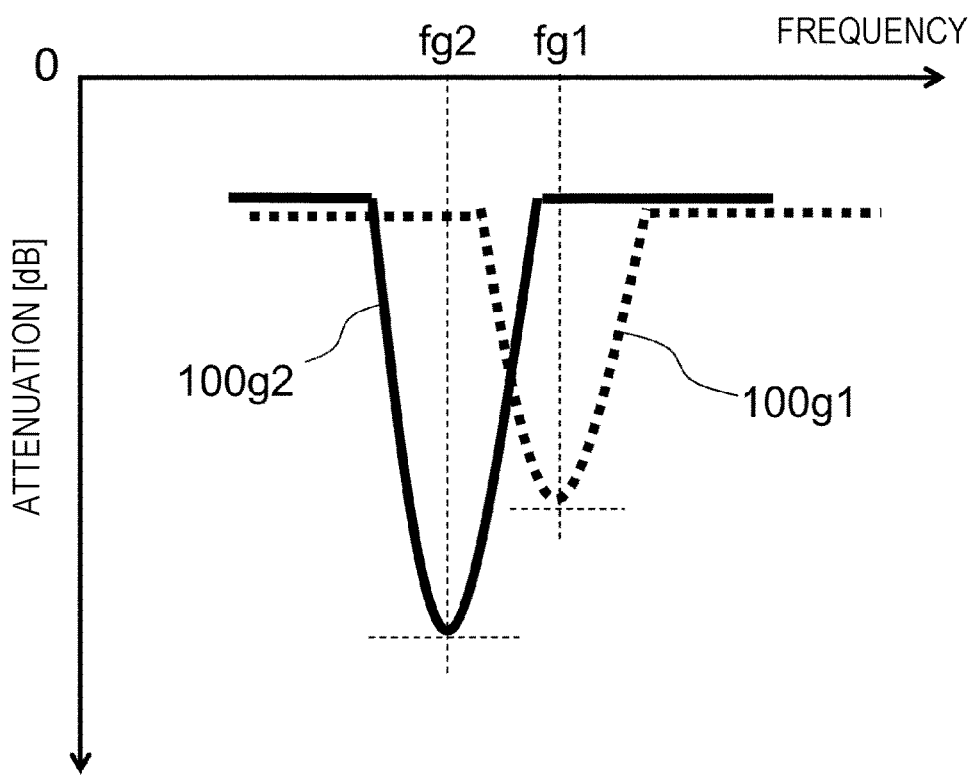
FIG. 12 is a graph illustrating the relationship between frequency and attenuation for direct current in the magnetoresistive effect device according to the fifth embodiment.
Figure 13:
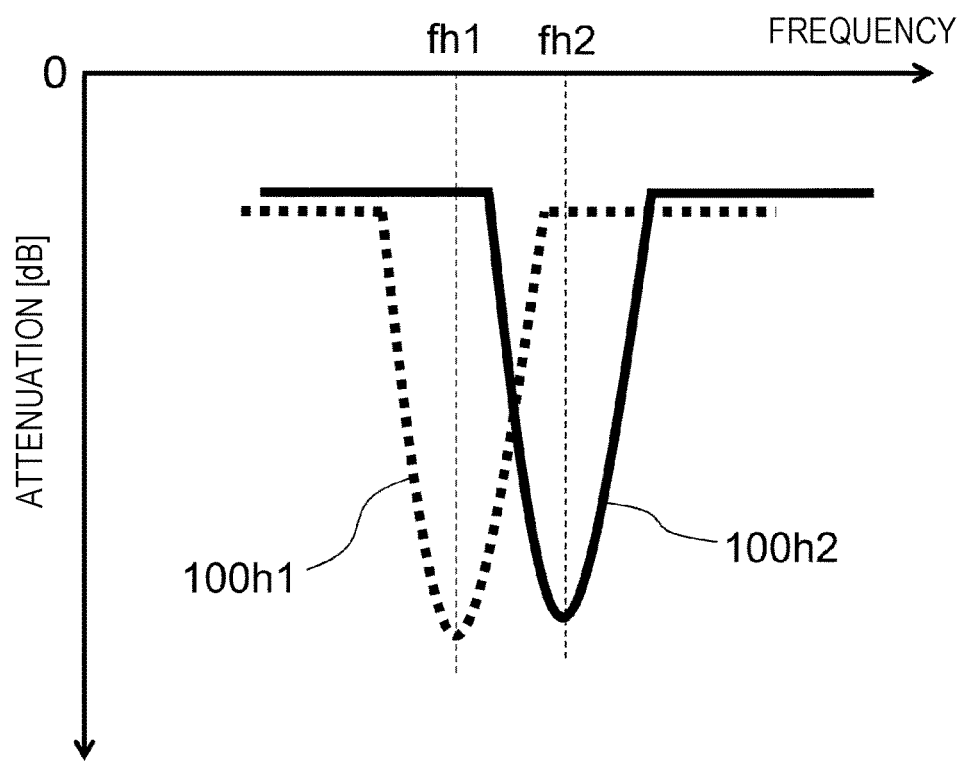
FIG. 13 is a graph illustrating the relationship between frequency and attenuation for the strength of a magnetic field in the magnetoresistive effect device according to the fifth embodiment.

FIG. 12 and FIG. 13 are graphs each illustrating the relationship between the frequency of the high-frequency signal input into the magnetoresistive effect device 105 and the attenuation. Referring to FIG. 12 and FIG. 13, the vertical axis represents attenuation and the horizontal axis represents frequency. FIG. 12 is a graph when a constant magnetic field is applied to the first magnetoresistive effect element 1a and the second magnetoresistive effect element 1b. Referring to FIG. 12, a plot line 100g1 represents the relationship between the frequency of the high-frequency signal and the attenuation when the direct current applied from the direct-current input terminal 11 to the first magnetoresistive effect element 1a and the second magnetoresistive effect element 1b has a value of Ig1 and a plot line 100g2 represents the relationship between the frequency of the high-frequency signal and the attenuation when the direct current applied from the direct-current input terminal 11 to the first magnetoresistive effect element 1a and the second magnetoresistive effect element 1b has a value of Ig2. The relationship between the applied direct current values is Ig1<Ig2. FIG. 13 is a graph when constant direct current is applied to the first magnetoresistive effect element 1a and the second magnetoresistive effect element 1b. Referring to FIG. 13, a plot line 100h1 represents the relationship between the frequency of the high-frequency signal and the attenuation when the magnetic field applied from the magnetic-field applying mechanism 12 to the first magnetoresistive effect element 1a and the second magnetoresistive effect element 1b has a strength of Hh1 and a plot line 100h2 represents the relationship between the frequency of the high-frequency signal and the attenuation when the magnetic field applied from the magnetic-field applying mechanism 12 to the first magnetoresistive effect element 1a and the second magnetoresistive effect element 1b has a strength of Hh2. The relationship between the strengths of the magnetic fields is Hh1<Hh2.

For example, when the value of the direct current applied from the direct-current input terminal 11 to the first magnetoresistive effect element 1a and the second magnetoresistive effect element 1b is increased from Ig1 to Ig2 in the case in which the spin torque resonance frequency of the first magnetoresistive effect element 1a is equal to the spin torque resonance frequency of the second magnetoresistive effect element 1b, as illustrated in FIG. 12, the amount of change in element impedance in each of the first magnetoresistive effect element 1a and the second magnetoresistive effect element 1b at the frequencies near the spin torque resonance frequency of the first magnetoresistive effect element 1a and the second magnetoresistive effect element 1b (the frequencies in the cutoff frequency band) is increased with the variation in the current value. As a result, the high-frequency signal output from the second port 9b is further decreased in strength to increase the passband loss. Accordingly, the magnetoresistive effect device 105 is capable of realizing a high-frequency filter having a wide range of the cut-off characteristics and the bandpass characteristics. In response to the increase of the direct current value from Ig1 to Ig2, the spin torque resonance frequency of the first magnetoresistive effect element 1a and the second magnetoresistive effect element 1b is shifted from fg1 to fg2. Specifically, the cutoff frequency band is shifted toward low frequencies. Thus, the magnetoresistive effect device 105 may function as a high-frequency filter capable of varying the frequencies of the cutoff frequency band.

In addition, for example, when the strength of the magnetic field applied from the magnetic-field applying mechanism 12 is increased from Hh1 to Hh2 in the case in which the spin torque resonance frequency of the first magnetoresistive effect element 1a is equal to the spin torque resonance frequency of the second magnetoresistive effect element 1b, as illustrated in FIG. 13, the spin torque resonance frequency of the first magnetoresistive effect element 1a and the second magnetoresistive effect element 1b is shifted from fh1 to fh2. Specifically, the cutoff frequency band is shifted toward high frequencies. The cutoff frequency band is capable of being greatly shifted when the strength of the magnetic field (the effective magnetic field $H_{eff}$ in the magnetization free layer 4) is varied, compared with the case in which the direct current value is varied. In other words, the magnetoresistive effect device 105 may function as a high-frequency filter capable of varying the frequencies of the cutoff frequency band.

As described above, the magnetoresistive effect device 105 includes the first magnetoresistive effect element 1a, the second magnetoresistive effect element 1b, the first port 9a through which a high-frequency signal is input, the second port 9b through which a high-frequency signal is output, the signal line 7, and the direct-current input terminal 11. The first port 9a, the first magnetoresistive effect element 1a, and the second port 9b are connected in series to each other in this order via the signal line 7. The second magnetoresistive effect element 1b is connected to the signal line 7 in parallel with the second port 9b. Each of the first magnetoresistive effect element 1a and the second magnetoresistive effect element 1b includes the magnetization fixed layer 2, the magnetization free layer 4, and the spacer layer 3 disposed between the magnetization fixed layer 2 and the magnetization free layer 4. The first magnetoresistive effect element 1a and the second magnetoresistive effect element 1b are connected to the direct-current input terminal 11 and the reference voltage terminal 20 so that one end side of each of the first magnetoresistive effect element 1a and the second magnetoresistive effect element 1b is at the direct-current input terminal 11 side and the other end side thereof is at the reference voltage terminal 20 side. The first magnetoresistive effect element 1a and the second magnetoresistive effect element 1b are formed so that the relationship between the direction from one end side to the other end side and the direction from the magnetization free layer 4 to the magnetization fixed layer 2 in the first magnetoresistive effect element 1a is opposite to that in the second magnetoresistive effect element 1b. The first magnetoresistive effect element 1a is formed so that the direct current input from the direct-current input terminal 11 flows through the first magnetoresistive effect element 1a in the direction from the magnetization fixed layer 2 to the magnetization free layer 4 and the second magnetoresistive effect element 1b is formed so that the direct current input from the direct-current input terminal 11 flows through the second magnetoresistive effect element 1b in the direction from the magnetization free layer 4 to the magnetization fixed layer 2.

Accordingly, the input of the high-frequency signal from the first port 9a into the first magnetoresistive effect element 1a and the second magnetoresistive effect element 1b via the signal line 7 enables the spin torque resonance to be induced in the first magnetoresistive effect element 1a and the second magnetoresistive effect element 1b. Due to the direct current flowing through the first magnetoresistive effect element 1a in the direction from the magnetization fixed layer 2 to the magnetization free layer 4 simultaneously with the spin torque resonance, the first magnetoresistive effect element 1a is capable of being considered as an element the resistance value of which oscillates with a fixed cycle at a frequency corresponding to the spin torque resonance frequency out of phase with the high-frequency signal input through the first port 9a by 180 degrees. With this effect, the element impedance of the first magnetoresistive effect element 1a at a frequency equal to the spin torque resonance frequency of the first magnetoresistive effect element 1a is increased. Due to the direct current flowing through the second magnetoresistive effect element 1b in the direction from the magnetization free layer 4 to the magnetization fixed layer 2 simultaneously with the spin torque resonance, the second magnetoresistive effect element 1b is capable of being considered as an element the resistance value of which oscillates with a fixed cycle at a frequency corresponding to the spin torque resonance frequency in phase with the high-frequency signal input through the first port 9a. With this effect, the element impedance of the second magnetoresistive effect element 1b at a frequency equal to the spin torque resonance frequency of the second magnetoresistive effect element 1b is decreased. The series connection of the first port 9a, the first magnetoresistive effect element 1a, and the second port 9b in this order enables the high-frequency signal to be transmitted to the second port 9b side at the non-resonant frequency at which the first magnetoresistive effect element 1a is in the low impedance state and to be cut off from the second port 9b side at the resonant frequency at which the first magnetoresistive effect element 1a is in the high impedance state. The connection of the second magnetoresistive effect element 1b to the signal line 7 in parallel with the second port 9b enables the high-frequency signal to be transmitted to the second port 9b side at the non-resonant frequency at which the second magnetoresistive effect element 1b is in the high impedance state and to be cut off from the second port 9b at the resonant frequency at which the second magnetoresistive effect element 1b is in the low impedance state. In other words, the magnetoresistive effect device 105 is capable of having frequency characteristics as a high-frequency filter.

In addition, since the spin torque resonance frequency of the first magnetoresistive effect element 1a is equal to the spin torque resonance frequency of the second magnetoresistive effect element 1b in the magnetoresistive effect device 105, the combined impedance of the first magnetoresistive effect element 1a and the second magnetoresistive effect element 1b at the frequency equal to the spin torque resonance frequency of the first magnetoresistive effect element 1a and the second magnetoresistive effect element 1b is increased. Accordingly, the magnetoresistive effect device 105 may function as a high-frequency filter having excellent cutoff characteristics and a wide range of the bandpass characteristics and the cutoff characteristics.

Also in the magnetoresistive effect device 105, the second magnetoresistive effect element 1b may be connected to the signal line 7 between the first magnetoresistive effect element 1a and the first port 9a in parallel with the second port 9b and the direct-current input terminal 11 may be connected to the signal line 7 between the first magnetoresistive effect element 1a and the second port 9b, as in the magnetoresistive effect device 101 of the first embodiment.

Although the example is described above in which the spin torque resonance frequency of the first magnetoresistive effect element 1a is equal to the spin torque resonance frequency of the second magnetoresistive effect element 1b in the magnetoresistive effect device 105, the spin torque resonance frequency of the first magnetoresistive effect element 1a may be different from the spin torque resonance frequency of the second magnetoresistive effect element 1b in the magnetoresistive effect device 105, as in the first embodiment.

When the spin torque resonance frequency of the first magnetoresistive effect element 1a is different from the spin torque resonance frequency of the second magnetoresistive effect element 1b, the frequencies near the spin torque resonance frequency of the first magnetoresistive effect element 1a and the frequencies near the spin torque resonance frequency of the second magnetoresistive effect element 1b are across a wide range, as illustrated by the plot line 100e2 in FIG. 11. As a result, the cutoff frequency band in which the high-frequency signal is cut off from the second port is across a wide range. In other words, the magnetoresistive effect device 105 may function as a high-frequency filter having a wide cutoff frequency band in this case.

Sixth Embodiment

Figure 14:
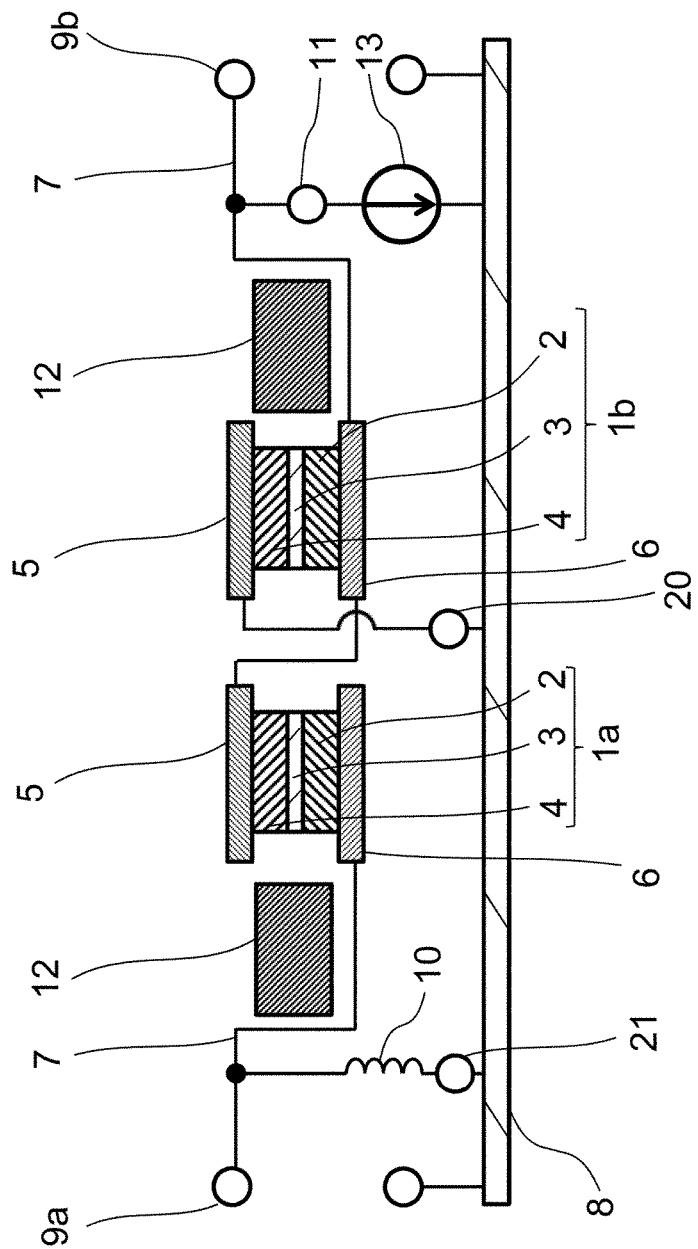
FIG. 14 is a schematic cross-sectional view of a magnetoresistive effect device according to a sixth embodiment.

FIG. 14 is a schematic cross-sectional view of a magnetoresistive effect device 106 according to a sixth embodiment of the present invention. Points different from the magnetoresistive effect device 105 of the fifth embodiment in the magnetoresistive effect device 106 will be mainly described and a description of common points will be appropriately omitted herein. The same reference numerals are used in the sixth embodiment to identify the same components in the magnetoresistive effect device 105 of the fifth embodiment and a description of the common components will be omitted herein. The magnetoresistive effect device 106 further includes the inductor 10 and the reference voltage terminal 21, in addition to the components in the magnetoresistive effect device 105 of the fifth embodiment. The inductor 10 is connected to the signal line 7 between the first magnetoresistive effect element 1a and the first port 9a (one of the signal line 7 between the first magnetoresistive effect element 1a and the first port 9a and the signal line 7 between the first magnetoresistive effect element 1a and the second port 9b) in parallel with the second port 9b. The second magnetoresistive effect element 1b is connected to the signal line 7 between the first magnetoresistive effect element 1a and the second port 9b (the other of the signal line 7 between the first magnetoresistive effect element 1a and the first port 9a and the signal line 7 between the first magnetoresistive effect element 1a and the second port 9b) in parallel with the second port 9b. In other words, the second magnetoresistive effect element 1b is connected to the signal line 7 at the opposite side to the inductor 10 with the first magnetoresistive effect element 1a in between the second magnetoresistive effect element 1b and the inductor 10. The direct-current input terminal 11 is connected to the signal line 7 between the first magnetoresistive effect element 1a and the second port 9b (the other of the signal line 7 between the first magnetoresistive effect element 1a and the first port 9a and the signal line 7 between the first magnetoresistive effect element 1a and the second port 9b). In other words, the direct-current input terminal 11 is connected to the signal line 7 at the opposite side to the inductor 10 with the first magnetoresistive effect element 1a in between the direct-current input terminal 11 and the inductor 10. More specifically, the inductor 10 is connected to the signal line 7 between the first magnetoresistive effect element 1a and the first port 9a and may be connected to the ground 8 via the reference voltage terminal 21. One end (at the magnetization fixed layer 2 side) of the second magnetoresistive effect element 1b is connected to the signal line 7 between the first magnetoresistive effect element 1a and the second port 9b, the other end (at the magnetization free layer 4 side) of the second magnetoresistive effect element 1b may be connected to the ground 8 via the reference voltage terminal 20, and the direct-current input terminal 11 is connected to the signal line 7 between the first magnetoresistive effect element 1a and the second port 9b. The first magnetoresistive effect element 1a is connected to the signal line 7 so that the magnetization fixed layer 2 side is at the first port 9a side. The first magnetoresistive effect element 1a is formed (arranged) so that the direct current input from the direct-current input terminal 11 flows through the first magnetoresistive effect element 1a in the direction from the magnetization fixed layer 2 to the magnetization free layer 4. The remaining configuration of the magnetoresistive effect device 106 is the same as that of the magnetoresistive effect device 105 of the fifth embodiment.

The first magnetoresistive effect element 1a is connected to the direct-current input terminal 11 and the reference voltage terminal 21 so that one end side (at the magnetization free layer 4 side in this example) is at the direct-current input terminal 11 side and the other end side (at the magnetization fixed layer 2 side in this example) is at the reference voltage terminal 21 side. The second magnetoresistive effect element 1b is connected to the direct-current input terminal 11 and the reference voltage terminal 20 so that one end side (at the magnetization fixed layer 2 side in this example) is at the direct-current input terminal 11 side and the other end side (at the magnetization free layer 4 side in this example) is at the reference voltage terminal 20 side. In other words, in the magnetoresistive effect device 106, the first magnetoresistive effect element 1a and the second magnetoresistive effect element 1b are formed (arranged) so that the relationship between the direction from one end side to the other end side and the direction from the magnetization free layer 4 to the magnetization fixed layer 2 in the first magnetoresistive effect element 1a is opposite to that in the second magnetoresistive effect element 1b, as in the magnetoresistive effect device 105.

The first magnetoresistive effect element 1a is formed (arranged) so that the direct current input from the direct-current input terminal 11 flows through the first magnetoresistive effect element 1a in the direction from the magnetization fixed layer 2 to the magnetization free layer 4. The second magnetoresistive effect element 1b is formed (arranged) so that the direct current input from the direct-current input terminal 11 flows through the second magnetoresistive effect element 1b in the direction from the magnetization free layer 4 to the magnetization fixed layer 2. In other words, in the magnetoresistive effect device 106, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b, as in the magnetoresistive effect device 105.

The direct-current source 13 is connected to the ground 8 and the direct-current input terminal 11. When the magnetoresistive effect device 106 is connected to the ground 8, a closed circuit including the first magnetoresistive effect element 1a, the signal line 7, the inductor 10, the ground 8, and the direct-current input terminal 11 is capable of being formed. In addition, when the magnetoresistive effect device 106 is connected to the ground 8, a closed circuit including the second magnetoresistive effect element 1b, the signal line 7, the ground 8, and the direct-current input terminal 11 is capable of being formed.

The inductor 10 is connected between the signal line 7 and the ground 8 and has a function to cut off high-frequency components of the current and pass direct-current components of the current with its inductance component. The inductor 10 may be a chip inductor or an inductor composed of a pattern line. Alternatively, the inductor 10 may be a resistance element having an inductance component. The inductor 10 preferably has an inductance value of 10 nH or more. The use of the inductor 10 enables the direct current applied from the direct-current input terminal 11 to flow through the closed circuit including the first magnetoresistive effect element 1a, the signal line 7, the inductor 10, the ground 8, and the direct-current input terminal 11 without degrading the characteristics of the high-frequency signal passing through the first magnetoresistive effect element 1a.

The magnetoresistive effect device 106 is capable of having the frequency characteristics as a high-frequency filter, like the magnetoresistive effect device 105 of the fifth embodiment.

Seventh Embodiment

Figure 15:
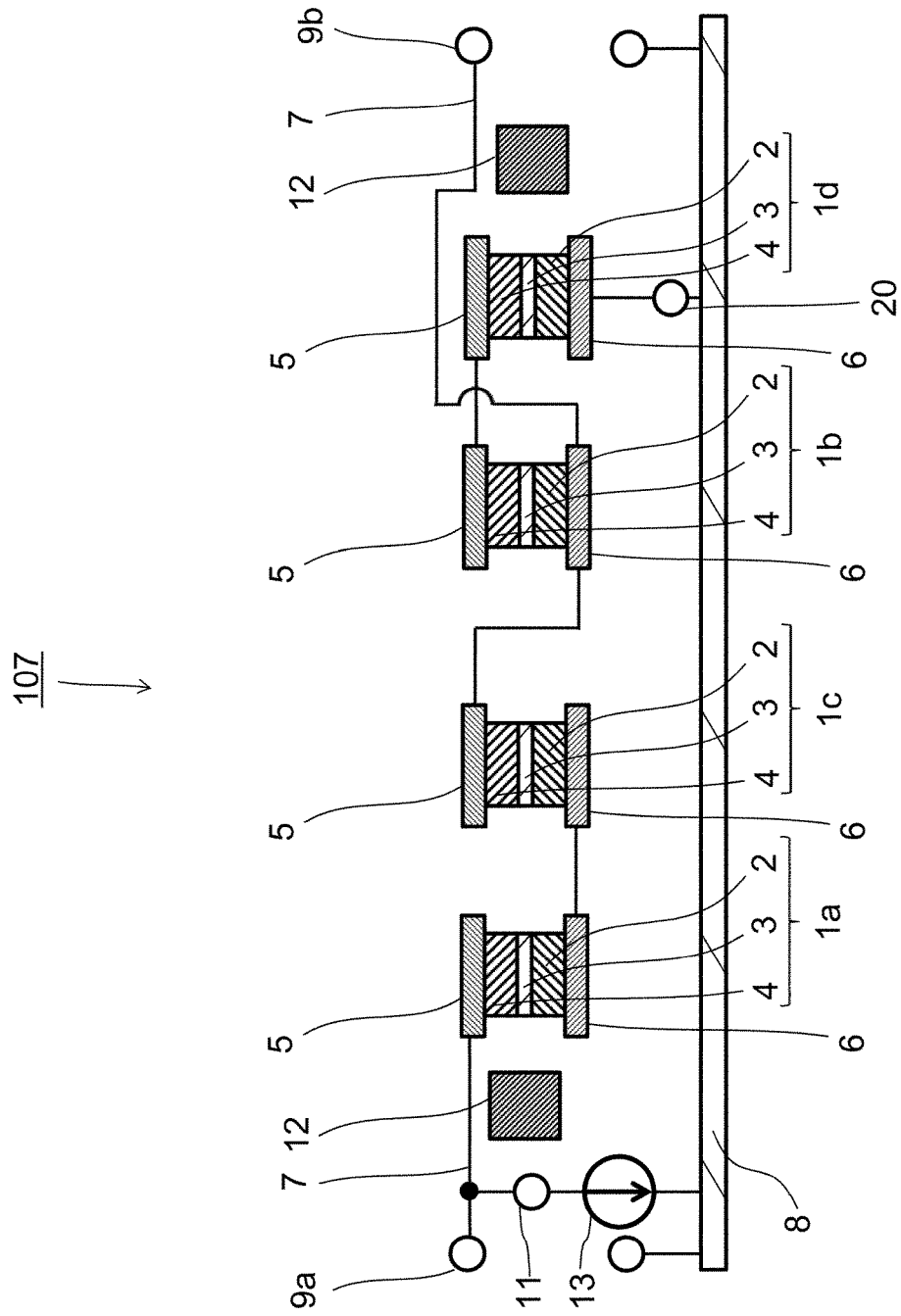
FIG. 15 is a schematic cross-sectional view of a magnetoresistive effect device according to a seventh embodiment.

FIG. 15 is a schematic cross-sectional view of a magnetoresistive effect device 107 according to a seventh embodiment of the present invention. Points different from the magnetoresistive effect device 105 of the fifth embodiment in the magnetoresistive effect device 107 will be mainly described and a description of common points will be appropriately omitted herein. The same reference numerals are used in the seventh embodiment to identify the same components in the magnetoresistive effect device 105 of the fifth embodiment and a description of the common components will be omitted herein. The magnetoresistive effect device 107 further includes the third magnetoresistive effect element 1c and the fourth magnetoresistive effect element 1d, in addition to the components in the magnetoresistive effect device 105 of the fifth embodiment. The third magnetoresistive effect element 1c includes the magnetization fixed layer 2 (the third magnetization fixed layer), the magnetization free layer 4 (the third magnetization free layer), and the spacer layer 3 (the third spacer layer) disposed between the magnetization fixed layer 2 and the magnetization free layer 4. The fourth magnetoresistive effect element 1d includes the magnetization fixed layer 2

(the fourth magnetization fixed layer), the magnetization free layer 4 (the fourth magnetization free layer), and the spacer layer 3 (the fourth spacer layer) disposed between the magnetization fixed layer 2 and the magnetization free layer 4.

The first port 9a, the third magnetoresistive effect element 1c, and the second port 9b are connected in series to each other in this order via the signal line 7. The fourth magnetoresistive effect element 1d is connected to the signal line 7 between the first magnetoresistive effect element 1a and the second port 9b (one of the signal line 7 between the first magnetoresistive effect element 1a and the first port 9a and the signal line 7 between the first magnetoresistive effect element 1a and the second port 9b) in parallel with the second port 9b. In the magnetoresistive effect device 107 illustrated in FIG. 15, the first magnetoresistive effect element 1a is connected in series to the third magnetoresistive effect element 1c and the second magnetoresistive effect element 1b is connected in series to the fourth magnetoresistive effect element 1d. More specifically, one end (at the magnetization fixed layer 2 side) of the third magnetoresistive effect element 1c is connected to the magnetization fixed layer 2 side of the first magnetoresistive effect element 1a and the other end (at the magnetization free layer 4 side) of the third magnetoresistive effect element 1c is connected to the second port 9b side. One end (at the magnetization free layer 4 side) of the fourth magnetoresistive effect element 1d is connected to the signal line 7 between the first magnetoresistive effect element 1a and the second port 9b (at the magnetization free layer 4 side of the second magnetoresistive effect element 1b) and the other end (at the magnetization fixed layer 2 side) of the fourth magnetoresistive effect element 1d may be connected to the ground 8 via the reference voltage terminal 20. When the magnetoresistive effect device 107 is connected to the ground 8, a closed circuit including the first magnetoresistive effect element 1a, the third magnetoresistive effect element 1c, the signal line 7, the second magnetoresistive effect element 1b, the fourth magnetoresistive effect element 1d, the ground 8, and the direct-current input terminal 11 is capable of being formed.

The third magnetoresistive effect element 1c is connected to the direct-current input terminal 11 and the reference voltage terminal 20 so that one end side (at the magnetization fixed layer 2 side in this example) is at the direct-current input terminal 11 side and the other end side (at the magnetization free layer 4 side in this example) is at the reference voltage terminal 20 side. In other words, in the magnetoresistive effect device 107, the first magnetoresistive effect element 1a and the third magnetoresistive effect element 1c are formed (arranged) so that the relationship between the direction from one end side to the other end side and the direction from the magnetization free layer 4 to the magnetization fixed layer 2 in the first magnetoresistive effect element 1a is opposite to that in the third magnetoresistive effect element 1c. In the example in FIG. 15, the direction from one end side to the other end side is the same as the direction from the magnetization free layer 4 to the magnetization fixed layer 2 in the first magnetoresistive effect element 1a while the direction from one end side to the other end side is opposite to the direction from the magnetization free layer 4 to the magnetization fixed layer 2 in the third magnetoresistive effect element 1c.

The fourth magnetoresistive effect element 1d is connected to the direct-current input terminal 11 and the reference voltage terminal 20 so that one end side (at the magnetization free layer 4 side in this example) is at the direct-current input terminal 11 side and the other end side (at the magnetization fixed layer 2 side in this example) is at the reference voltage terminal 20 side. In other words, in the magnetoresistive effect device 107, the second magnetoresistive effect element 1b and the fourth magnetoresistive effect element 1d are formed (arranged) so that the relationship between the direction from one end side to the other end side and the direction from the magnetization free layer 4 to the magnetization fixed layer 2 in the second magnetoresistive effect element 1b is opposite to that in the fourth magnetoresistive effect element 1d. In the example in FIG. 15, the direction from one end side to the other end side is opposite to the direction from the magnetization free layer 4 to the magnetization fixed layer 2 in the second magnetoresistive effect element 1b while the direction from one end side to the other end side is the same as the direction from the magnetization free layer 4 to the magnetization fixed layer 2 in the fourth magnetoresistive effect element 1d.

The third magnetoresistive effect element 1c is formed (arranged) so that the direct current input from the direct-current input terminal 11 flows through the third magnetoresistive effect element 1c in the direction from the magnetization free layer 4 to the magnetization fixed layer 2. In other words, in the magnetoresistive effect device 107, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the third magnetoresistive effect element 1c and the order of arrangement of the magnetization fixed layer 2, the spacer layer 3, and the magnetization free layer 4 in the third magnetoresistive effect element 1c. The fourth magnetoresistive effect element 1d is formed (arranged) so that the direct current input from the direct-current input terminal 11 flows through the fourth magnetoresistive effect element 1d in the direction from the magnetization fixed layer 2 to the magnetization free layer 4. In other words, in the magnetoresistive effect device 107, the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b is opposite to the relationship between the direction of the direct current flowing through the fourth magnetoresistive effect element 1d and the order of arrangement of the magnetization fixed layer 2, the spacer layer 3, and the magnetization free layer 4 in the fourth magnetoresistive effect element 1d.

In addition, the spin torque resonance frequency of the third magnetoresistive effect element 1c is higher than the spin torque resonance frequency of the first magnetoresistive effect element 1a and the spin torque resonance frequency of the second magnetoresistive effect element 1b. The spin torque resonance frequency of the fourth magnetoresistive effect element 1d is lower than the spin torque resonance frequency of the first magnetoresistive effect element 1a and the spin torque resonance frequency of the second magnetoresistive effect element 1b.

The magnetic-field applying mechanism 12 is disposed near the first magnetoresistive effect element 1a, the second magnetoresistive effect element 1b, the third magnetoresistive effect element 1c, and the fourth magnetoresistive effect element 1d. The magnetic-field applying mechanism 12 applies the magnetic field to the first magnetoresistive effect element 1a, the second magnetoresistive effect element 1b, the third magnetoresistive effect element 1c, and the fourth magnetoresistive effect element 1d to enable setting of the spin torque resonance frequencies of the first magnetoresistive effect element 1a, the second magnetoresistive effect element 1b, the third magnetoresistive effect element 1c, and the fourth magnetoresistive effect element 1d. The magnetic-field applying mechanism 12 is the effective magnetic field setting mechanism capable of setting the effective magnetic field $H_{eff}$ in the magnetization free layer 4 in each of the first magnetoresistive effect element 1a, the second magnetoresistive effect element 1b, the third magnetoresistive effect element 1c, and the fourth magnetoresistive effect element 1d. The remaining configuration of the magnetoresistive effect device 107 is the same as that of the magnetoresistive effect device 105 of the fifth embodiment.

Since the third magnetoresistive effect element 1c is formed (arranged) so that the direct current input from the direct-current input terminal 11 flows through the third magnetoresistive effect element 1c in the direction from the magnetization free layer 4 to the magnetization fixed layer 2, the third magnetoresistive effect element 1c is capable of being considered as a resistance element in which the impedance of the high-frequency signal is decreased at the spin torque resonance frequency due to the spin torque resonance phenomenon, like the second magnetoresistive effect element 1b.

Since the fourth magnetoresistive effect element 1d is formed (arranged) so that the direct current input from the direct-current input terminal 11 flows through the fourth magnetoresistive effect element 1d in the direction from the magnetization fixed layer 2 to the magnetization free layer 4, the fourth magnetoresistive effect element 1d is capable of being considered as a resistance element in which the impedance of the high-frequency signal is increased at the spin torque resonance frequency due to the spin torque resonance phenomenon, like the first magnetoresistive effect element 1a.

Due to the spin torque resonance phenomenon, the frequency components that coincide with the spin torque resonance frequency of the third magnetoresistive effect element 1c or that are near the spin torque resonance frequency of the third magnetoresistive effect element 1c, among the high-frequency components of the high-frequency signal input through the first port 9a, pass through the third magnetoresistive effect element 1c in the low impedance state and it is easy to supply the frequency components to the second port 9b.

In addition, due to the spin torque resonance phenomenon, the frequency components that coincide with the spin torque resonance frequency of the fourth magnetoresistive effect element 1d or that are near the spin torque resonance frequency of the fourth magnetoresistive effect element 1d, among the high-frequency components of the high-frequency signal input through the first port 9a, are cut off from the ground 8 by the fourth magnetoresistive effect element 1d, which is connected in parallel to the second port 9b and which is in the high impedance state, and it is easy to supply the frequency components to the second port 9b.

Figure 16:
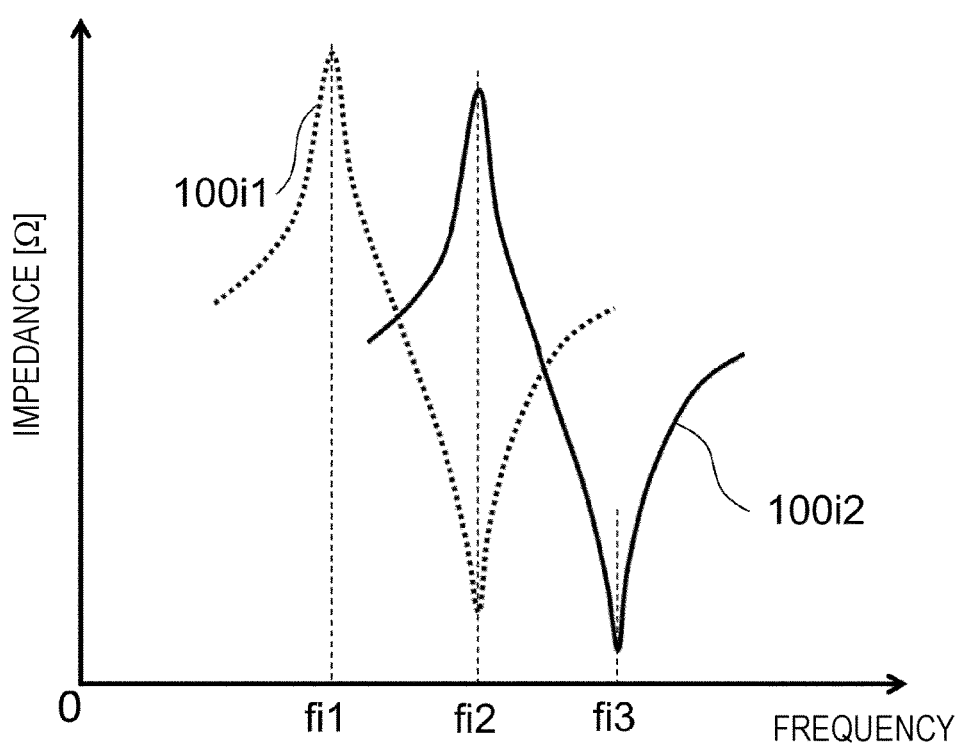
FIG. 16 is a graph illustrating the relationship between the combined impedance of magnetoresistive effect elements and frequency in the magnetoresistive effect device according to the seventh embodiment.

FIG. 16 is a graph illustrating the relationship between the frequency of the high-frequency signal input into the magnetoresistive effect device 107 and the combined impedance of the magnetoresistive effect elements in the magnetoresistive effect device 107. Referring to FIG. 16, the vertical axis represents impedance and the horizontal axis represents frequency. A plot line 100i1 represents combined impedance characteristics of the second magnetoresistive effect element 1b and the fourth magnetoresistive effect element 1d, which are connected in parallel to the second port 9b. The low frequency side (near a frequency fi1) mainly represents the impedance characteristics of the fourth magnetoresistive effect element 1d in the spin torque resonance and the high frequency side (near a frequency fi2) mainly represents the impedance characteristics of the second magnetoresistive effect element 1b in the spin torque resonance. A plot line 100i2 represents combined impedance characteristics of the first magnetoresistive effect element 1a and the third magnetoresistive effect element 1c, which are connected in series to the first port 9a and the second port 9b. The low frequency side (near the frequency fi2) mainly represents the impedance characteristics of the first magnetoresistive effect element 1a in the spin torque resonance and the high frequency side (near a frequency fi3) mainly represents the impedance characteristics of the third magnetoresistive effect element 1c in the spin torque resonance. The frequency fi1 is the spin torque resonance frequency of the fourth magnetoresistive effect element 1d, the frequency fi3 is the spin torque resonance frequency of the third magnetoresistive effect element 1c, and the frequency fi2 is the spin torque resonance frequency of the first magnetoresistive effect element 1a and the second magnetoresistive effect element 1b. The example is illustrated in FIG. 16 in which the spin torque resonance frequency of the first magnetoresistive effect element 1a is equal to the spin torque resonance frequency of the second magnetoresistive effect element 1b.

Figure 17:
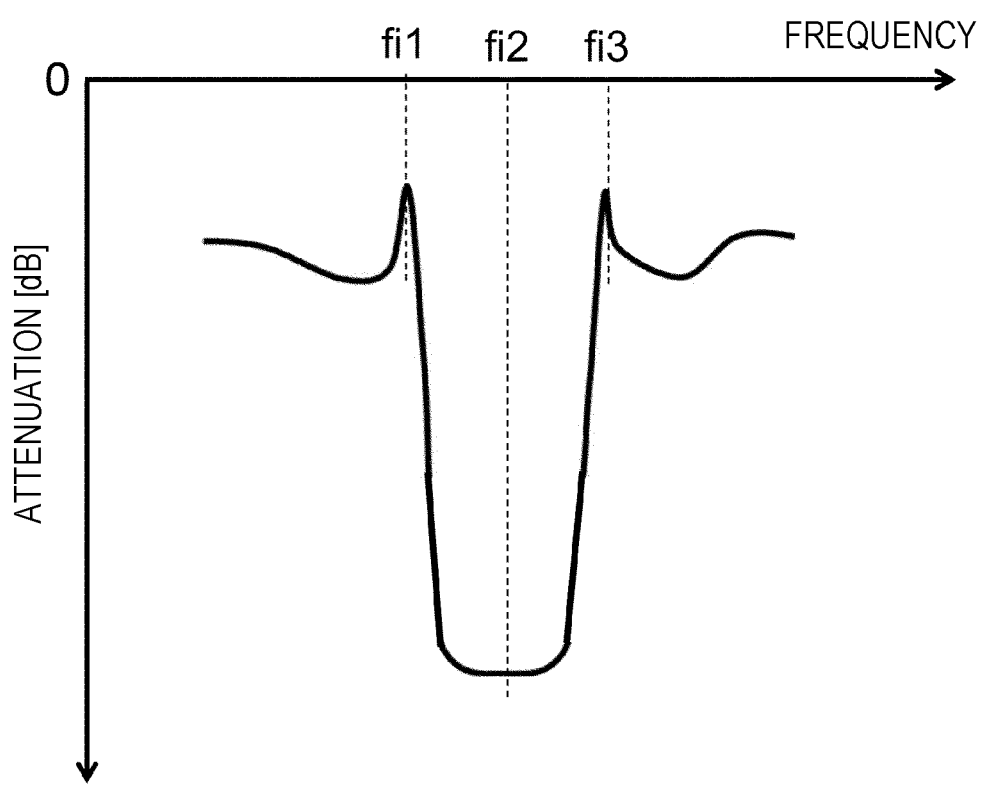
FIG. 17 is a graph illustrating the relationship between frequency and attenuation in the magnetoresistive effect device according to the seventh embodiment.

FIG. 17 is a graph illustrating the relationship between the frequency of the high-frequency signal input into the magnetoresistive effect device 107 and the attenuation. Referring to FIG. 17, the vertical axis represents attenuation and the horizontal axis represents frequency.

As illustrated in FIG. 17, in the magnetoresistive effect device 107, the high-frequency signal output from the second port 9b is decreased in strength at frequencies near the spin torque resonance frequency of the first magnetoresistive effect element 1a and frequencies near the spin torque resonance frequency of the second magnetoresistive effect element 1b to increase the passband loss, as in the magnetoresistive effect device 105 of the fifth embodiment. Accordingly, the magnetoresistive effect device 107 functions as a band elimination filter having the cutoff frequency band of the frequencies near the spin torque resonance frequency of the first magnetoresistive effect element 1a and the frequencies near the spin torque resonance frequency of the second magnetoresistive effect element 1b. The magnetoresistive effect device 107 is capable of transmitting the high-frequency signal to the second port 9b at the high frequency side and the low frequency side of the spin torque resonance frequency of the first magnetoresistive effect element 1a and the spin torque resonance frequency of the second magnetoresistive effect element 1b (at the high frequency side and the low frequency side of the above cutoff frequency band) because the magnetoresistive effect device 107 includes the third magnetoresistive effect element 1c and the fourth magnetoresistive effect element 1d. As illustrated in FIG. 16, the impedance of the third magnetoresistive effect element 1c or the fourth magnetoresistive effect element 1d is sharply changed with respect to the frequency of the high-frequency signal near the spin torque resonance frequency of the third magnetoresistive effect element 1c or near the spin torque resonance frequency of the fourth magnetoresistive effect element 1d and the attenuation of the high-frequency signal is sharply changed with respect to the frequency. Accordingly, the shoulder characteristics of the cutoff frequency band is made sharp. In particular, the spin torque resonance frequency (fi3) of the third magnetoresistive effect element 1c is preferably equal to the upper limit frequency of the cutoff frequency band that is used and the spin torque resonance frequency (fi1) of the fourth magnetoresistive effect element 1d is preferably equal to the lower limit frequency of the cutoff frequency band that is used.

As described above, the magnetoresistive effect device 107 further includes the third magnetoresistive effect element 1c including the magnetization fixed layer 2, the magnetization free layer 4, and the spacer layer 3 disposed between the magnetization fixed layer 2 and the magnetization free layer 4, in addition to the components in the magnetoresistive effect device 105. The first port 9a, the third magnetoresistive effect element 1c, and the second port 9b are connected in series to each other in this order via the signal line 7. The third magnetoresistive effect element 1c is connected to the direct-current input terminal 11 and the reference voltage terminal 20 so that one end side is at the direct-current input terminal 11 side and the other end side is at the reference voltage terminal 20 side. The first magnetoresistive effect element 1a and the third magnetoresistive effect element 1c are formed so that the relationship between the direction from one end side to the other end side and the direction from the magnetization free layer 4 to the magnetization fixed layer 2 in the first magnetoresistive effect element 1a is opposite to that in the third magnetoresistive effect element 1c. The spin torque resonance frequency of the third magnetoresistive effect element 1c is higher than the spin torque resonance frequency of the first magnetoresistive effect element 1a and the spin torque resonance frequency of the second magnetoresistive effect element 1b. The third magnetoresistive effect element 1c is formed so that the direct current input from the direct-current input terminal 11 flows through the third magnetoresistive effect element 1c in the direction from the magnetization free layer 4 to the magnetization fixed layer 2. In addition, the magnetoresistive effect device 107 further includes the fourth magnetoresistive effect element 1d including the magnetization fixed layer 2, the magnetization free layer 4, and the spacer layer 3 disposed between the magnetization fixed layer 2 and the magnetization free layer 4, in addition to the components in the magnetoresistive effect device 105. The fourth magnetoresistive effect element 1d is connected to the signal line 7 in parallel with the second port 9b. The fourth magnetoresistive effect element 1d is connected to the direct-current input terminal 11 and the reference voltage terminal 20 so that one end side is at the direct-current input terminal 11 side and the other end side is at the reference voltage terminal 20 side. The second magnetoresistive effect element 1b and the fourth magnetoresistive effect element 1d are formed so that the relationship between the direction from one end side to the other end side and the direction from the magnetization free layer 4 to the magnetization fixed layer 2 in the second magnetoresistive effect element 1b is opposite to that in the fourth magnetoresistive effect element 1d. The spin torque resonance frequency of the fourth magnetoresistive effect element 1d is lower than the spin torque resonance frequency of the first magnetoresistive effect element 1a and the spin torque resonance frequency of the second magnetoresistive effect element 1b. The fourth magnetoresistive effect element 1d is formed so that the direct current input from the direct-current input terminal 11 flows through the fourth magnetoresistive effect element 1d in the direction from the magnetization fixed layer 2 to the magnetization free layer 4.

The input of the high-frequency signal from the first port 9a into the third magnetoresistive effect element 1c and the fourth magnetoresistive effect element 1d via the signal line 7 enables the spin torque resonance to be induced in the third magnetoresistive effect element 1c and the fourth magnetoresistive effect element 1d. Due to the direct current flowing through the third magnetoresistive effect element 1c in the direction from the magnetization free layer 4 to the magnetization fixed layer 2 simultaneously with the spin torque resonance, the element impedance of the third magnetoresistive effect element 1c at a frequency that is equal to the spin torque resonance frequency of the third magnetoresistive effect element 1c or at frequencies near the spin torque resonance frequency of the third magnetoresistive effect element 1c is decreased. Due to the direct current flowing through the fourth magnetoresistive effect element 1d in the direction from the magnetization fixed layer 2 to the magnetization free layer 4 simultaneously with the spin torque resonance, the element impedance of the fourth magnetoresistive effect element 1d at a frequency that is equal to the spin torque resonance frequency of the fourth magnetoresistive effect element 1d or at frequencies near the spin torque resonance frequency of the fourth magnetoresistive effect element 1d is increased.

The series connection of the first port 9a, the third magnetoresistive effect element 1c, and the second port 9b in this order in the third magnetoresistive effect element 1c enables the high-frequency signal to be cut off from the second port 9b at the non-resonant frequency at which the third magnetoresistive effect element 1c is in the high impedance state and to be transmitted to the second port 9b side at the resonant frequency at which the third magnetoresistive effect element 1c is in the low impedance state.

The connection of the fourth magnetoresistive effect element 1d to the signal line 7 between the first magnetoresistive effect element 1a and the second port 9b in parallel with the second port 9b enables the high-frequency signal to be cut off from the second port 9b at the non-resonant frequency at which the fourth magnetoresistive effect element 1d is in the low impedance state and to be transmitted the second port 9b side at the resonant frequency at which the fourth magnetoresistive effect element 1d is in the high impedance state.

Since the spin torque resonance frequency of the third magnetoresistive effect element 1c is higher than the spin torque resonance frequency of the first magnetoresistive effect element 1a and the spin torque resonance frequency of the second magnetoresistive effect element 1b, the high-frequency signal is transmitted to the second port 9b side at the high frequency side of the spin torque resonance frequency of the first magnetoresistive effect element 1a and the spin torque resonance frequency of the second magnetoresistive effect element 1b, at which the high-frequency signal is cut off from the second port 9b side. Since the attenuation of the high-frequency signal is sharply changed with respect to the frequency near the spin torque resonance frequency of the third magnetoresistive effect element 1c at which the high-frequency signal is transmitted, the shoulder characteristics are made sharp at the high frequency side of the cutoff frequency band formed near the spin torque resonance frequency of the first magnetoresistive effect element 1a and near the spin torque resonance frequency of the second magnetoresistive effect element 1b. In addition, since the spin torque resonance frequency of the fourth magnetoresistive effect element 1d is lower than the spin torque resonance frequency of the first magnetoresistive effect element 1a and the spin torque resonance frequency of the second magnetoresistive effect element 1b, the high-frequency signal is transmitted to the second port 9b side at the low frequency side of the spin torque resonance frequency of the first magnetoresistive effect element 1a and the spin torque resonance frequency of the second magnetoresistive effect element 1b, at which the high-frequency signal is cut off from the second port 9b side. Since the attenuation of the high-frequency signal is sharply changed with respect to the frequency near the spin torque resonance frequency of the fourth magnetoresistive effect element 1d at which the high-frequency signal is transmitted, the shoulder characteristics are made sharp at the low frequency side of the cutoff frequency band formed near the spin torque resonance frequency of the first magnetoresistive effect element 1a and near the spin torque resonance frequency of the second magnetoresistive effect element 1b. In other words, the magnetoresistive effect device 107 may function as a filter having sharp shoulder characteristics of the cutoff frequency band.

Although the example is described above in which the second magnetoresistive effect element 1b and the fourth magnetoresistive effect element 1d are connected to the signal line 7 between the first magnetoresistive effect element 1a and the second port 9b in parallel with the second port 9b, one of the second magnetoresistive effect element 1b and the fourth magnetoresistive effect element 1d may be connected to the signal line 7 between the first magnetoresistive effect element 1a and the first port 9a in parallel with the second port 9b. Alternatively, both the second magnetoresistive effect element 1b and the fourth magnetoresistive effect element 1d may be connected to the signal line 7 between the first magnetoresistive effect element 1a and the first port 9a in parallel with the second port 9b and the direct-current input terminal 11 may be connected to the signal line 7 between the first magnetoresistive effect element 1a and the second port 9b.

Although the example is described in the seventh embodiment in which the third magnetoresistive effect element 1c and the fourth magnetoresistive effect element 1d are added to the magnetoresistive effect device 105 of the fifth embodiment, a mode may be adopted in which the third magnetoresistive effect element 1c and the fourth magnetoresistive effect element 1d are added to the magnetoresistive effect device 106 of the sixth embodiment.

Eighth Embodiment

Figure 18:
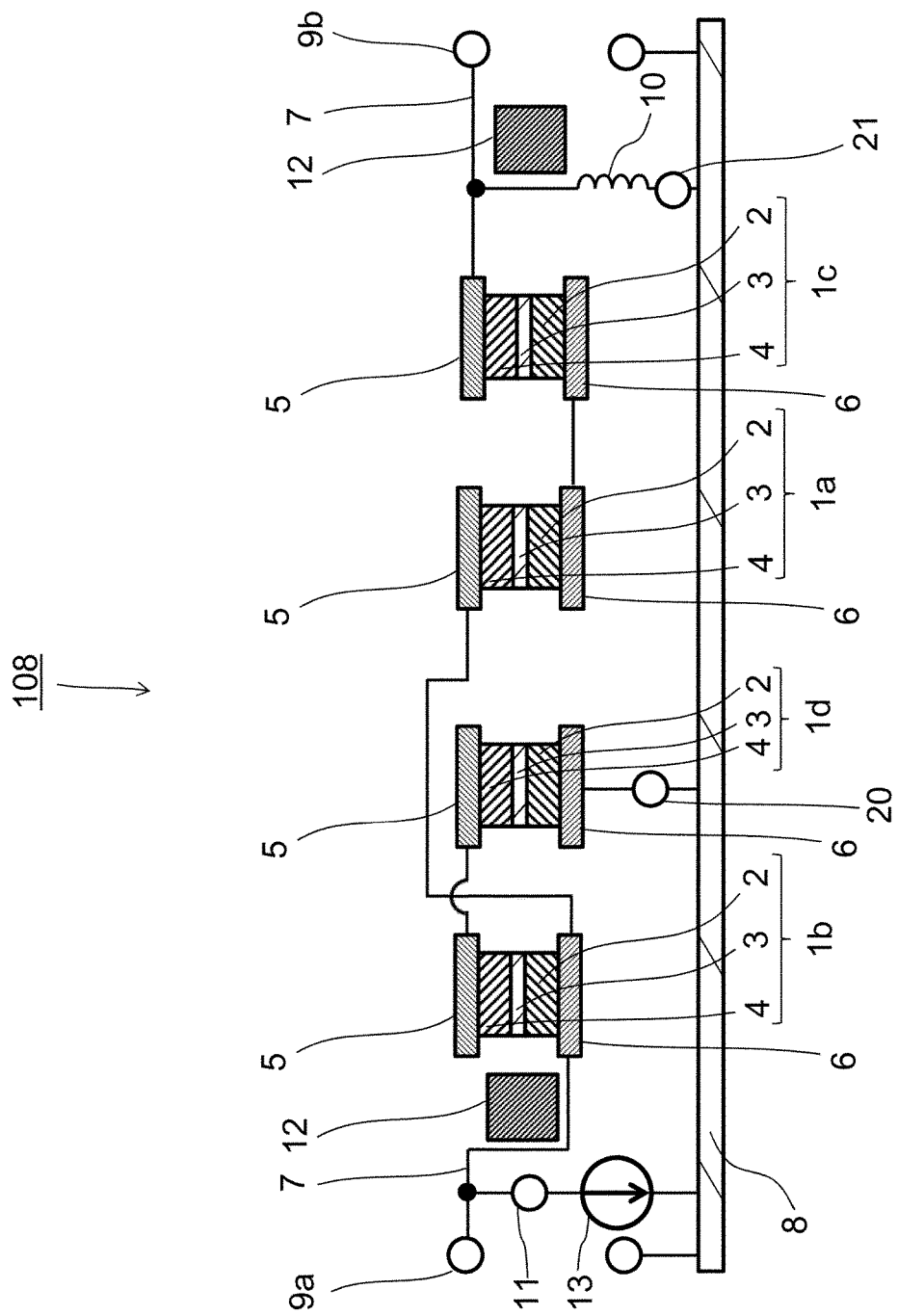
FIG. 18 is a schematic cross-sectional view of a magnetoresistive effect device according to an eighth embodiment.

FIG. 18 is a schematic cross-sectional view of a magnetoresistive effect device 108 according to an eighth embodiment of the present invention. Points different from the magnetoresistive effect device 107 of the seventh embodiment in the magnetoresistive effect device 108 will be mainly described and a description of common points will be appropriately omitted herein. The same reference numerals are used in the eighth embodiment to identify the same components in the magnetoresistive effect device 107 of the seventh embodiment and a description of the common components will be omitted herein. The magnetoresistive effect device 108 further includes the inductor 10 and the reference voltage terminal 21, in addition to the components in the magnetoresistive effect device 107 of the seventh embodiment. The inductor 10 is connected to the signal line 7 between the third magnetoresistive effect element 1c and the second port 9b (one of the signal line 7 between the first magnetoresistive effect element 1a and the third magnetoresistive effect element 1c and the first port 9a and the signal line 7 between the first magnetoresistive effect element 1a and the third magnetoresistive effect element 1c and the second port 9b). The second magnetoresistive effect element 1b and the fourth magnetoresistive effect element 1d are connected to the signal line 7 between the first magnetoresistive effect element 1a and the first port 9a (the other of the signal line 7 between the first magnetoresistive effect element 1a and the third magnetoresistive effect element 1c and the first port 9a and the signal line 7 between the first magnetoresistive effect element 1a and the third magnetoresistive effect element 1c and the second port 9b) in parallel with the second port 9b (the first port 9a). In other words, the second magnetoresistive effect element 1b and the fourth magnetoresistive effect element 1d are connected to the signal line 7 at the opposite side to the inductor 10 with the first magnetoresistive effect element 1a and the third magnetoresistive effect element 1c in between the second magnetoresistive effect element 1b and the fourth magnetoresistive effect element 1d and the inductor 10. The direct-current input terminal 11 is connected to the signal line 7 between the first magnetoresistive effect element 1a and the first port 9a (the other of the signal line 7 between the first magnetoresistive effect element 1a and the third magnetoresistive effect element 1c and the first port 9a and the signal line 7 between the first magnetoresistive effect element 1a and the third magnetoresistive effect element 1c and the second port 9b). In other words, the direct-current input terminal 11 is connected to the signal line 7 at the opposite side to the inductor 10 with the first magnetoresistive effect element 1a and the third magnetoresistive effect element 1c in between the direct-current input terminal 11 and the inductor 10. More specifically, the inductor 10 is connected to the signal line 7 between the third magnetoresistive effect element 1c and the second port 9b and may be connected to the ground 8 via the reference voltage terminal 21. One end (at the magnetization fixed layer 2 side) of the second magnetoresistive effect element 1b is connected to the signal line 7 between the first magnetoresistive effect element 1a and the first port 9a. The remaining configuration of the magnetoresistive effect device 108 is the same as that of the magnetoresistive effect device 107 of the seventh embodiment.

The first magnetoresistive effect element 1a is connected to the direct-current input terminal 11 and the reference voltage terminal 21 so that one end side (at the magnetization free layer 4 side in this example) is at the direct-current input terminal 11 side and the other end side (at the magnetization fixed layer 2 side in this example) is at the reference voltage terminal 21 side. The second magnetoresistive effect element 1b is connected to the direct-current input terminal 11 and the reference voltage terminal 20 so that one end side (at the magnetization fixed layer 2 side in this example) is at the direct-current input terminal 11 side and the other end side (at the magnetization free layer 4 side in this example) is at the reference voltage terminal 20 side. In other words, in the magnetoresistive effect device 108, the first magnetoresistive effect element 1a and the second magnetoresistive effect element 1b are formed (arranged) so that the relationship between the direction from one end side to the other end side and the direction from the magnetization free layer 4 to the magnetization fixed layer 2 in the first magnetoresistive effect element 1a is opposite to that in the second magnetoresistive effect element 1b, as in the magnetoresistive effect device 107. The third magnetoresistive effect element 1c is connected to the direct-current input terminal 11 and the reference voltage terminal 21 so that one end side (at the magnetization fixed layer 2 side in this example) is at the direct-current input terminal 11 side and the other end side (at the magnetization free layer 4 side in this example) is at the reference voltage terminal 21 side. The fourth magnetoresistive effect element 1d is connected to the direct-current input terminal 11 and the reference voltage terminal 20 so that one end side (at the magnetization free layer 4 side in this example) is at the direct-current input terminal 11 side and the other end side (at the magnetization fixed layer 2 side in this example) is at the reference voltage terminal 20 side. In other words, in the magnetoresistive effect device 108, the first magnetoresistive effect element 1a and the third magnetoresistive effect element 1c are formed (arranged) so that the relationship between the direction from one end side to the other end side and the direction from the magnetization free layer 4 to the magnetization fixed layer 2 in the first magnetoresistive effect element 1a is opposite to that in the third magnetoresistive effect element 1c, and the second magnetoresistive effect element 1b and the fourth magnetoresistive effect element 1d are formed (arranged) so that the relationship between the direction from one end side to the other end side and the direction from the magnetization free layer 4 to the magnetization fixed layer 2 in the second magnetoresistive effect element 1b is opposite to that in the fourth magnetoresistive effect element 1d, as in the magnetoresistive effect device 107.

The first magnetoresistive effect element 1a is formed (arranged) so that direct current input from the direct-current input terminal 11 flows through the first magnetoresistive effect element 1a in the direction from the magnetization fixed layer 2 to the magnetization free layer 4. The second magnetoresistive effect element 1b is formed (arranged) so that the direct current input from the direct-current input terminal 11 flows through the second magnetoresistive effect element 1b in the direction from the magnetization free layer 4 to the magnetization fixed layer 2. In other words, in the magnetoresistive effect device 108, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b, as in the magnetoresistive effect device 107. The third magnetoresistive effect element 1c is formed (arranged) so that direct current input from the direct-current input terminal 11 flows through the third magnetoresistive effect element 1c in the direction from the magnetization free layer 4 to the magnetization fixed layer 2. The fourth magnetoresistive effect element 1d is formed (arranged) so that the direct current input from the direct-current input terminal 11 flows through the fourth magnetoresistive effect element 1d in the direction from the magnetization fixed layer 2 to the magnetization free layer 4. In other words, in the magnetoresistive effect device 108, the relationship between the direction of the direct current flowing through the first magnetoresistive effect element 1a and the order of arrangement of the magnetization fixed layer 2, the spacer layer 3, and the magnetization free layer 4 in the first magnetoresistive effect element 1a is opposite to the relationship between the direction of the direct current flowing through the third magnetoresistive effect element 1c and the order of arrangement of the magnetization fixed layer 2, the spacer layer 3, and the magnetization free layer 4 in the third magnetoresistive effect element 1c, and the relationship between the direction of the direct current flowing through the second magnetoresistive effect element 1b and the order of arrangement of the magnetization fixed layer 2, the spacer layer 3, and the magnetization free layer 4 in the second magnetoresistive effect element 1b is opposite to the relationship between the direction of the direct current flowing through the fourth magnetoresistive effect element 1d and the order of arrangement of the magnetization fixed layer 2, the spacer layer 3, and the magnetization free layer 4 in the fourth magnetoresistive effect element 1d, as in the magnetoresistive effect device 107.

The direct-current source 13 is connected to the ground 8 and the direct-current input terminal 11. When the magnetoresistive effect device 108 is connected to the ground 8, a closed circuit including the first magnetoresistive effect element 1a, the third magnetoresistive effect element 1c, the signal line 7, the inductor 10, the ground 8, and the direct-current input terminal 11 is capable of being formed. In addition, when the magnetoresistive effect device 108 is connected to the ground 8, a closed circuit including the second magnetoresistive effect element 1b, the fourth magnetoresistive effect element 1d, the signal line 7, the ground 8, and the direct-current input terminal 11 is capable of being formed.

The inductor 10 is connected between the signal line 7 and the ground 8 and has a function to cut off high-frequency components of the current and pass direct-current components of the current with its inductance component, as described above in the sixth embodiment. The use of the inductor 10 enables the direct current applied from the direct-current input terminal 11 to flow through the closed circuit including the first magnetoresistive effect element 1a, the third magnetoresistive effect element 1c, the signal line 7, the inductor 10, the ground 8, and the direct-current input terminal 11 without degrading the characteristics of the high-frequency signal passing through the first magnetoresistive effect element 1a and the third magnetoresistive effect element 1c.

The magnetoresistive effect device 108 is capable of having the frequency characteristics as a high-frequency filter, like the magnetoresistive effect device 107 of the seventh embodiment.

The example is described in the seventh embodiment and the eighth embodiment in which the spin torque resonance frequency of the third magnetoresistive effect element 1c is higher than the spin torque resonance frequency of the first magnetoresistive effect element 1a and the spin torque resonance frequency of the second magnetoresistive effect element 1b and the spin torque resonance frequency of the fourth magnetoresistive effect element 1d is lower than the spin torque resonance frequency of the first magnetoresistive effect element 1a and the spin torque resonance frequency of the second magnetoresistive effect element 1b. However, the spin torque resonance frequency of the third magnetoresistive effect element 1c may be lower than the spin torque resonance frequency of the first magnetoresistive effect element 1a and the spin torque resonance frequency of the second magnetoresistive effect element 1b and the spin torque resonance frequency of the fourth magnetoresistive effect element 1d may be higher than the spin torque resonance frequency of the first magnetoresistive effect element 1a and the spin torque resonance frequency of the second magnetoresistive effect element 1b. In this case, since the attenuation of the high-frequency signal is sharply changed with respect to the frequency near the spin torque resonance frequency of the third magnetoresistive effect element 1c at which the high-frequency signal is transmitted, the shoulder characteristics are made sharp at the low frequency side of the cutoff frequency band formed near the spin torque resonance frequency of the first magnetoresistive effect element 1a and near the spin torque resonance frequency of the second magnetoresistive effect element 1b. In addition, since the attenuation of the high-frequency signal is sharply changed with respect to the frequency near the spin torque resonance frequency of the fourth magnetoresistive effect element 1d at which the high-frequency signal is transmitted, the shoulder characteristics are made sharp at the high frequency side of the cutoff frequency band formed near the spin torque resonance frequency of the first magnetoresistive effect element 1a and near the spin torque resonance frequency of the second magnetoresistive effect element 1b. In this case, the spin torque resonance frequency (fi3) of the third magnetoresistive effect element 1c is preferably equal to the lower limit frequency of the cutoff frequency band that is used and the spin torque resonance frequency (fi1) of the fourth magnetoresistive effect element 1d is preferably equal to the upper limit frequency of the cutoff frequency band that is used.

Although the example is described in the seventh embodiment and the eighth embodiment in which the first magnetoresistive effect element 1a is connected in series to the third magnetoresistive effect element 1c, the first magnetoresistive effect element 1a may be connected in parallel to the third magnetoresistive effect element 1c. The magnetoresistive effect device in this case is also capable of having the frequency characteristics as a high-frequency filter, like the magnetoresistive effect device 107 of the seventh embodiment, because of the series connection of the first port 9a, the first magnetoresistive effect element 1a, and the second port 9b in this order and the series connection of the first port 9a, the third magnetoresistive effect element 1c, and the second port 9b in this order.

Similarly, although the example is described in the seventh embodiment and the eighth embodiment in which the second magnetoresistive effect element 1b is connected in series to the fourth magnetoresistive effect element 1d, the second magnetoresistive effect element 1b may be connected in parallel to the fourth magnetoresistive effect element 1d. The magnetoresistive effect device in this case is also capable of having the frequency characteristics as a high-frequency filter, like the magnetoresistive effect device 107 of the seventh embodiment, because of the connection of the second magnetoresistive effect element 1b to the signal line 7 in parallel with the second port 9b and the connection of the fourth magnetoresistive effect element 1d to the signal line 7 in parallel with the second port 9b.

Although the embodiments of the present invention have been described above, the present invention is not limited to these specific examples and embodiments. Many changes and modified embodiments will be obvious to those skilled in the art and components may be added. For example, in order to prevent the direct current signal from flowing into a high-frequency circuit connected to the first port 9a, a capacitor for cutting off the direct current signal may be connected in series to the signal line 7 between a connection portion to the signal line 7 of the direct-current input terminal 11 and the first port 9a in the first, third, fourth, fifth, seventh, and eight embodiments. Similarly, a capacitor for cutting off the direct current signal may be connected in series to the signal line 7 between a connection portion to the signal line 7 of the inductor 10 and the first port 9a in the second and sixth embodiments. In order to prevent the direct current signal from flowing into a high-frequency circuit connected to the second port 9b, a capacitor for cutting off the direct current signal may be connected in series to the signal line 7 between a connection portion to the signal line 7 of the second magnetoresistive effect element 1b and the second port 9b in the first, third, fifth, and seventh embodiments. Similarly, a capacitor for cutting off the direct current signal may be connected in series to the signal line 7 between a connection portion to the signal line 7 of the direct-current input terminal 11 and the second port 9b in the second and sixth embodiments. Similarly, a capacitor for cutting off the direct current signal may be connected in series to the signal line 7 between a connection portion to the signal line 7 of the inductor 10 and the second port 9b in the fourth and eighth embodiments.

Although the examples are described in the second and sixth embodiments in which the inductor 10 is connected to the signal line 7 between the first magnetoresistive effect element 1a and the first port 9a, one end of the second magnetoresistive effect element 1b is connected to the signal line 7 between the first magnetoresistive effect element 1a and the second port 9b, and the direct-current input terminal 11 is connected to the signal line 7 between the first magnetoresistive effect element 1a and the second port 9b, the inductor 10 may be connected to the signal line 7 between the first magnetoresistive effect element 1a and the second port 9b, one end of the second magnetoresistive effect element 1b may be connected to the signal line 7 between the first magnetoresistive effect element 1a and the first port 9a, and the direct-current input terminal 11 may be connected to the signal line 7 between the first magnetoresistive effect element 1a and the first port 9a.

Although the examples are described in the second, fourth, sixth, and eighth embodiments in which the inductor 10 is used, a resistance element may be used, instead of the inductor 10. In this case, the resistance element is connected between the signal line 7 and the ground 8 and has a function to cut off the high-frequency components of the current with its resistance component. The resistance element may be a chip resistor or a resistor composed of a pattern line. The resistance value of the resistance element is preferably higher than or equal to the characteristic impedance of the signal line 7. For example, when the characteristic impedance of the signal line 7 is 50 SI, high-frequency power of 45% is capable of being cut with the resistance element if the resistance value of the resistance element is 50Ω and high-frequency power of 90% is capable of being cut with the resistance element if the resistance value of the resistance element is 500Ω. The use of the resistance element enables the direct current applied from the direct-current input terminal 11 to flow through a closed circuit including the first magnetoresistive effect element 1a, (the third magnetoresistive effect element 1c), the signal line 7, the resistance element, the ground 8, and the direct-current input terminal 11 without degrading the characteristics of the high-frequency signal passing through the first magnetoresistive effect element 1a.

When the resistance element is used, instead of the inductor 10, it is preferable to connect a capacitor for cutting off the direct current signal in series to the signal line 7 between a connection portion to the signal line 7 of the resistance element (or the direct-current input terminal 11) and the first port 9a and to connect a capacitor for cutting off the direct current signal in series to the signal line 7 between a connection portion to the signal line 7 of the direct-current input terminal 11 (or the resistance element) and the second port 9b in order to cause the direct current applied from the direct-current input terminal 11 to efficiently flow through the closed circuit including the first magnetoresistive effect element 1a, (the third magnetoresistive effect element 1c), the signal line 7, the resistance element, the ground 8, and the direct-current input terminal 11.

In the first to eighth embodiments, each magnetoresistive effect element may be formed (arranged) so that the direction of the high-frequency signal flowing through the magnetoresistive effect element with respect to the magnetoresistive effect element is opposite to the direction illustrated in the description of each of the first to eighth embodiments. For example, although the magnetization free layer 4 side of the first magnetoresistive effect element 1a is connected to the first port 9a side and the magnetization fixed layer 2 side of the second magnetoresistive effect element 1b is connected to the first port 9a side in the first and fifth embodiments, the magnetization fixed layer 2 side of the first magnetoresistive effect element 1a may be connected to the first port 9a side and the magnetization free layer 4 side of the second magnetoresistive effect element 1b may be connected to the first port 9a side. Although the magnetization free layer 4 side of the first magnetoresistive effect element 1a is connected to the first port 9a side, the magnetization fixed layer 2 side of the second magnetoresistive effect element 1b is connected to the first port 9a side, the magnetization fixed layer 2 side of the third magnetoresistive effect element 1c is connected to the first port 9a side, and the magnetization free layer 4 side of the fourth magnetoresistive effect element 1d is connected to the first port 9a side in the third, fourth, seventh, and eighth embodiments, the magnetization fixed layer 2 side of the first magnetoresistive effect element 1a may be connected to the first port 9a side, the magnetization free layer 4 side of the second magnetoresistive effect element 1b may be connected to the first port 9a side, the magnetization free layer 4 side of the third magnetoresistive effect element 1c may be connected to the first port 9a side, and the magnetization fixed layer 2 side of the fourth magnetoresistive effect element 1d may be connected to the first port 9a side. In these cases, the direction of the direct current supplied from the direct-current source 13 to the direct-current input terminal 11 is made opposite to the one illustrated in the description of each embodiment.

Although the examples are described in the first to eighth embodiments in which the magnetoresistive effect device 101 (102, 103, 104, 105, 106, 107, and 108) includes the magnetic-field applying mechanism 12 as the frequency setting mechanism (the effective magnetic field setting mechanism), the frequency setting mechanism (the effective magnetic field setting mechanism) may be realized in the following manner. For example, the anisotropy magnetic field $H_k$ in the magnetization free layer may be varied by applying an electric field to the magnetoresistive effect element and varying the electric field to vary the effective magnetic field in the magnetization free layer, thereby varying the spin torque resonance frequency of the magnetoresistive effect element. In this case, a mechanism to apply the electric field to the magnetoresistive effect element serves as the frequency setting mechanism (the effective magnetic field setting mechanism). Alternatively, the anisotropy magnetic field $H_k$ in the magnetization free layer may be varied by providing a piezoelectric body near the magnetization free layer, applying the electric field to the piezoelectric body to deform the piezoelectric body, and deforming the magnetization free layer to vary the effective magnetic field in the magnetization free layer, thereby varying the spin torque resonance frequency of the magnetoresistive effect element. In this case, a mechanism to apply the electric field to the piezoelectric body and the piezoelectric body serve as the frequency setting mechanism (the effective magnetic field setting mechanism). Alternatively, the exchange coupling magnetic field $H_{EX}$ in the magnetization free layer may be varied by providing a control film that has an electromagnetic effect and that is made of an antiferromagnetic material or a ferrimagnetic material so as to be magnetically coupled to the magnetization free layer, applying the magnetic field and the electric field to the control film, and varying at least one of the magnetic field and the electric field to be applied to the control film to vary the effective magnetic field in the magnetization free layer, thereby varying the spin torque resonance frequency of the magnetoresistive effect element. In this case, a mechanism to apply the magnetic field to the control film, a mechanism to apply the electric field to the control film, and the control film serve as the frequency setting mechanism (the effective magnetic field setting mechanism).

If the spin torque resonance frequency of each magnetoresistive effect element has a desired value even when the frequency setting mechanism is not provided (the magnetic field is not applied from the magnetic-field applying mechanism 12), the frequency setting mechanism (the magnetic-field applying mechanism 12) may not be provided.

What is claimed is:

1. A magnetoresistive effect device comprising:
   a first magnetoresistive effect element;
   a second magnetoresistive effect element;
   a first port through which a high-frequency signal is input;
   a second port through which a high-frequency signal is output;
   a signal line;
   a reference voltage terminal; and
   a direct-current input terminal,
   wherein the first port, the first magnetoresistive effect element, and the second port are connected in series to each other in this order via the signal line,
   wherein the second magnetoresistive effect element is connected on a first end side to the signal line and on a second end side to the reference voltage terminal,
   wherein the first magnetoresistive effect element and the second magnetoresistive effect element each include a magnetization fixed layer, a magnetization free layer, and a spacer layer disposed between the magnetization fixed layer and the magnetization free layer, and
   wherein the first magnetoresistive effect element and the second magnetoresistive effect element are formed so that a relationship between a direction of direct current that is input from the direct-current input terminal and that flows through the first magnetoresistive effect element and an order of arrangement of the magnetization fixed layer, the spacer layer, and the magnetization free layer in the first magnetoresistive effect element is opposite to a relationship between a direction of direct current that is input from the direct-current input terminal and that flows through the second magnetoresistive effect element and an order of arrangement of the magnetization fixed layer, the spacer layer, and the magnetization free layer in the second magnetoresistive effect element.

2. The magnetoresistive effect device according to claim 1,
   wherein a spin torque resonance frequency of the first magnetoresistive effect element is equal to a spin torque resonance frequency of the second magnetoresistive effect element.

3. The magnetoresistive effect device according to claim 1, wherein a spin torque resonance frequency of the first magnetoresistive effect element is different from a spin torque resonance frequency of the second magnetoresistive effect element.

4. The magnetoresistive effect device according to claim 1, further comprising:
a third magnetoresistive effect element,
wherein the first port, the third magnetoresistive effect element, and the second port are connected in series to each other in this order via the signal line,
wherein the first magnetoresistive effect element, the second magnetoresistive effect element, and the third magnetoresistive effect element each include a magnetization fixed layer, a magnetization free layer, and a spacer layer disposed between the magnetization fixed layer and the magnetization free layer,
wherein the first magnetoresistive effect element and the third magnetoresistive effect element are formed so that a relationship between a direction of direct current that is input from the direct-current input terminal and that flows through the first magnetoresistive effect element and an order of arrangement of the magnetization fixed layer, the spacer layer, and the magnetization free layer in the first magnetoresistive effect element is opposite to a relationship between a direction of direct current that is input from the direct-current input terminal and that flows through the third magnetoresistive effect element and an order of arrangement of the magnetization fixed layer, the spacer layer, and the magnetization free layer in the third magnetoresistive effect element, and
wherein a spin torque resonance frequency of the third magnetoresistive effect element is higher or lower than a spin torque resonance frequency of the first magnetoresistive effect element and a spin torque resonance frequency of the second magnetoresistive effect element.

5. The magnetoresistive effect device according to claim 1, further comprising:
a fourth magnetoresistive effect element,
wherein the fourth magnetoresistive effect element is connected on a first end side to the signal line and on a second end side to the reference voltage terminal,
wherein the first magnetoresistive effect element, the second magnetoresistive effect element, and the fourth magnetoresistive effect element each include a magnetization fixed layer, a magnetization free layer, and a spacer layer disposed between the magnetization fixed layer and the magnetization free layer,
wherein the second magnetoresistive effect element and the fourth magnetoresistive effect element are formed so that a relationship between a direction of direct current that is input from the direct-current input terminal and that flows through the second magnetoresistive effect element and an order of arrangement of the magnetization fixed layer, the spacer layer, and the magnetization free layer in the second magnetoresistive effect element is opposite to a relationship between a direction of direct current that is input from the direct-current input terminal and that flows through the fourth magnetoresistive effect element and an order of arrangement of the magnetization fixed layer, the spacer layer, and the magnetization free layer in the fourth magnetoresistive effect element, and
wherein a spin torque resonance frequency of the fourth magnetoresistive effect element is higher or lower than a spin torque resonance frequency of the first magnetoresistive effect element and a spin torque resonance frequency of the second magnetoresistive effect element.

6. The magnetoresistive effect device according to claim 1, further comprising:
a third magnetoresistive effect element; and
a fourth magnetoresistive effect element,
wherein the first port, the third magnetoresistive effect element, and the second port are connected in series to each other in this order via the signal line,
wherein the fourth magnetoresistive effect element is connected on a first end side to the signal line and on a second end side to the reference voltage terminal,
wherein the first magnetoresistive effect element, the second magnetoresistive effect element, the third magnetoresistive effect element, and the fourth magnetoresistive effect element each include a magnetization fixed layer, a magnetization free layer, and a spacer layer disposed between the magnetization fixed layer and the magnetization free layer,
wherein the first magnetoresistive effect element and the third magnetoresistive effect element are formed so that a relationship between a direction of direct current that is input from the direct-current input terminal and that flows through the first magnetoresistive effect element and an order of arrangement of the magnetization fixed layer, the spacer layer, and the magnetization free layer in the first magnetoresistive effect element is opposite to a relationship between a direction of direct current that is input from the direct-current input terminal and that flows through the third magnetoresistive effect element and an order of arrangement of the magnetization fixed layer, the spacer layer, and the magnetization free layer in the third magnetoresistive effect element,
wherein the second magnetoresistive effect element and the fourth magnetoresistive effect element are formed so that a relationship between a direction of direct current that is input from the direct-current input terminal and that flows through the second magnetoresistive effect element and an order of arrangement of the magnetization fixed layer, the spacer layer, and the magnetization free layer in the second magnetoresistive effect element is opposite to a relationship between a direction of direct current that is input from the direct-current input terminal and that flows through the fourth magnetoresistive effect element and an order of arrangement of the magnetization fixed layer, the spacer layer, and the magnetization free layer in the fourth magnetoresistive effect element, and
wherein a spin torque resonance frequency of the third magnetoresistive effect element is higher than a spin torque resonance frequency of the first magnetoresistive effect element and a spin torque resonance frequency of the second magnetoresistive effect element and a spin torque resonance frequency of the fourth magnetoresistive effect element is lower than the spin torque resonance frequency of the first magnetoresistive effect element and the spin torque resonance frequency of the second magnetoresistive effect element, or the spin torque resonance frequency of the third magnetoresistive effect element is lower than the spin torque resonance frequency of the first magnetoresistive effect element and the spin torque resonance frequency of the second magnetoresistive effect element and the spin torque resonance frequency of the fourth magnetoresistive effect element is higher than the spin torque resonance frequency of the first magnetoresistive effect element and the spin torque resonance frequency of the second magnetoresistive effect element.

7. A magnetoresistive effect device comprising:
a first magnetoresistive effect element;
a second magnetoresistive effect element;
a first port through which a high-frequency signal is input;
a second port through which a high-frequency signal is output;
a signal line;
a direct-current input terminal; and
a reference voltage terminal,
wherein the first port, the first magnetoresistive effect element, and the second port are connected in series to each other in this order via the signal line,
wherein the second magnetoresistive effect element is connected on a first end side to the signal line and on a second end side to the reference voltage terminal,
wherein the first magnetoresistive effect element and the second magnetoresistive effect element each include a magnetization fixed layer, a magnetization free layer, and a spacer layer disposed between the magnetization fixed layer and the magnetization free layer,
wherein the first magnetoresistive effect element and the second magnetoresistive effect element are connected to the direct-current input terminal and the reference voltage terminal so that a first end side of the first magnetoresistive effect element and the first end side of the second magnetoresistive effect element are at the direct-current input terminal side and a second end side of the first magnetoresistive effect element and the second end side of the second magnetoresistive effect element are at the reference voltage terminal side, and
wherein the first magnetoresistive effect element and the second magnetoresistive effect element are formed so that a relationship between a direction from the first end side to the second end side of the first magnetoresistive effect element and a direction from the magnetization free layer to the magnetization fixed layer in the first magnetoresistive effect element is opposite to a relationship between a direction from the first end side to the second end side of the second magnetoresistive effect element and a direction from the magnetization free layer to the magnetization fixed layer in the second magnetoresistive effect element.

8. The magnetoresistive effect device according to claim 7,
wherein a spin torque resonance frequency of the first magnetoresistive effect element is equal to a spin torque resonance frequency of the second magnetoresistive effect element.

9. The magnetoresistive effect device according to claim 7,
wherein a spin torque resonance frequency of the first magnetoresistive effect element is different from a spin torque resonance frequency of the second magnetoresistive effect element.

10. The magnetoresistive effect device according to claim 7, further comprising:
a third magnetoresistive effect element,
wherein the first port, the third magnetoresistive effect element, and the second port are connected in series to each other in this order via the signal line,
wherein the first magnetoresistive effect element, the second magnetoresistive effect element, and the third magnetoresistive effect element each include a magnetization fixed layer, a magnetization free layer, and a spacer layer disposed between the magnetization fixed layer and the magnetization free layer,
wherein the third magnetoresistive effect element is connected to the direct-current input terminal and the reference voltage terminal so that a first end side of the third magnetoresistive effect element is at the direct-current input terminal side and a second end side thereof is at the reference voltage terminal side,
wherein the first magnetoresistive effect element and the third magnetoresistive effect element are formed so that a relationship between a direction from the first end side to the second end side of the first magnetoresistive effect element and a direction from the magnetization free layer to the magnetization fixed layer in the first magnetoresistive effect element is opposite to a relationship between a direction from the first end side to the second end side of the third magnetoresistive effect element and a direction from the magnetization free layer to the magnetization fixed layer in the third magnetoresistive effect element, and
wherein a spin torque resonance frequency of the third magnetoresistive effect element is higher or lower than a spin torque resonance frequency of the first magnetoresistive effect element and a spin torque resonance frequency of the second magnetoresistive effect element.

11. The magnetoresistive effect device according to claim 7, further comprising:
a fourth magnetoresistive effect element,
wherein the fourth magnetoresistive effect element is connected on a first end side to the signal line and on a second end side to the reference voltage terminal,
wherein the first magnetoresistive effect element, the second magnetoresistive effect element, and the fourth magnetoresistive effect element each include a magnetization fixed layer, a magnetization free layer, and a spacer layer disposed between the magnetization fixed layer and the magnetization free layer,
wherein the fourth magnetoresistive effect element is connected to the direct-current input terminal and the reference voltage terminal so that the first end side of the fourth magnetoresistive effect element is at the direct-current input terminal side and the second end side thereof is at the reference voltage terminal side,
wherein the second magnetoresistive effect element and the fourth magnetoresistive effect element are formed so that a relationship between a direction from the first end side to the second end side of the second magnetoresistive effect element and a direction from the magnetization free layer to the magnetization fixed layer in the second magnetoresistive effect element is opposite to a relationship between a direction from the first end side to the second end side of the fourth magnetoresistive effect element and a direction from the magnetization free layer to the magnetization fixed layer in the fourth magnetoresistive effect element, and
wherein a spin torque resonance frequency of the fourth magnetoresistive effect element is higher or lower than a spin torque resonance frequency of the first magnetoresistive effect element and a spin torque resonance frequency of the second magnetoresistive effect element.

12. The magnetoresistive effect device according to claim 7, further comprising:
a third magnetoresistive effect element; and
a fourth magnetoresistive effect element, wherein the first port, the third magnetoresistive effect element, and the second port are connected in series to each other in this order via the signal line, wherein the fourth magnetoresistive effect element is connected on a first end side to the signal line and on a second end side to the reference voltage terminal, wherein the first magnetoresistive effect element, the second magnetoresistive effect element, the third magnetoresistive effect element, and the fourth magnetoresistive effect element each include a magnetization fixed layer, a magnetization free layer, and a spacer layer disposed between the magnetization fixed layer and the magnetization free layer, wherein the third magnetoresistive effect element and the fourth magnetoresistive effect element are connected to the direct-current input terminal and the reference voltage terminal so that a first end side of the third magnetoresistive effect element and the first end side of the fourth magnetoresistive effect element are at the direct-current input terminal side and a second end side of the third magnetoresistive effect element and the second end side of the fourth magnetoresistive effect element are at the reference voltage terminal side, wherein the first magnetoresistive effect element and the third magnetoresistive effect element are formed so that a relationship between a direction from the first end side to the second end side of the first magnetoresistive effect element and a direction from the magnetization free layer to the magnetization fixed layer in the first magnetoresistive effect element is opposite to a relationship between a direction from the first end side to the second end side of the third magnetoresistive effect element and a direction from the magnetization free layer to the magnetization fixed layer in the third magnetoresistive effect element, wherein the second magnetoresistive effect element and the fourth magnetoresistive effect element are formed so that a relationship between a direction from the first end side to the second end side of the second magnetoresistive effect element and a direction from the magnetization free layer to the magnetization fixed layer in the second magnetoresistive effect element is opposite to a relationship between a direction from the first end side to the second end side of the fourth magnetoresistive effect element and a direction from the magnetization free layer to the magnetization fixed layer in the fourth magnetoresistive effect element, and wherein a spin torque resonance frequency of the third magnetoresistive effect element is higher than a spin torque resonance frequency of the first magnetoresistive effect element and a spin torque resonance frequency of the second magnetoresistive effect element and a spin torque resonance frequency of the fourth magnetoresistive effect element is lower than the spin torque resonance frequency of the first magnetoresistive effect element and the spin torque resonance frequency of the second magnetoresistive effect element, or the spin torque resonance frequency of the third magnetoresistive effect element is lower than the spin torque resonance frequency of the first magnetoresistive effect element and the spin torque resonance frequency of the second magnetoresistive effect element and the spin torque resonance frequency of the fourth magnetoresistive effect element is higher than the spin torque resonance frequency of the first magnetoresistive effect element and the spin torque resonance frequency of the second magnetoresistive effect element.

* * * * *